(12) United States Patent
Fullerton et al.

(10) Patent No.: US 7,800,471 B2
(45) Date of Patent: Sep. 21, 2010

(54) FIELD EMISSION SYSTEM AND METHOD

(75) Inventors: Larry W. Fullerton, New Hope, AL (US); Mark D. Roberts, Huntsville, AL (US)

(73) Assignee: Cedar Ridge Research, LLC, New Hope, AL (US)

( * ) Notice: Subject to any disclaimer, the term of this patent is extended or adjusted under 35 U.S.C. 154(b) by 197 days.

(21) Appl. No.: 12/123,718

(22) Filed: May 20, 2008

(65) Prior Publication Data
US 2009/0251242 A1 Oct. 8, 2009

Related U.S. Application Data

(60) Provisional application No. 61/123,019, filed on Apr. 4, 2008.

(51) Int. Cl.
*H01F 7/20* (2006.01)
*H01F 7/02* (2006.01)
(52) U.S. Cl. ........................ 335/306; 335/285
(58) Field of Classification Search ............... 335/285, 335/302–306; 24/303; 310/90.5; 2/102–103, 2/312, 315, 319, 321, 322, 338, 422, 462, 2/913
See application file for complete search history.

(56) References Cited

U.S. PATENT DOCUMENTS

| | | | |
|---|---|---|---|
| 381,968 A | 5/1888 | Tesla | |
| 493,858 A | 3/1893 | Edison | |
| 996,933 A | 7/1911 | Lindquist | |
| 1,236,234 A | 8/1917 | Troje | |
| 2,389,298 A | 11/1945 | Ellis | |
| 2,570,625 A | 10/1951 | Zimmerman et al. | |
| 2,722,617 A | 11/1955 | Cluwen et al. | |
| 2,932,545 A | 4/1960 | Foley | |
| 3,102,314 A | 9/1963 | Alderfer | |
| 3,208,296 A | 9/1965 | Baermann | |
| 3,288,511 A | 11/1966 | Tavano | |
| 3,468,576 A | 9/1969 | Beyer et al. | |
| 3,474,366 A * | 10/1969 | Barney | .................. 335/206 |
| 3,696,258 A | 10/1972 | Anderson et al. | |

(Continued)

FOREIGN PATENT DOCUMENTS

FR 823395 1/1938

(Continued)

OTHER PUBLICATIONS

International Search Report and Written Opinion, dated May 14, 2009, issued in International Application No. PCT/US09/38925.

(Continued)

*Primary Examiner*—Ramon M Barrera
(74) *Attorney, Agent, or Firm*—Venable LLP; Robert S. Babayi

(57) ABSTRACT

An improved field emission system and method is provided that involves field emission structures having electric or magnetic field sources. The magnitudes, polarities, and positions of the magnetic or electric field sources are configured to have desirable correlation properties, which may be in accordance with a code. The correlation properties correspond to a desired spatial force function where spatial forces between field emission structures correspond to relative alignment, separation distance, and the spatial force function.

23 Claims, 45 Drawing Sheets

U.S. PATENT DOCUMENTS

| | | | |
|---|---|---|---|
| 3,802,034 A | 4/1974 | Bookless | |
| 3,845,430 A | 10/1974 | Petkewicz et al. | |
| 4,079,558 A | 3/1978 | Forham | |
| 4,222,489 A | 9/1980 | Hutter | |
| 4,453,294 A | 6/1984 | Morita | |
| 4,535,278 A | 8/1985 | Asakawa | |
| 4,547,756 A | 10/1985 | Miller et al. | |
| 4,629,131 A * | 12/1986 | Podell | 241/36 |
| 4,941,236 A | 7/1990 | Sherman et al. | |
| 5,050,276 A | 9/1991 | Pemberton | |
| 5,367,891 A | 11/1994 | Furuyama | |
| 5,383,049 A | 1/1995 | Carr | |
| 5,495,221 A | 2/1996 | Post | |
| 5,512,732 A | 4/1996 | Yagnik et al. | |
| 5,631,093 A | 5/1997 | Perry et al. | |
| 5,631,618 A | 5/1997 | Trumper et al. | |
| 6,072,251 A | 6/2000 | Markle | |
| 6,170,131 B1 | 1/2001 | Shin | |
| 6,275,778 B1 | 8/2001 | Shimada et al. | |
| 6,457,179 B1 | 10/2002 | Prendergast | |
| 6,467,326 B1 | 10/2002 | Garrigus | |
| 6,607,304 B1 | 8/2003 | Lake et al. | |
| 6,720,698 B2 | 4/2004 | Galbraith | |
| 6,847,134 B2 | 1/2005 | Frissen et al. | |
| 6,862,748 B2 | 3/2005 | Prendergast | |
| 6,927,657 B1 | 8/2005 | Wu | |
| 6,971,147 B2 | 12/2005 | Halstead | |
| 7,031,160 B2 | 4/2006 | Tillotson | |
| 7,066,778 B2 | 6/2006 | Kretzschmar | |
| 7,362,018 B1 | 4/2008 | Kulogo et al. | |
| 7,444,683 B2 | 11/2008 | Prendergast et al. | |
| 2004/0003487 A1 | 1/2004 | Reiter | |
| 2004/0244636 A1 | 12/2004 | Meadow et al. | |
| 2005/0102802 A1 | 5/2005 | Sitbon et al. | |
| 2006/0066428 A1 | 3/2006 | McCarthy et al. | |
| 2006/0189259 A1 | 8/2006 | Park et al. | |
| 2006/0214756 A1 | 9/2006 | Elliott et al. | |
| 2006/0290451 A1 | 12/2006 | Prendergast et al. | |
| 2008/0181804 A1 | 7/2008 | Tanigawa et al. | |
| 2008/0186683 A1 | 8/2008 | Ligtenberg et al. | |
| 2008/0272868 A1 | 11/2008 | Prendergast et al. | |
| 2008/0282517 A1 | 11/2008 | Claro | |
| 2009/0021333 A1 | 1/2009 | Fiedler | |

FOREIGN PATENT DOCUMENTS

| | | |
|---|---|---|
| WO | WO-2007081830 A2 | 7/2007 |

OTHER PUBLICATIONS http://www.schmersalusa.com/safety_controllers/drawings/aes.pdf.
http://www.farnell.com/datasheets/36449.pdf.
http://www.schmersalusa.com/catalog_pdfs/BNS_B20.pdf.
http://www.schmersalusa.com/machine_guarding/coded_magnet/drawings/bns333.pdf.

* cited by examiner

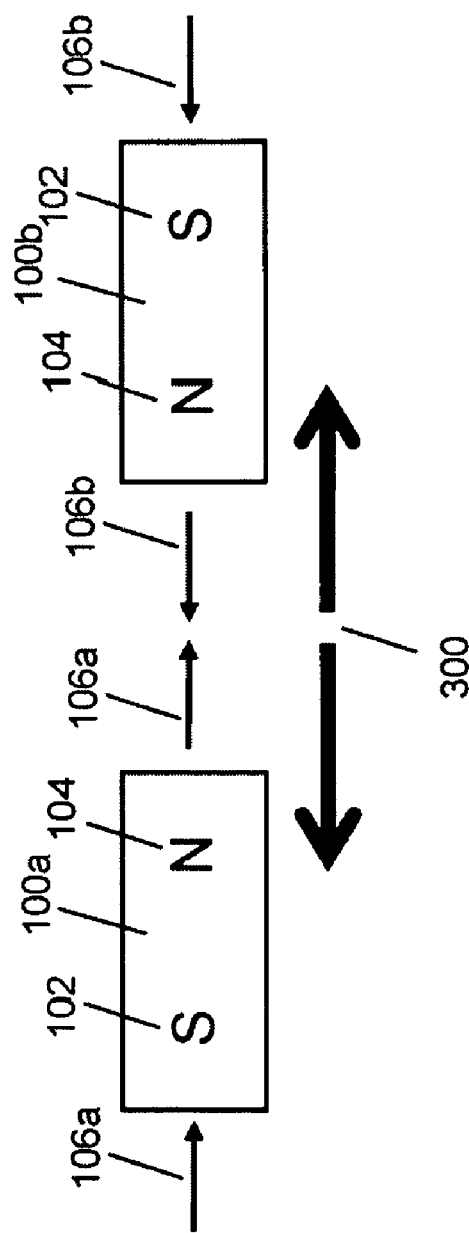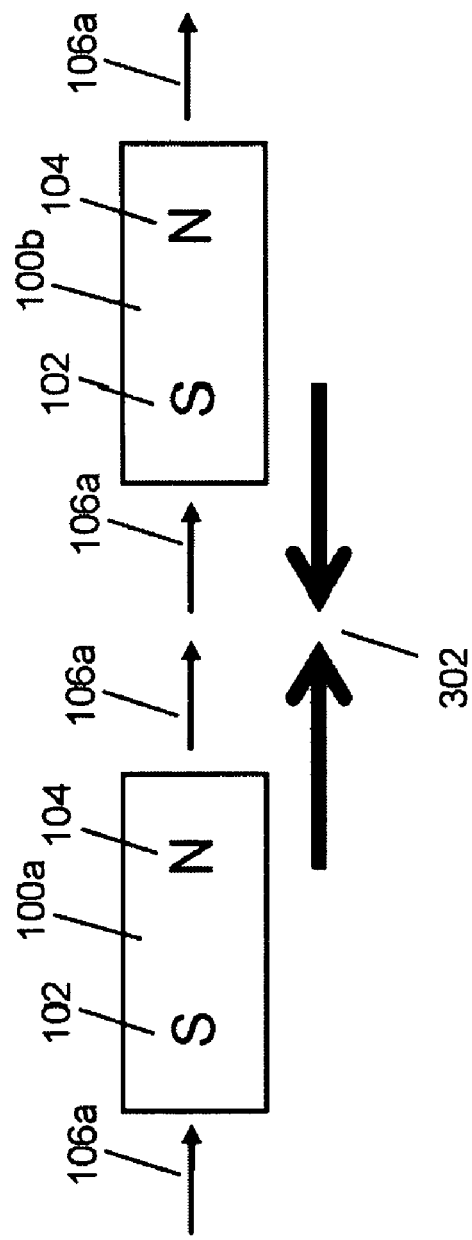

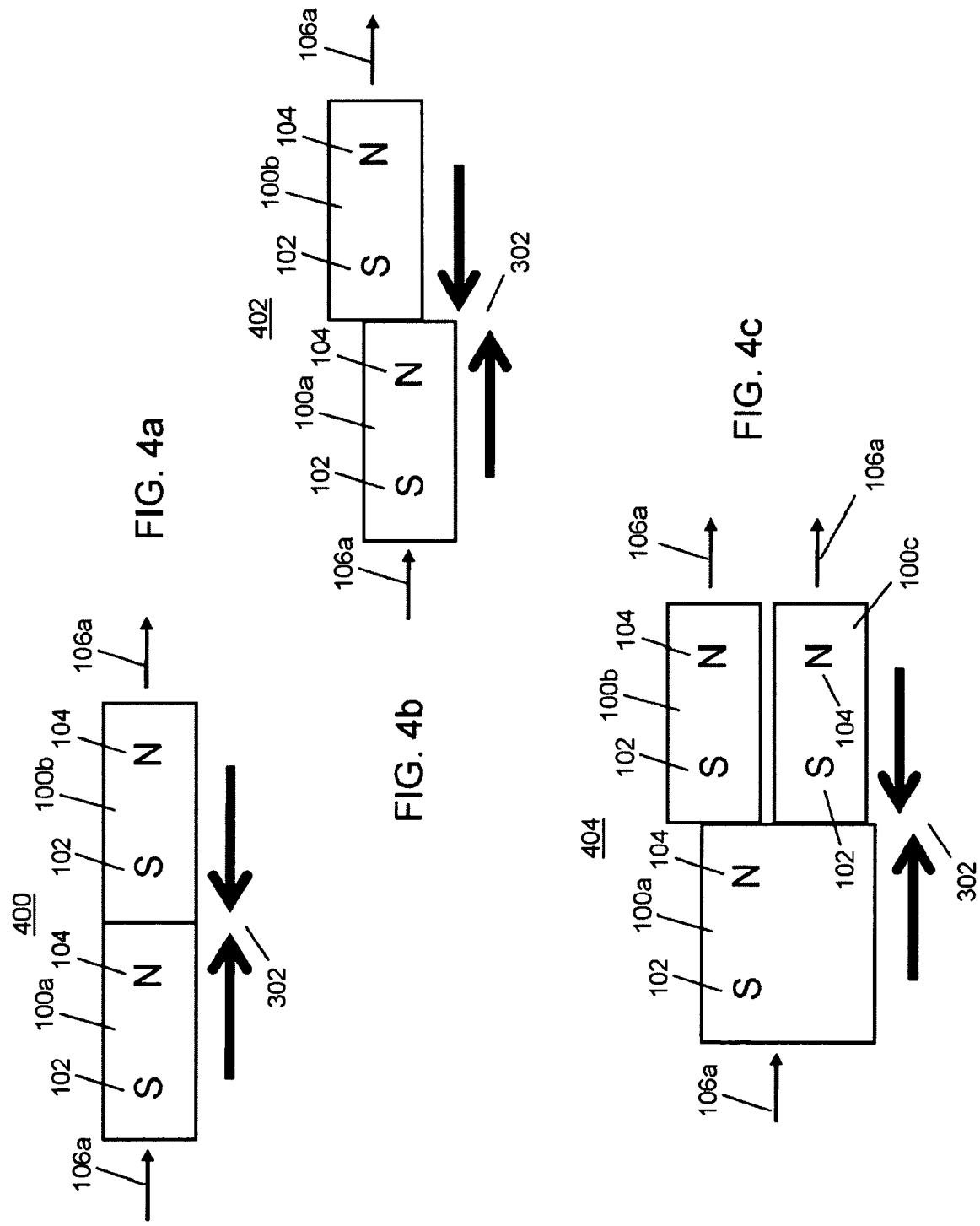

Barker - 7 code = +1 +1 +1 −1 −1 +1 −1

$1R = -1$
$1.5A + 1R = 0.5$
$1.5A + 2R = -0.5$
$3A + 2.5R = 0.5$
$2A + 4.5R = -2.5$
$3.5A + 4.5R = -1$
$9A = 9$ $9A = 9$
$3.5A + 4.5R = -1$
$2A + 4.5R = -2.5$
$3A + 2.5R = 0.5$
$1.5A + 2R = -0.5$
$1.5A + 1R = 0.5$
$1R = -1$

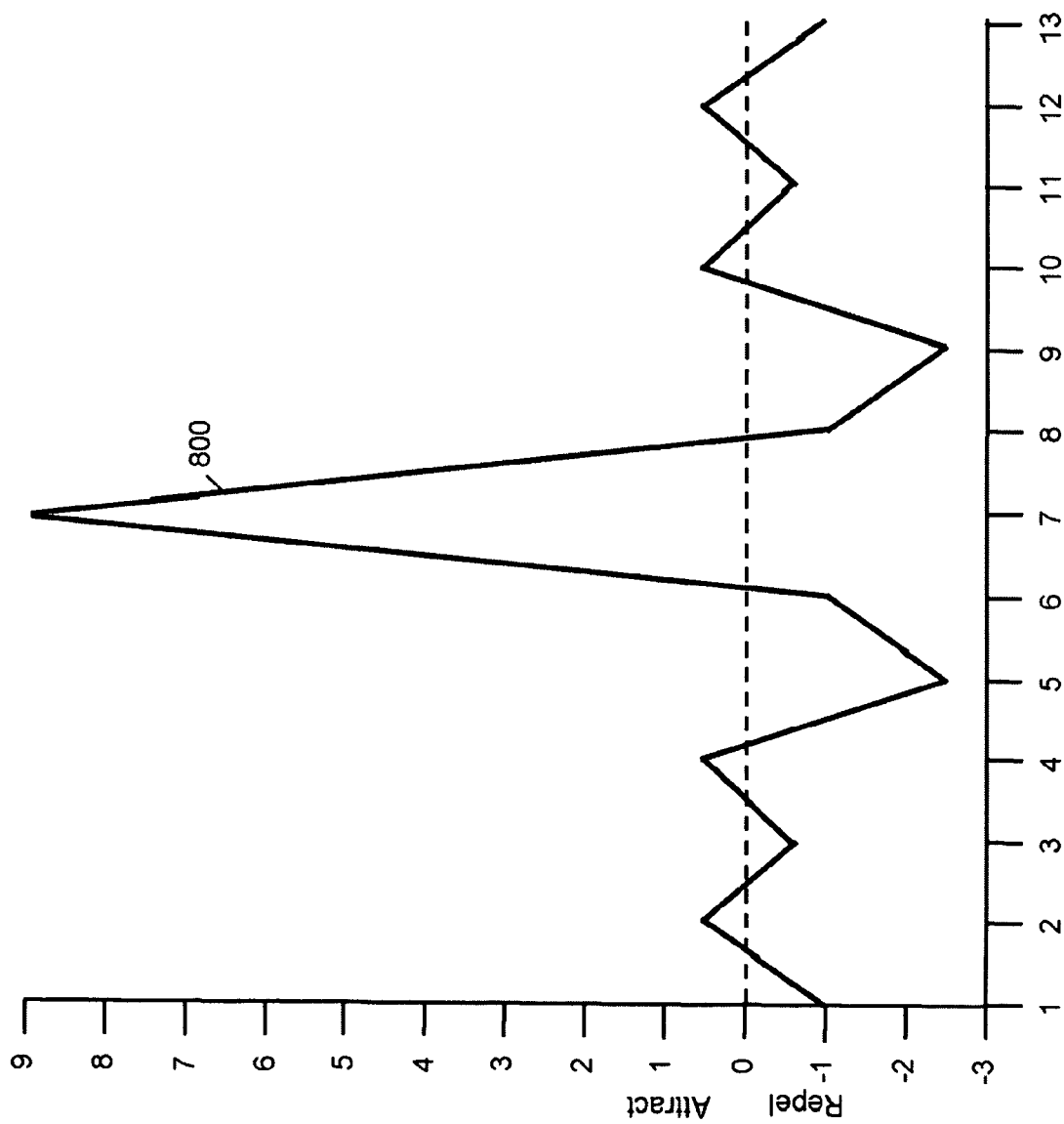

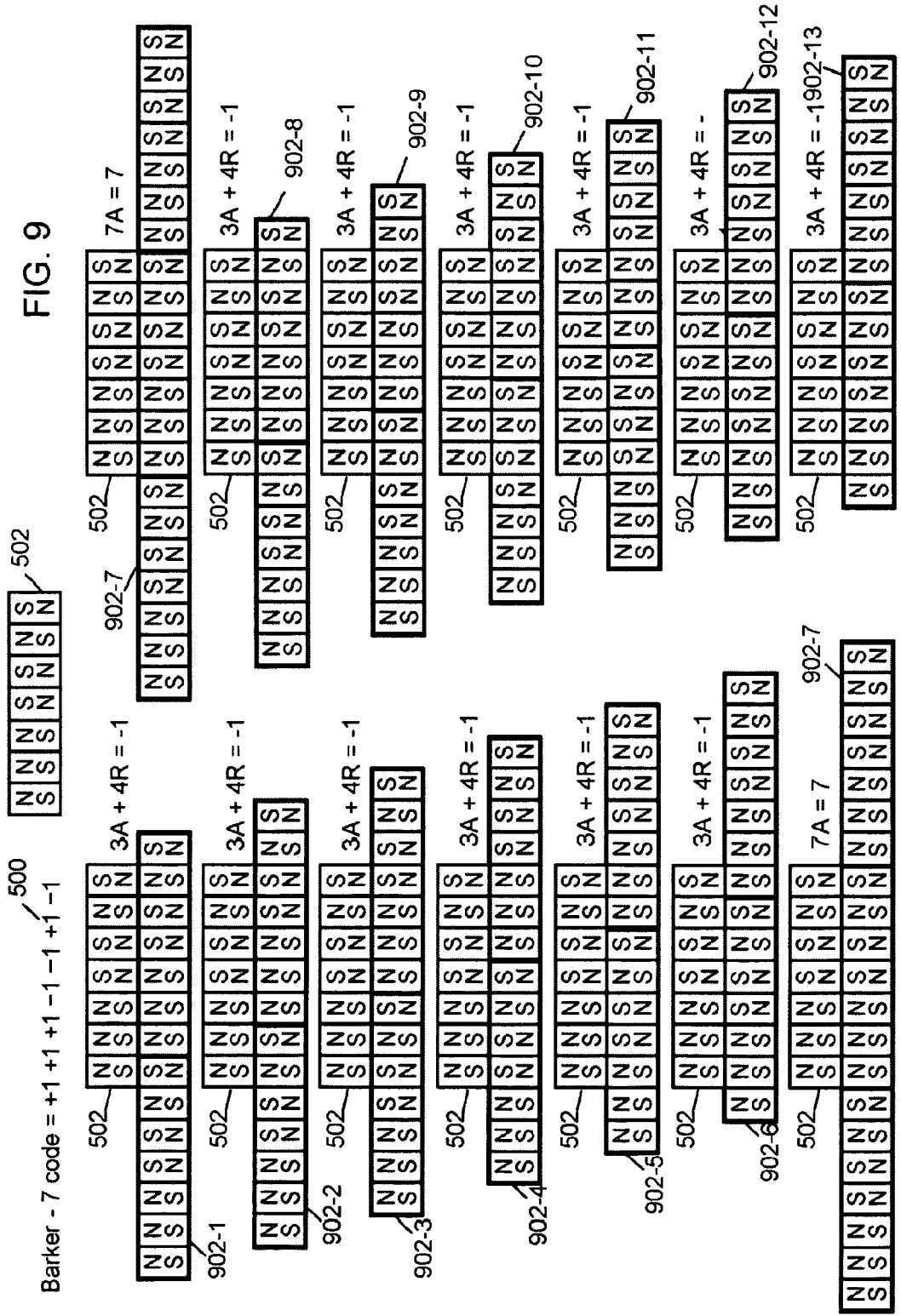

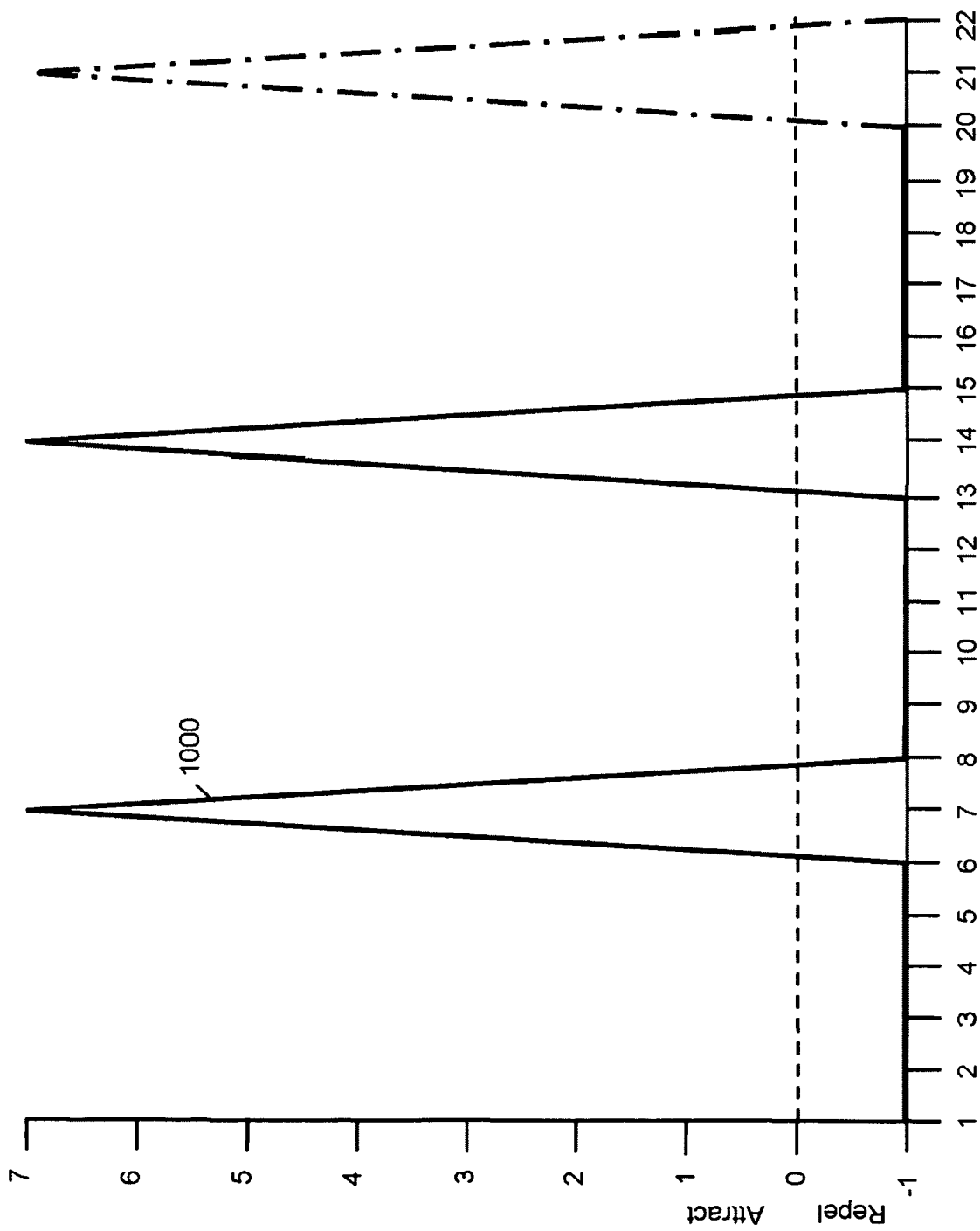

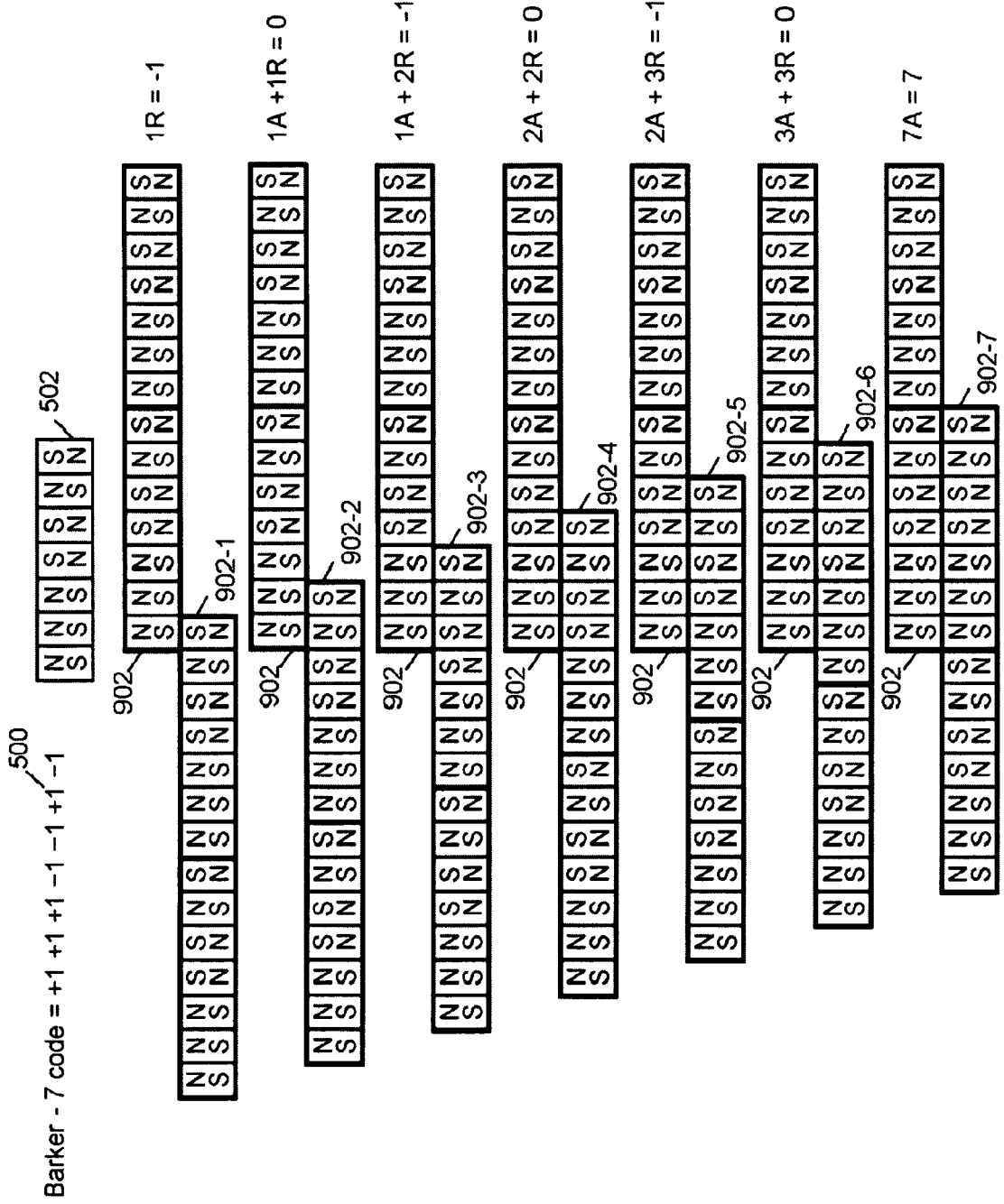

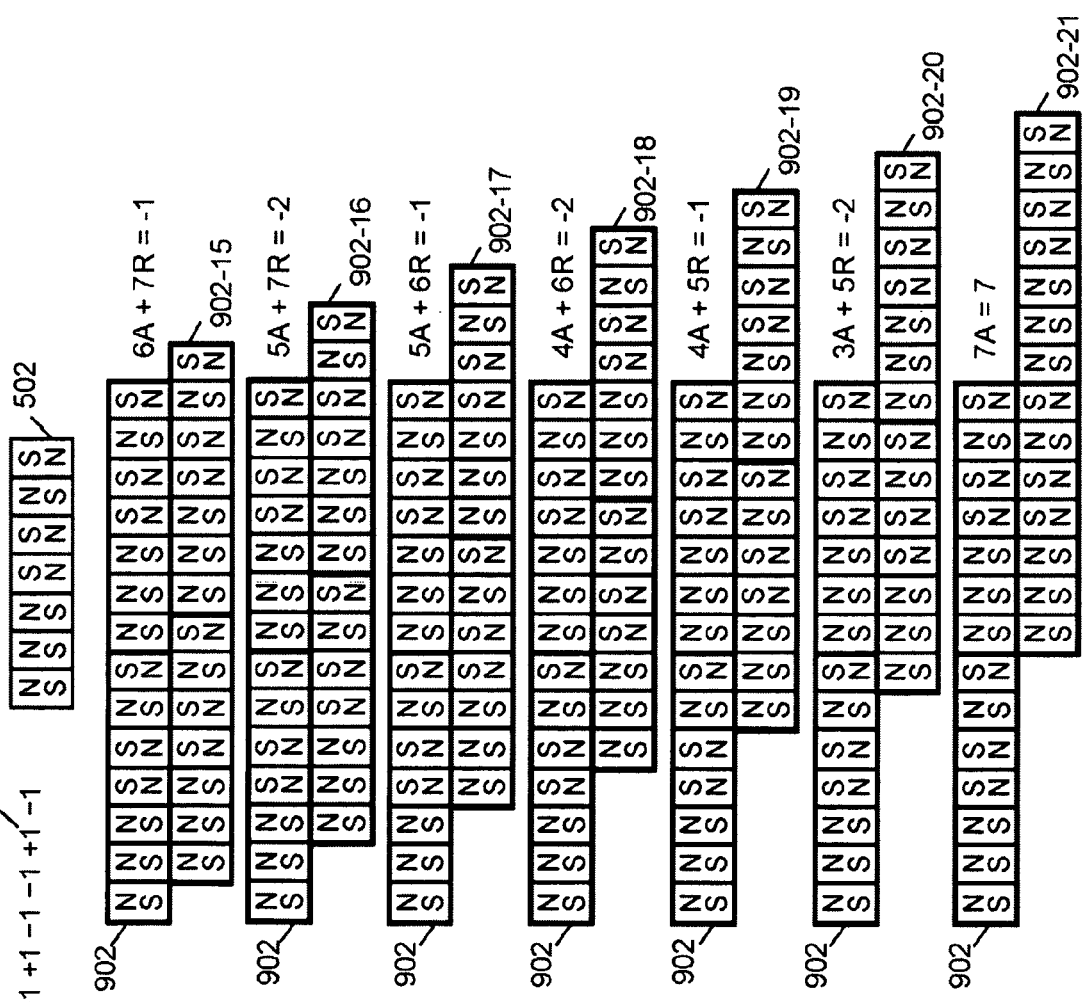

Barker 7x7 wrapped code:

+1 +1 +1 -1 -1 -1 +1   1400
+1 +1 -1 -1 +1 -1 +1
-1 -1 -1 +1 -1 -1 +1
-1 -1 +1 -1 -1 +1 +1
-1 +1 -1 -1 +1 +1 +1
+1 -1 -1 +1 +1 +1 -1
-1 -1 +1 +1 +1 -1 -1

1404 ⟶   -1 -2 -3 -4 -5 -6 +49 -6 -5 -4 -3 -2 -1   1406

1402a

Mirror Image Rotated -270°   -1 -6 +5 -4 +7 +2 +1 +2 +7 -4 +5 -6 -1   1408

1402e

Mirror Image Rotated -180°   -5 +6 +9 -4 +15 -6 -7 -30 +15 +12 -3 +6 -1   1410

1402d

Mirror Image

1402b

Mirror Image Rotated -90°   +7 -2 +5 -4 +3 -6 +1 -6 +3 -4 +5 -2 +7   1412

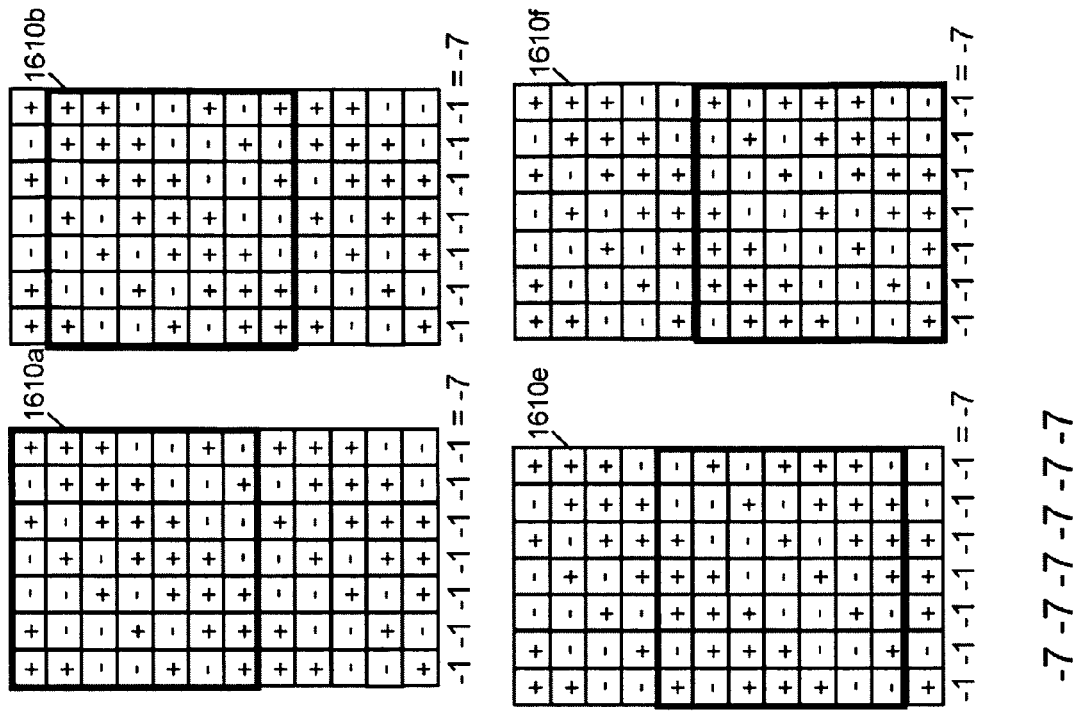
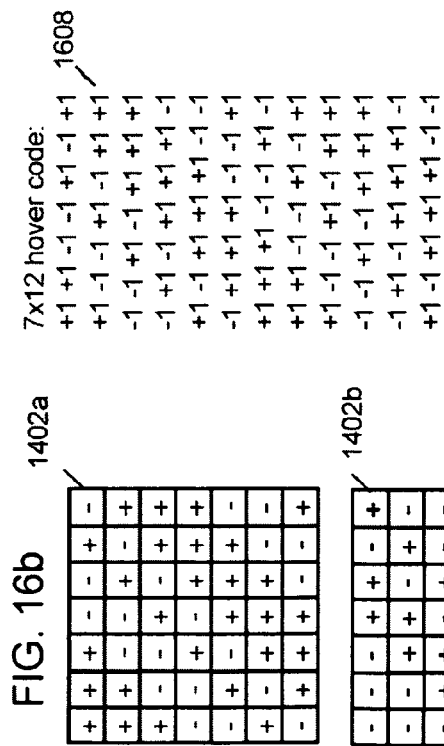
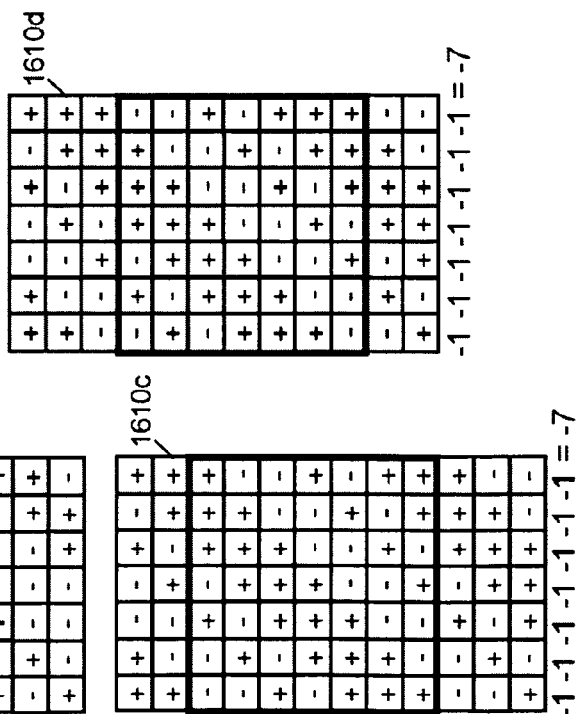
FIG. 16b

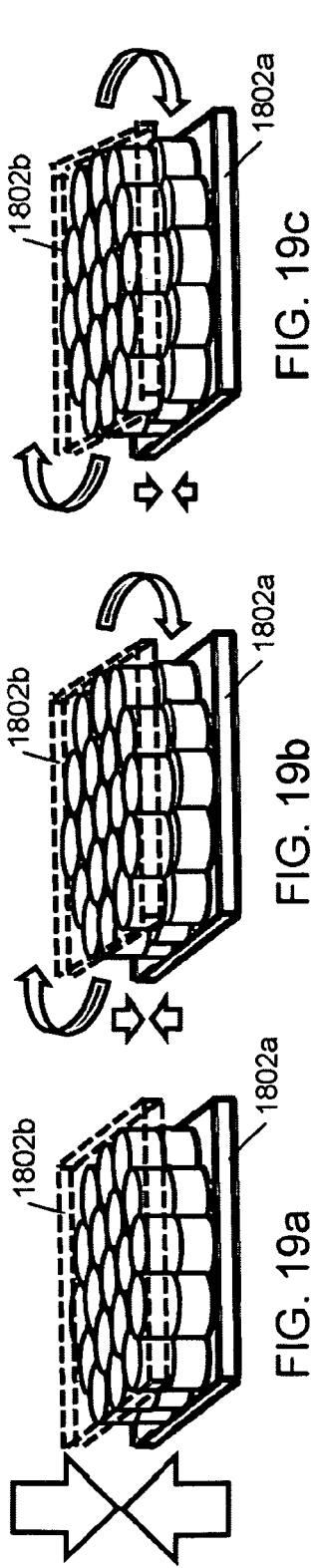
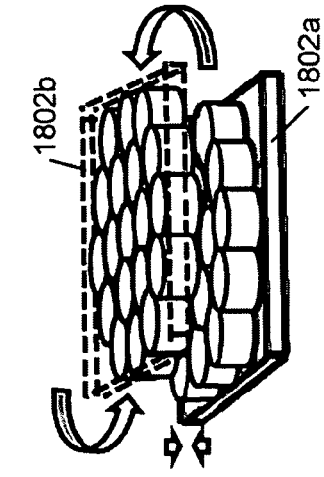
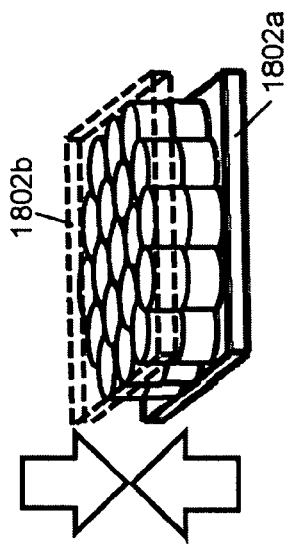
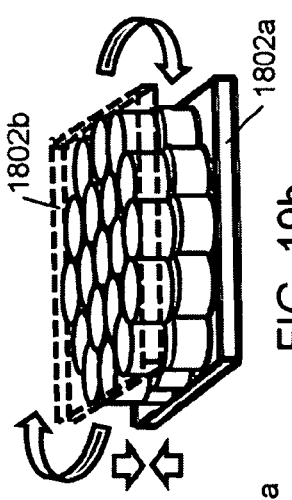
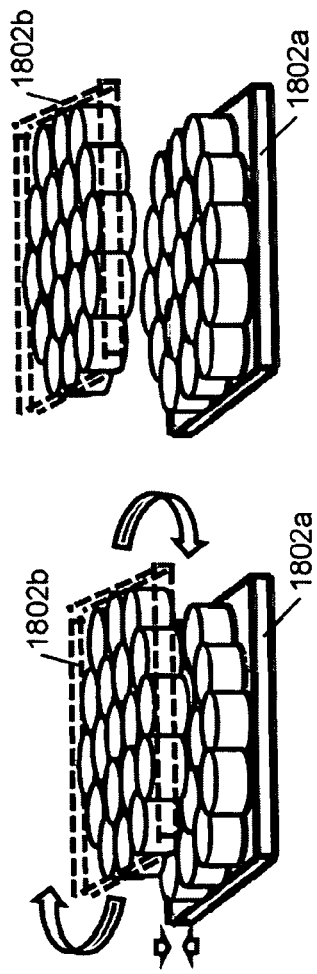
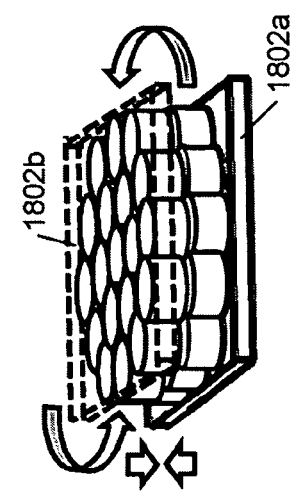
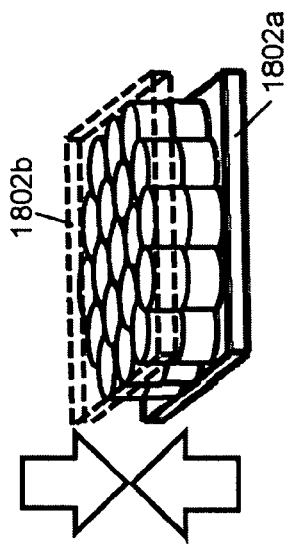
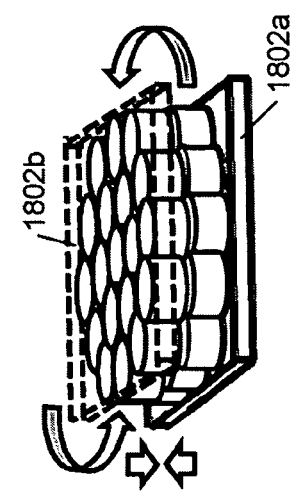
FIG. 19a  FIG. 19b  FIG. 19c
FIG. 19d  FIG. 19e  FIG. 19f
FIG. 19g  FIG. 19h  FIG. 19i

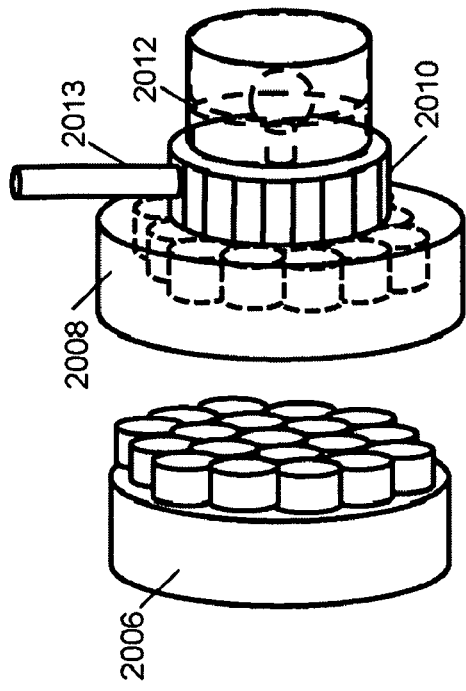
FIG. 20b
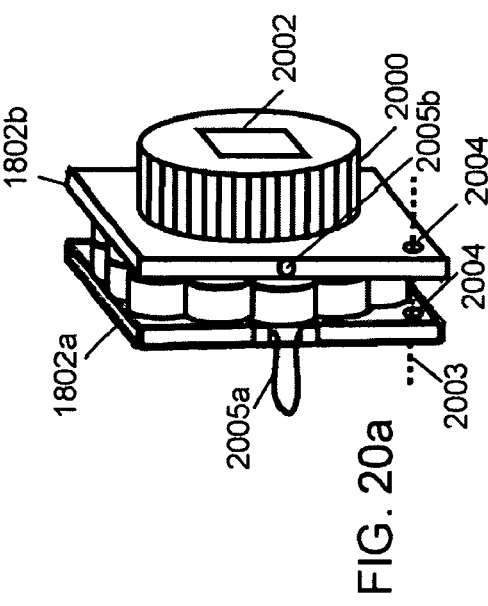
FIG. 20a
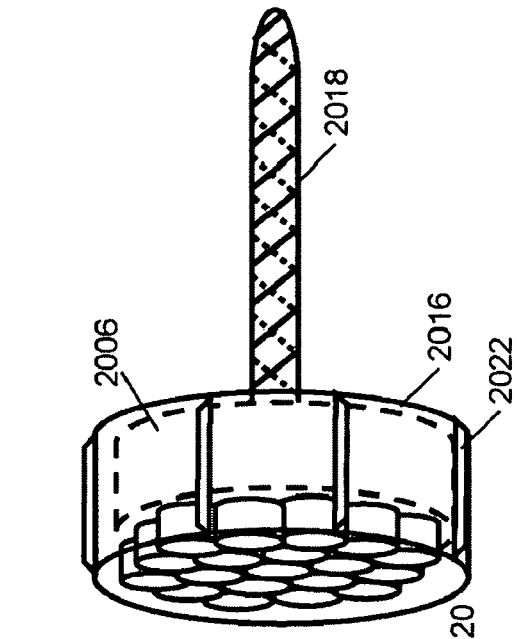
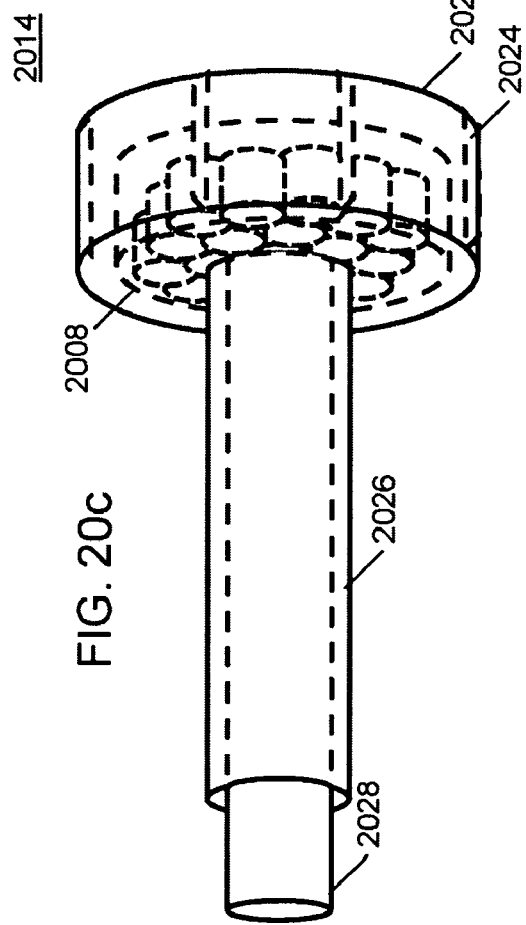
FIG. 20c

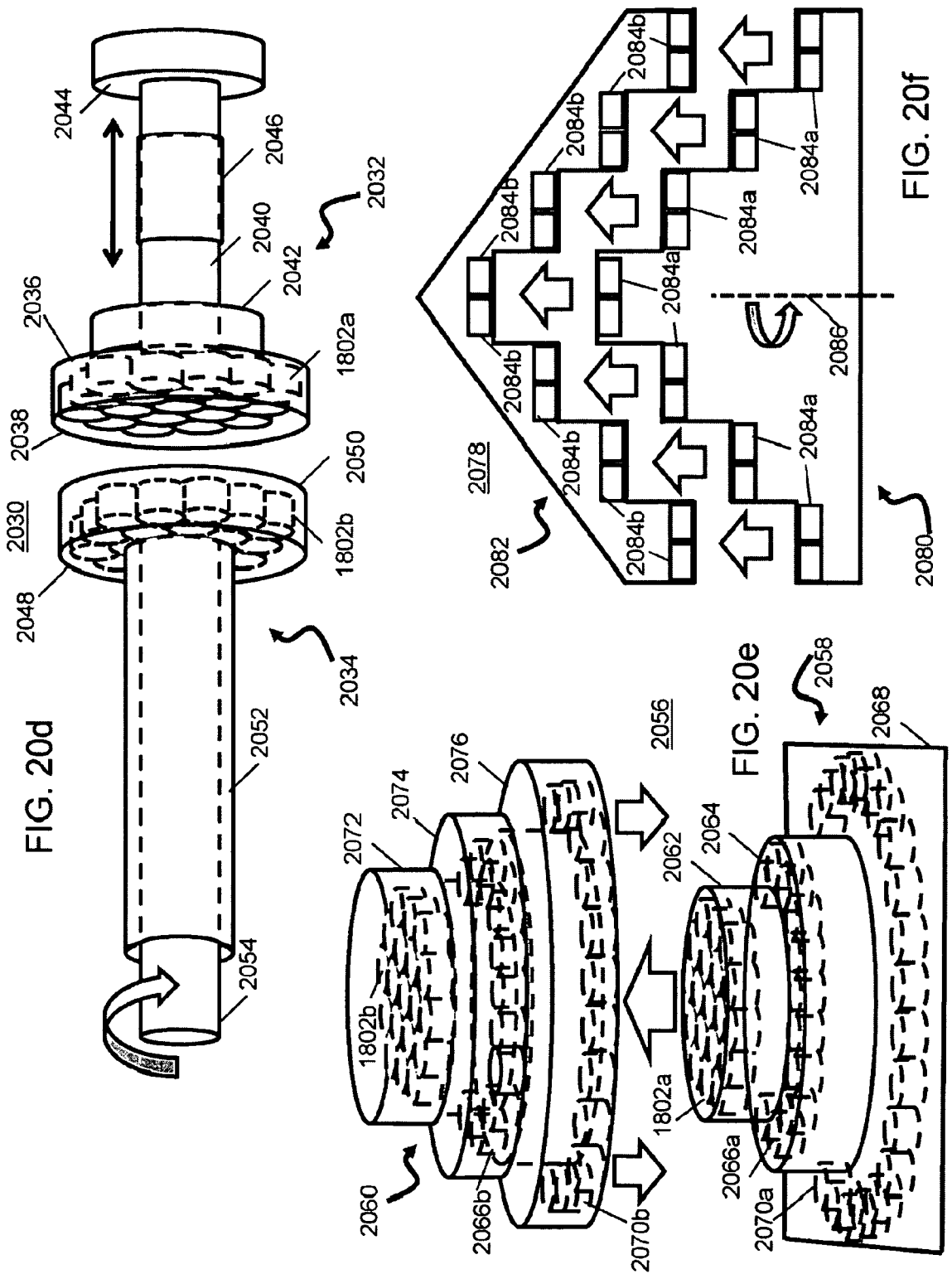

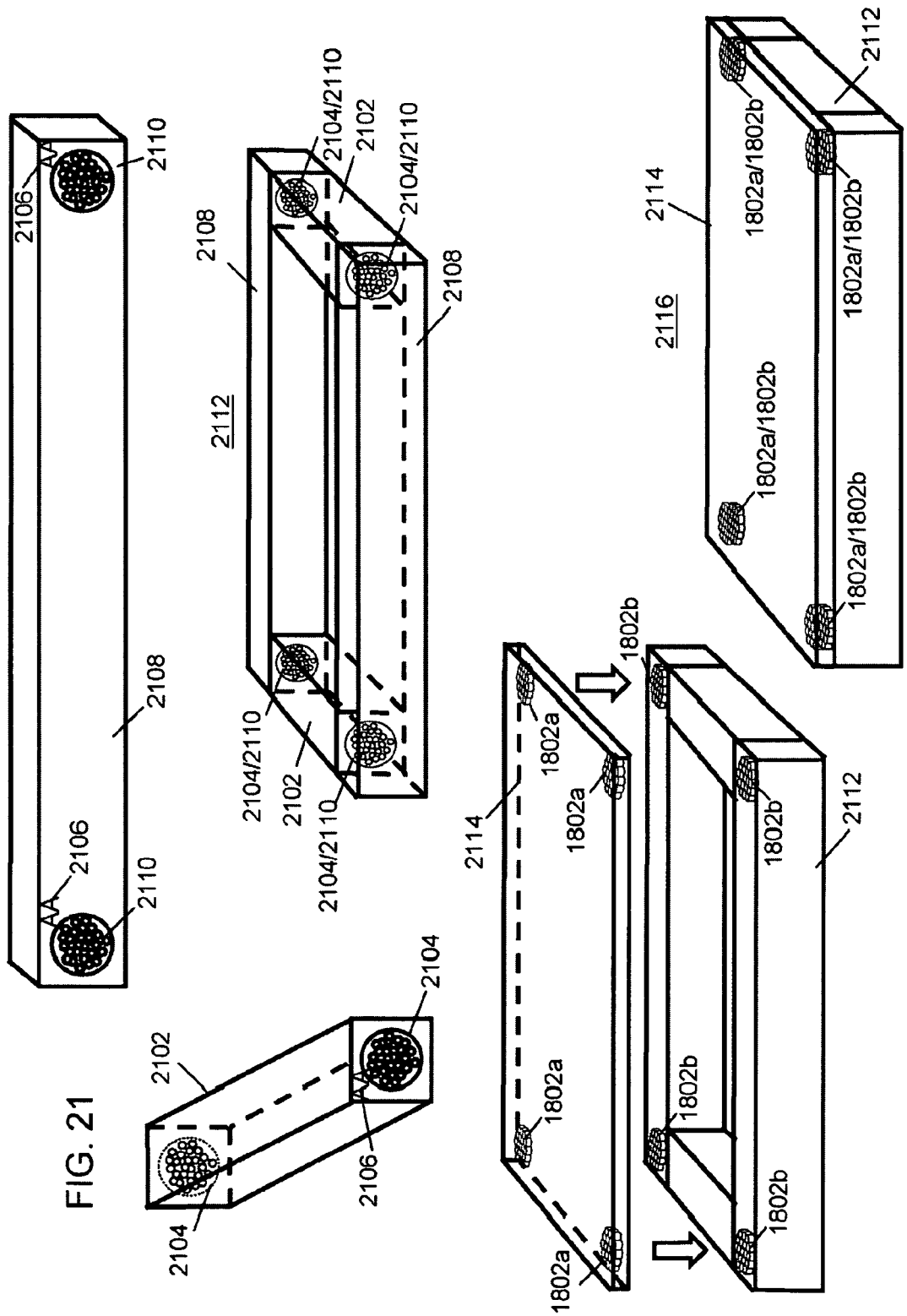

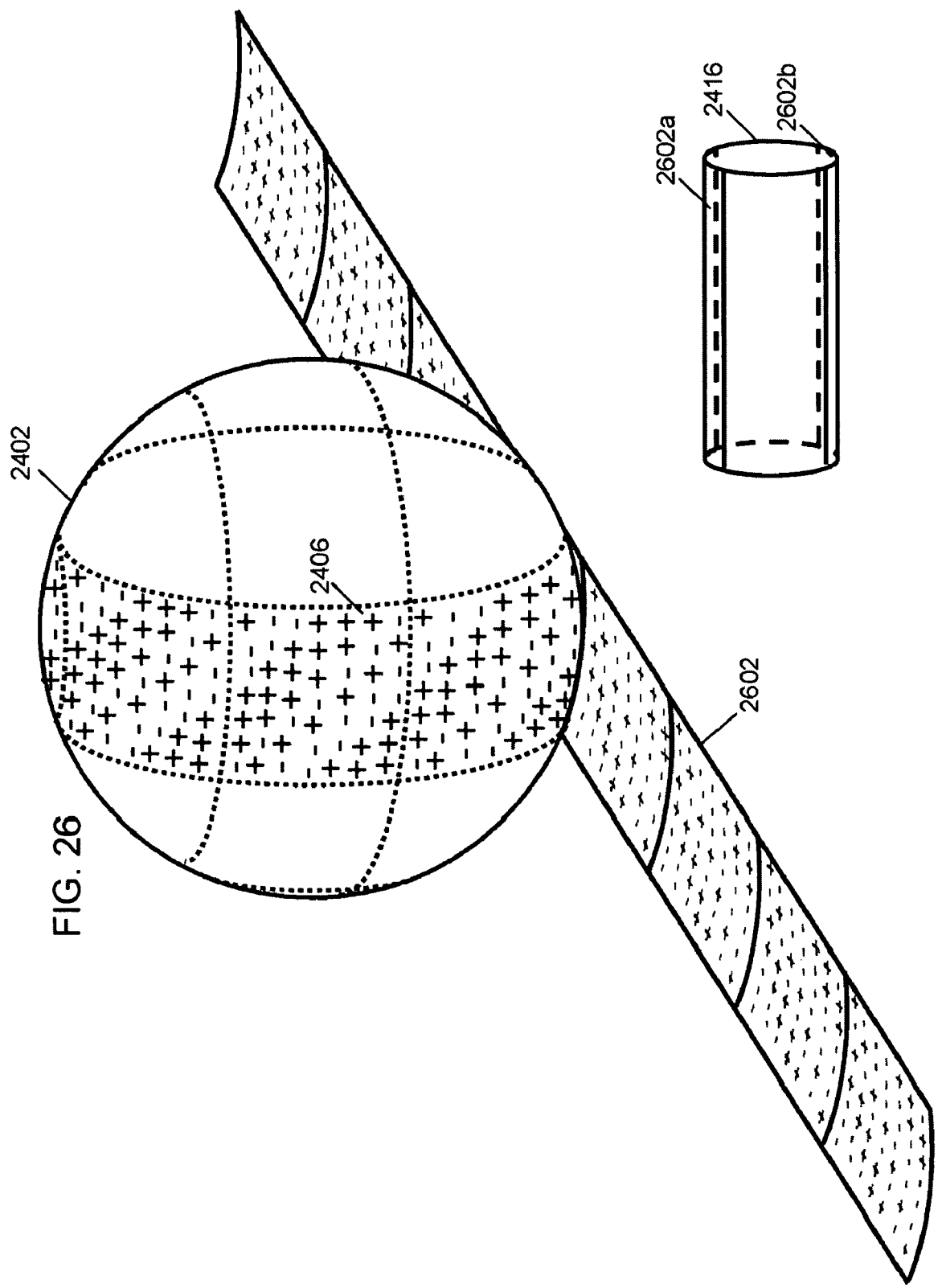

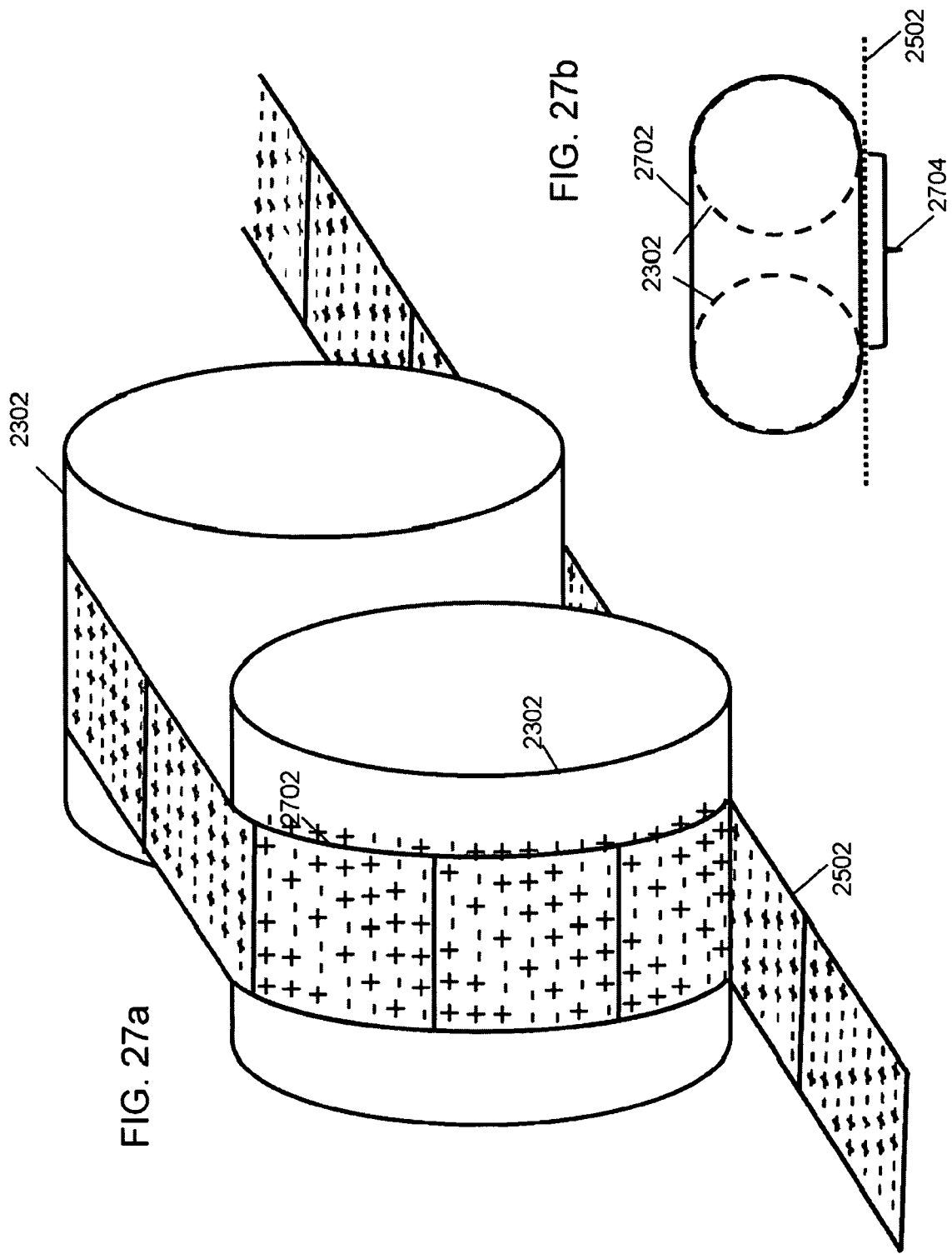

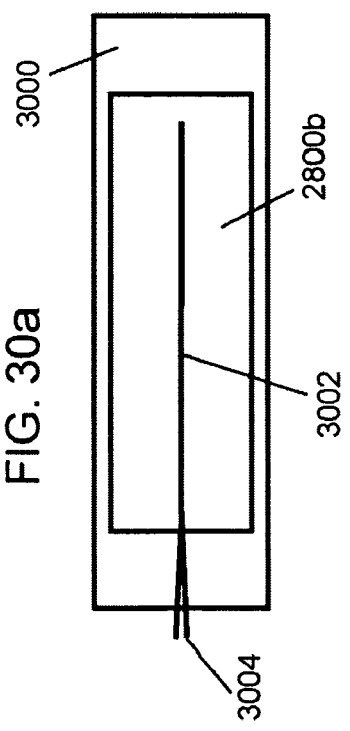
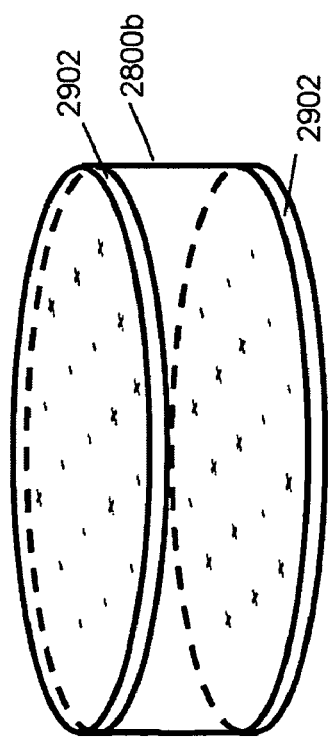
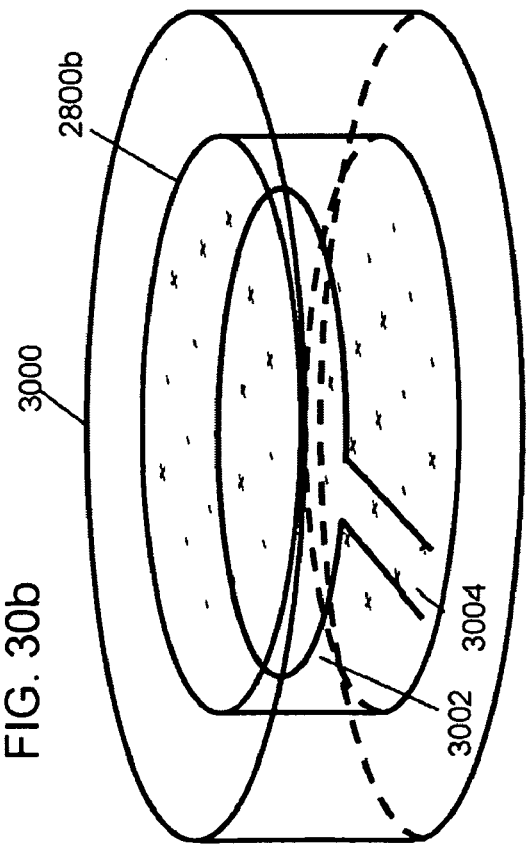

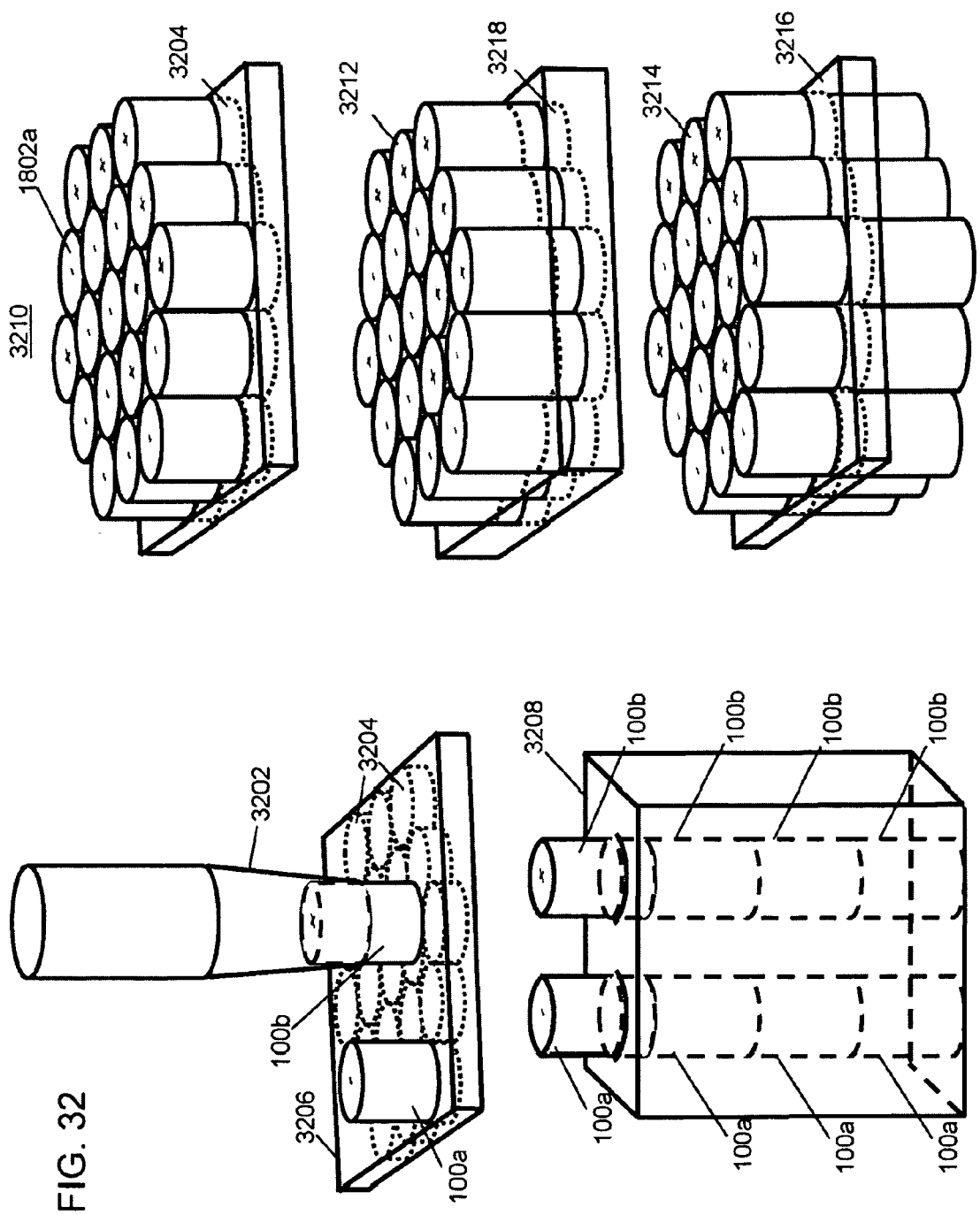

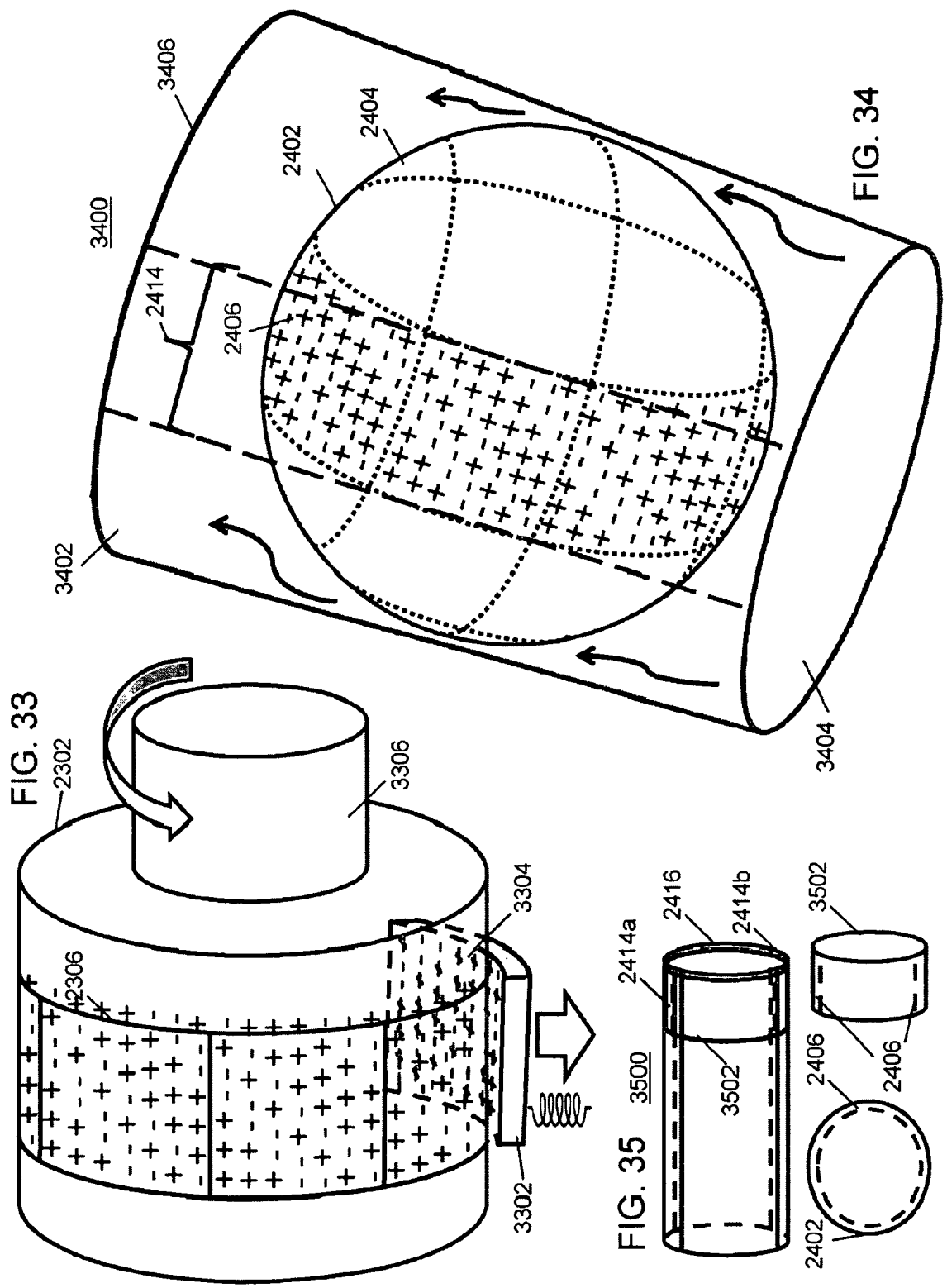

FIELD EMISSION SYSTEM AND METHOD

CROSS-REFERENCE TO RELATED APPLICATIONS

This Non-provisional Application claims the benefit of U.S. Provisional Application Ser. No. 61/123,019, filed Apr. 4, 2008, titled "A Field Emission System and Method", which is incorporated by reference herein in its entirety.

FIELD OF THE INVENTION

The present invention relates generally to a field emission system and method. More particularly, the present invention relates to a system and method where correlated magnetic and/or electric field structures create spatial forces in accordance with the relative alignment of the field emission structures and a spatial force function.

BACKGROUND OF THE INVENTION

Alignment characteristics of magnetic fields have been used to achieve precision movement and positioning of objects. A key principle of operation of an alternating-current (AC) motor is that a permanent magnet will rotate so as to maintain its alignment within an external rotating magnetic field. This effect is the basis for the early AC motors including the "Electro Magnetic Motor" for which Nikola Tesla received U.S. Pat. No. 381,968 on May 1, 1888. On Jan. 19, 1938, Marius Lavet received French Patent 823,395 for the stepper motor which he first used in quartz watches. Stepper motors divide a motor's full rotation into a discrete number of steps. By controlling the times during which electromagnets around the motor are activated and deactivated, a motor's position can be controlled precisely. Computer-controlled stepper motors are one of the most versatile forms of positioning systems. They are typically digitally controlled as part of an open loop system, and are simpler and more rugged than closed loop servo systems. They are used in industrial high speed pick and place equipment and multi-axis computer numerical control (CNC) machines. In the field of lasers and optics they are frequently used in precision positioning equipment such as linear actuators, linear stages, rotation stages, goniometers, and mirror mounts. They are used in packaging machinery, and positioning of valve pilot stages for fluid control systems. They are also used in many commercial products including floppy disk drives, flatbed scanners, printers, plotters and the like.

Although alignment characteristics of magnetic fields are used in certain specialized industrial environments and in a relatively limited number of commercial products, their use for precision alignment purposes is generally limited in scope. For the majority of processes where alignment of objects is important, e.g., residential construction, comparatively primitive alignment techniques and tools such as a carpenter's square and a level are more commonly employed. Moreover, long trusted tools and mechanisms for attaching objects together such as hammers and nails; screw drivers and screws; wrenches and nuts and bolts; and the like, when used with primitive alignment techniques result in far less than precise residential construction, which commonly leads to death and injury when homes collapse, roofs are blown off in storms, etc. Generally, there is considerable amount of waste of time and energy in most of the processes to which the average person has grown accustomed that are a direct result of imprecision of alignment of assembled objects. Machined parts wear out sooner, engines are less efficient resulting in higher pollution, buildings and bridges collapse due to improper construction, and so on.

It has been discovered that various field emission properties can be put in use in a wide range of applications.

SUMMARY OF THE INVENTION

Briefly, the present invention is an improved field emission system and method. The invention pertains to field emission structures comprising electric or magnetic field sources having magnitudes, polarities, and positions corresponding to a desired spatial force function where a spatial force is created based upon the relative alignment of the field emission structures and the spatial force function. The invention herein is sometimes referred to as correlated magnetism, correlated field emissions, correlated magnets, coded magnetism, or coded field emissions. Structures of magnets arranged conventionally (or 'naturally') where their interacting poles alternate are referred to herein as non-correlated magnetism, non-correlated magnets, non-coded magnetism, or non-coded field emissions.

In accordance with one embodiment of the invention, a field emission system comprises a first field emission structure and a second field emission structure. The first and second field emission structures each comprise an array of field emission sources each having positions and polarities relating to a desired spatial force function that corresponds to the relative alignment of the first and second field emission structures within a field domain. The positions and polarities of each field emission source of each array of field emission sources can be determined in accordance with at least one correlation function. The at least one correlation function can be in accordance with at least one code. The at least one code can be at least one of a pseudorandom code, a deterministic code, or a designed code. The at least one code can be a one dimensional code, a two dimensional code, a three dimensional code, or a four dimensional code.

Each field emission source of each array of field emission sources has a corresponding field emission amplitude and vector direction determined in accordance with the desired spatial force function, where a separation distance between the first and second field emission structures and the relative alignment of the first and second field emission structures creates a spatial force in accordance with the desired spatial force function. The spatial force comprises at least one of an attractive spatial force or a repellant spatial force. The spatial force corresponds to a peak spatial force of said desired spatial force function when said first and second field emission structures are substantially aligned such that each field emission source of said first field emission structure substantially aligns with a corresponding field emission source of said second field emission structure. The spatial force can be used to produce energy, transfer energy, move an object, affix an object, automate a function, control a tool, make a sound, heat an environment, cool an environment, affect pressure of an environment, control flow of a fluid, control flow of a gas, and control centrifugal forces.

Under one arrangement, the spatial force is typically about an order of magnitude less than the peak spatial force when the first and second field emission structures are not substantially aligned such that field emission source of the first field emission structure substantially aligns with a corresponding field emission source of said second field emission structure.

A field domain corresponds to field emissions from the array of first field emission sources of the first field emission structure interacting with field emissions from the array of second field emission sources of the second field emission structure.

The relative alignment of the first and second field emission structures can result from a respective movement path function of at least one of the first and second field emission structures where the respective movement path function is one of a one-dimensional movement path function, a two-dimensional movement path function or a three-dimensional movement path function. A respective movement path function can be at least one of a linear movement path function, a non-linear movement path function, a rotational movement path function, a cylindrical movement path function, or a spherical movement path function. A respective movement path function defines movement versus time for at least one of the first and second field emission structures, where the movement can be at least one of forward movement, backward movement, upward movement, downward movement, left movement, right movement, yaw, pitch, and or roll. Under one arrangement, a movement path function would define a movement vector having a direction and amplitude that varies over time.

Each array of field emission sources can be one of a one-dimensional array, a two-dimensional array, or a three-dimensional array. The polarities of the field emission sources can be at least one of North-South polarities or positive-negative polarities. At least one of the field emission sources comprises a magnetic field emission source or an electric field emission source. At least one of the field emission sources can be a permanent magnet, an electromagnet, an electret, a magnetized ferromagnetic material, a portion of a magnetized ferromagnetic material, a soft magnetic material, or a superconductive magnetic material. At least one of the first and second field emission structures can be at least one of a back keeper layer, a front saturable layer, an active intermediate element, a passive intermediate element, a lever, a latch, a swivel, a heat source, a heat sink, an inductive loop, a plating nichrome wire, an embedded wire, or a kill mechanism. At least one of the first and second field emission structures can be a planer structure, a conical structure, a cylindrical structure, a curve surface, or a stepped surface.

In accordance with another embodiment of the invention, a method of controlling field emissions comprises defining a desired spatial force function corresponding to the relative alignment of a first field emission structure and a second field emission structure within a field domain and establishing, in accordance with the desired spatial force function, a position and polarity of each field emission source of a first array of field emission sources corresponding to the first field emission structure and of each field emission source of a second array of field emission sources corresponding to the second field emission structure.

In accordance with a further embodiment of the invention, a field emission system comprises a first field emission structure comprising a plurality of first field emission sources having positions and polarities in accordance with a first correlation function and a second field emission structure comprising a plurality of second field emission source having positions and polarities in accordance with a second correlation function, the first and second correlation functions corresponding to a desired spatial force function, the first correlation function complementing the second correlation function such that each field emission source of said plurality of first field emission sources has a corresponding counterpart field emission source of the plurality of second field emission sources and the first and second field emission structures will substantially correlate when each of the field emission source counterparts are substantially aligned.

BRIEF DESCRIPTION OF THE DRAWINGS

The present invention is described with reference to the accompanying drawings. In the drawings, like reference numbers indicate identical or functionally similar elements. Additionally, the left-most digit(s) of a reference number identifies the drawing in which the reference number first appears.

FIG. 3a depicts two magnets aligned such that their polarities are opposite in direction resulting in a repelling spatial force;

FIG. 3b depicts two magnets aligned such that their polarities are the same in direction resulting in an attracting spatial force;

FIG. 4a depicts two magnets having substantial alignment;

FIG. 4b depicts two magnets having partial alignment;

FIG. 4c depicts different sized magnets having partial alignment;

FIG. 5 depicts a Barker length 7 code used to determine polarities and positions of magnets making up a magnetic field emission structure where all of the magnets have the same field strength;

FIG. 7 depicts a Barker length 7 code used to determine polarities and positions of magnets making up a first magnetic field emission structure where two of the magnets have different field strengths;

FIG. 8 depicts an exemplary spatial force function of the two magnetic field emission structures of FIG. 7;

FIG. 9 depicts exemplary code wrapping of a Barker length 7 code that is used to determine polarities and positions of magnets making up a first magnetic field emission structure;

FIG. 10 depicts an exemplary spatial force function of the two magnetic field emission structures of FIG. 9 where the second magnetic field emission structure repeats;

FIGS. 11a through 11d depict 27 different alignments of two magnetic field emission structures where a Barker length 7 code is used to determine polarities and positions of magnets making up a first magnetic field emission structure, which corresponds to two modulos of the Barker length 7 code end-to-end;

FIG. 14a depicts a two dimensional Barker-like code and a corresponding two-dimensional magnetic field emission structure;

FIG. 15 depicts an exemplary one-way slide lock codes and two-way slide lock codes;

FIG. 16a depicts an exemplary hover code and corresponding magnetic field emission structures that never achieve substantial alignment;

FIG. 16b depicts another exemplary hover code and corresponding magnetic field emission structures that never achieve substantial alignment;

FIGS. 19a-19i depict the exemplary magnetic field emission structure of FIG. 18a and its mirror image magnetic field emission structure and the resulting spatial forces produced in accordance with their various alignments as they are twisted relative to each other;

FIG. 20a depicts exemplary magnetic field emission structures, an exemplary turning mechanism, an exemplary tool insertion slot, exemplary alignment marks, an exemplary latch mechanism, and an exemplary axis for an exemplary pivot mechanism;

FIG. 20b depicts exemplary magnetic field emission structures having exemplary housings configured such that one housing can be inserted inside the other housing, exemplary alternative turning mechanism, exemplary swivel mechanism, an exemplary lever;

FIG. 20c depicts an exemplary tool assembly including an exemplary drill head assembly;

FIG. 20d depicts an exemplary hole cutting tool assembly having an outer cutting portion including a magnetic field emission structure and inner cutting portion including a magnetic field emission structure;

FIG. 20e depicts an exemplary machine press tool employing multiple levels of magnetic field emission structures;

FIG. 20f depicts a cross section of an exemplary gripping apparatus employing a magnetic field emission structure involving multiple levels of magnets;

FIG. 21 depicts exemplary magnetic field emission structures used to assemble structural members and a cover panel to produce an exemplary structural assembly;

FIG. 26 depicts an exemplary sphere having a magnetic field emission structure and a correlated surface where the magnetic field emission structure and the correlated surface provide traction and a gripping force as the sphere is turned;

FIGS. 27a and 27b depict an arrangement where a magnetic field emission structure wraps around two cylinders such that a much larger portion of the magnetic field emission structure is in contact with a correlated surface to provide additional traction and gripping force;

FIG. 29 depicts exemplary intermediate layers associated with a magnetic field emission structure;

FIGS. 30a through 30c provide a side view, an oblique projection, and a top view of a magnetic field emission structure having surrounding heat sink material and an exemplary embedded kill mechanism;

FIG. 32 depicts an exemplary magnetic field emission structure assembly apparatus;

FIG. 33 depicts a turning cylinder having a repeating magnetic field emission structure used to affect movement of a curved surface having the same magnetic field emission structure coding;

FIG. 34 depicts an exemplary valve mechanism;

FIG. 35 depicts and exemplary cylinder apparatus;

FIG. 36b depicts and exemplary hinge produced using alternating magnetic field emission structures made up of rings about a circle such as depicted in FIG. 36a;

DETAILED DESCRIPTION OF THE INVENTION

The present invention will now be described more fully in detail with reference to the accompanying drawings, in which the preferred embodiments of the invention are shown. This invention should not, however, be construed as limited to the embodiments set forth herein; rather, they are provided so that this disclosure will be thorough and complete and will fully convey the scope of the invention to those skilled in the art. Like numbers refer to like elements throughout.

Figure 1:
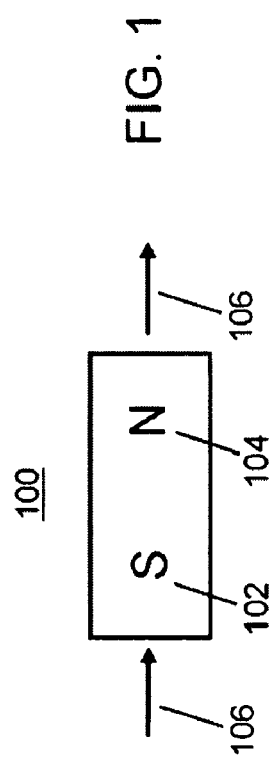
FIG. 1 depicts South and North poles and magnetic field vectors of an exemplary magnet.

FIG. 1 depicts South and North poles and magnetic field vectors of an exemplary magnet. Referring to FIG. 1, a magnet 100 has a South pole 102 and a North pole 104. Also depicted are magnetic field vectors 106 that represent the direction and magnitude of the magnet's moment. North and South poles are also referred to herein as positive (+) and negative (−) poles, respectively. In accordance with the invention, magnets can be permanent magnets, impermanent magnets, electromagnets, involve hard or soft material, and can be superconductive. In some applications, magnets can be replaced by electrets. Magnets can be most any size from very large to very small to include nanometer scale. In the case of non-superconducting materials there is a smallest size limit of one domain. When a material is made superconductive, however, the magnetic field that is within it can be as complex as desired and there is no practical lower size limit until you get to atomic scale. Magnets may also be created at atomic scale as electric and magnetic fields produced by molecular size structures may be tailored to have correlated properties, e.g. nanomaterials and macromolecules.

At the nanometer scale, one or more single domains can be used for coding where each single domain has a code and the quantization of the magnetic field would be the domain.

Figure 2:
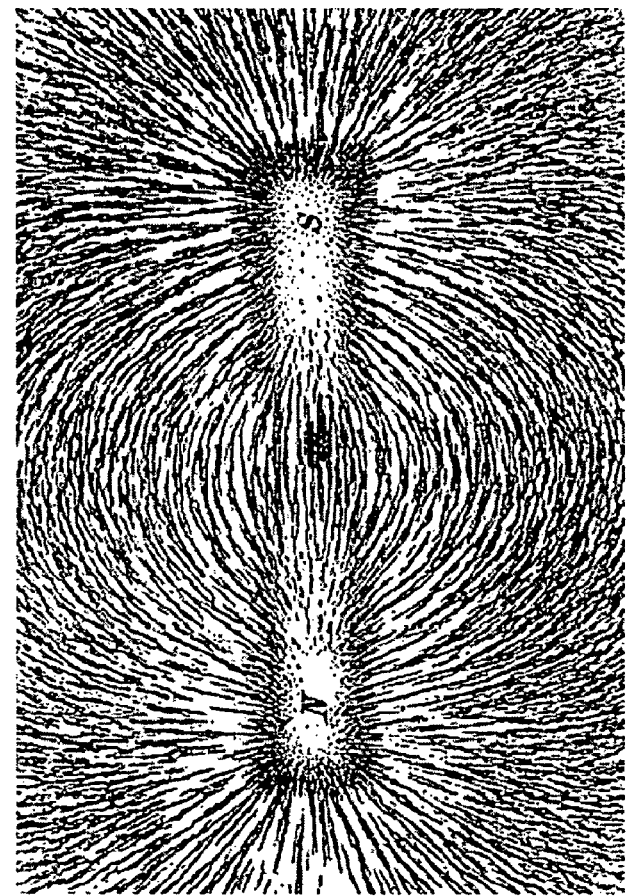
FIG. 2 depicts iron filings oriented in the magnetic field produced by a bar magnet.

FIG. 2 depicts iron filings oriented in the magnetic field 200 (i.e., field domain) produced by a single bar magnet.

FIG. 3a depicts two magnets aligned such that their polarities are opposite in direction resulting in a repelling spatial force. Referring to FIG. 3a, two magnets 100a and 100b are aligned such that their polarities are opposite in direction. Specifically, a first magnet 100a has a South pole 102 on the left and a North pole 104 on the right, whereas a second magnet 100b has a North pole 104 on the left and a South pole 102 on the right such that when aligned the magnetic field vectors 106a of the first magnet 100a are directed against the magnetic field vectors 106b of the second magnet 100b resulting in a repelling spatial force 300 that causes the two magnets to repel each other.

FIG. 3b depicts two magnets aligned such that their polarities are the same in direction resulting in an attracting spatial force. Referring to FIG. 3b, two magnets 100a and 100b are aligned such that their polarities are in the same direction. Specifically, a first magnet 100a has a South pole 102 on the left and a North pole 104 on the right, and a second magnet 100b also has South pole 102 on the left and a North pole 104 on the right such that when aligned the magnetic field vectors 106a of the first magnet 100a are directed the same as the magnetic field vectors 106a of the second magnet 100b resulting in an attracting spatial force 302 that causes the two magnets to attract each other.

FIG. 4a depicts two magnets 100a 100b having substantial alignment 400 such that the North pole 104 of the first magnet 100a has substantially full contact across its surface with the surface of the South pole 102 of the second magnet 100b.

FIG. 4b depicts two magnets 100a, 100b having partial alignment 402 such that the North pole 104 of the first magnet 100a is in contact across its surface with approximately two-thirds of the surface of the South pole 102 of the second magnet FIG. 4c depicts a first sized magnet 100a and smaller different sized magnets 100b 100c having partial alignment 404. As seen in FIG. 4c, the two smaller magnets 100b and 100c are aligned differently with the larger magnet 100a.

Generally, one skilled in the art will recognize in relation to FIGS. 4a through 4b that the direction of the vectors 106a of the attracting magnets will cause them to align in the same direction as the vectors 106a. However, the magnets can be moved relative to each other such that they have partial alignment yet they will still 'stick' to each other and maintain their positions relative to each other.

In accordance with the present invention, combinations of magnet (or electric) field emission sources, referred to herein as magnetic field emission structures, can be created in accordance with codes having desirable correlation properties. When a magnetic field emission structure is brought into alignment with a complementary, or mirror image, magnetic field emission structure the various magnetic field emission sources all align causing a peak spatial attraction force to be produced whereby misalignment of the magnetic field emission structures causes the various magnetic field emission sources to substantially cancel each other out as function of the code used to design the structures. Similarly, when a magnetic field emission structure is brought into alignment with a duplicate magnetic field emission structure the various magnetic field emission sources all align causing a peak spatial repelling force to be produced whereby misalignment of the magnetic field emission structures causes the various magnetic field emission sources to substantially cancel each other out. As such, spatial forces are produced in accordance with the relative alignment of the field emission structures and a spatial force function. As described herein, these spatial force functions can be used to achieve precision alignment and precision positioning. Moreover, these spatial force functions enable the precise control of magnetic fields and associated spatial forces thereby enabling new forms of attachment devices for attaching objects with precise alignment and new systems and methods for controlling precision movement of objects. Generally, a spatial force has a magnitude that is a function of the relative alignment of two magnetic field emission structures and their corresponding spatial force (or correlation) function, the spacing (or distance) between the two magnetic field emission structures, and the magnetic field strengths and polarities of the sources making up the two magnetic field emission structures.

The characteristic of the present invention whereby the various magnetic field sources making up two magnetic field emission structures can effectively cancel out each other when they are brought out of alignment can be described as a release force (or a release mechanism). This release force or release mechanism is a direct result of the correlation coding used to produce the magnetic field emission structures and, depending on the code employed, can be present regardless of whether the alignment of the magnetic field emission structures corresponds to a repelling force or an attraction force.

One skilled in the art of coding theory will recognize that there are many different types of codes having different correlation properties that have been used in communications for channelization purposes, energy spreading, modulation, and other purposes. Many of the basic characteristics of such codes make them applicable for use in producing the magnetic field emission structures described herein. For example, Barker codes are known for their autocorrelation properties. Although, Barker codes are used herein for exemplary purposes, other forms of codes well known in the art because of their autocorrelation, cross-correlation, or other properties are also applicable to the present invention including, for example, Gold codes, Kasami sequences, hyperbolic congruential codes, quadratic congruential codes, linear congruential codes, Welch-Costas array codes, Golomb-Costas array codes, pseudorandom codes, chaotic codes, and Optimal Golomb Ruler codes. Generally, any code can be employed.

The correlation principles of the present invention may or may not require overcoming normal 'magnet orientation' behavior using a holding mechanism. For example, magnets of the same magnetic field emission structure can be sparsely separated from other magnets (e.g., in a sparse array) such that the magnetic forces of the individual magnets do not substantially interact, in which case the polarity of individual magnets can be varied in accordance with a code without requiring a substantial holding force to prevent magnetic forces from 'flipping' a magnet. Magnets that are close enough such that their magnetic forces substantially interact such that their magnetic forces would normally cause one of them to 'flip' so that their moment vectors align can be made to remain in a desired orientation by use of a holding mechanism such as an adhesive, a screw, a bolt & nut, etc.

Figure 5:
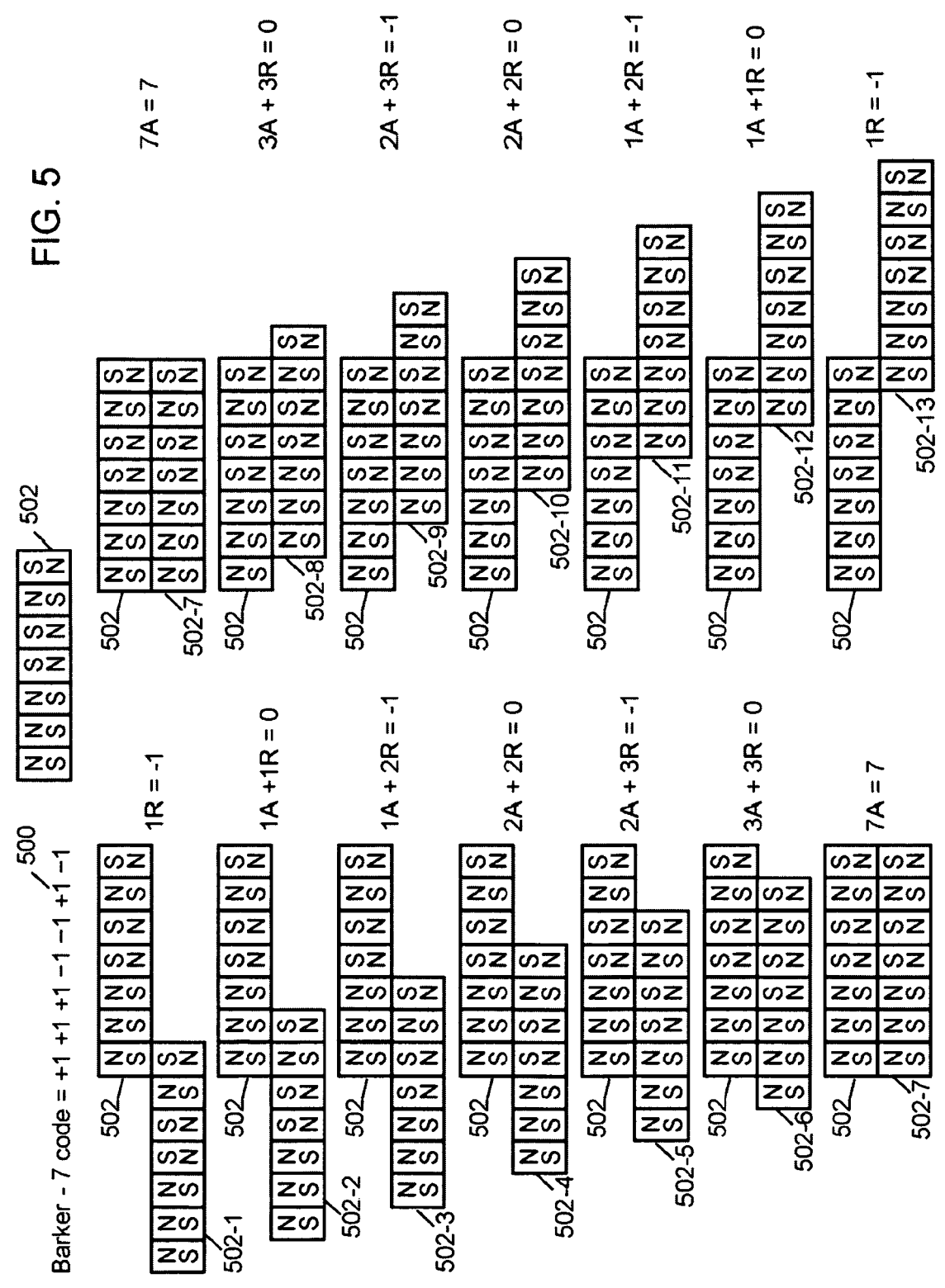

FIG. 5 depicts a Barker length 7 code used to determine polarities and positions of magnets making up a magnetic field emission structure. Referring to FIG. 5, a Barker length 7 code 500 is used to determine the polarities and the positions of magnets making up a first magnetic field emission structure 502. Each magnet has the same or substantially the same magnetic field strength (or amplitude), which for the sake of this example is provided a unit of 1 (where A=Attract, R=Repel, A=−R, A=1, R=−1). A second magnetic field emission structure that is identical to the first is shown in 13 different alignments 502-1 through 502-13 relative to the first magnetic field emission structure 502. For each relative alignment, the number of magnets that repel plus the number of magnets that attract is calculated, where each alignment has a spatial force in accordance with a spatial force function based upon the correlation function and magnetic field strengths of the magnets. With the specific Barker code used, the spatial force varies from −1 to 7, where the peak occurs when the two magnetic field emission structures are aligned such that their respective codes are aligned. The off peak spatial force, referred to as a side lobe force, varies from 0 to −1. As such, the spatial force function causes the magnetic field emission structures to generally repel each other unless they are aligned such that each of their magnets is correlated with a complementary magnet (i.e., a magnet's South pole aligns with another magnet's North pole, or vice versa). In other words, the two magnetic field emission structures substantially correlate when they are aligned such that they substantially mirror each other.

Figure 6:
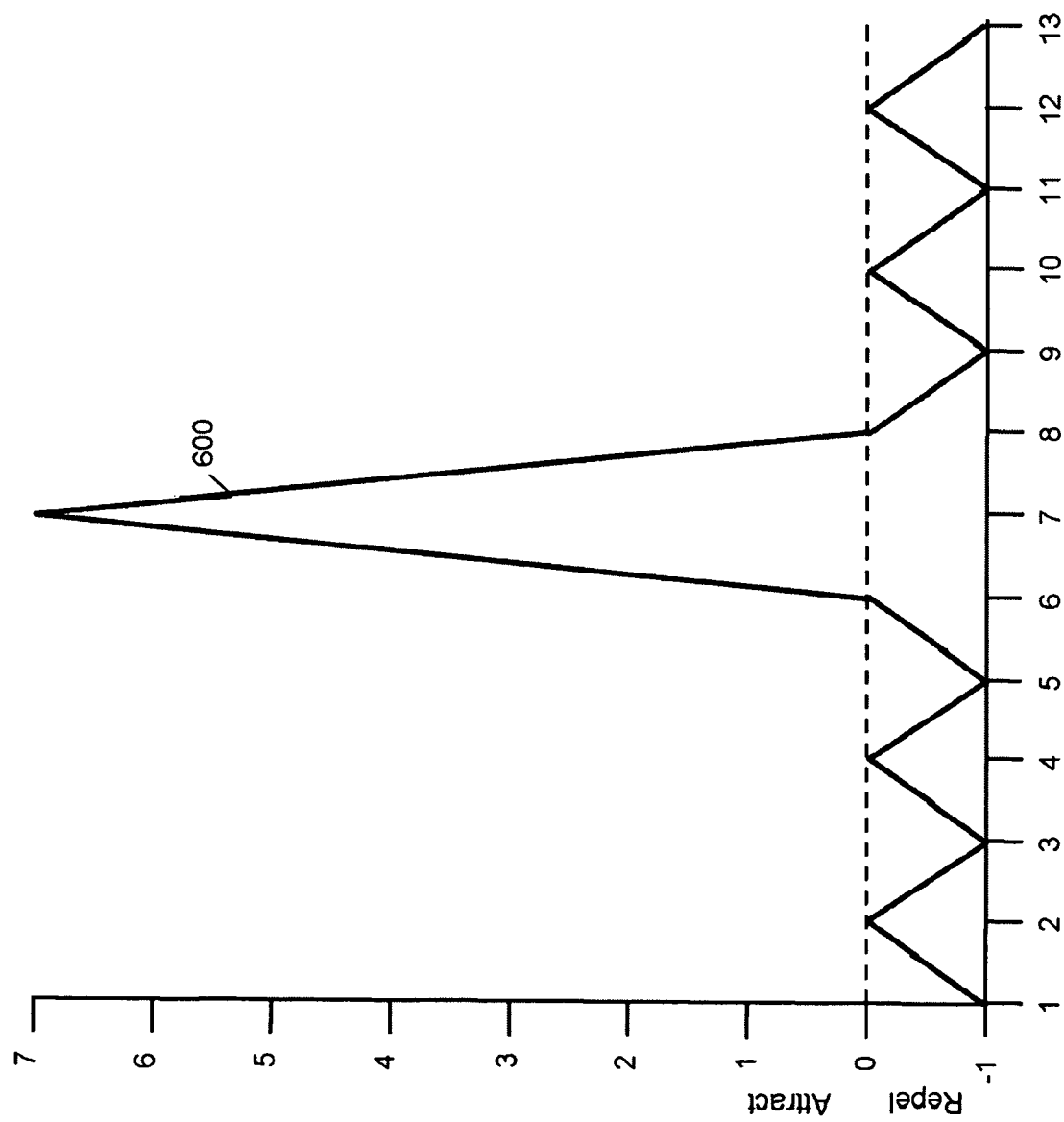
FIG. 6 depicts the binary autocorrelation function of a Barker-7 code.
Figure 11B:
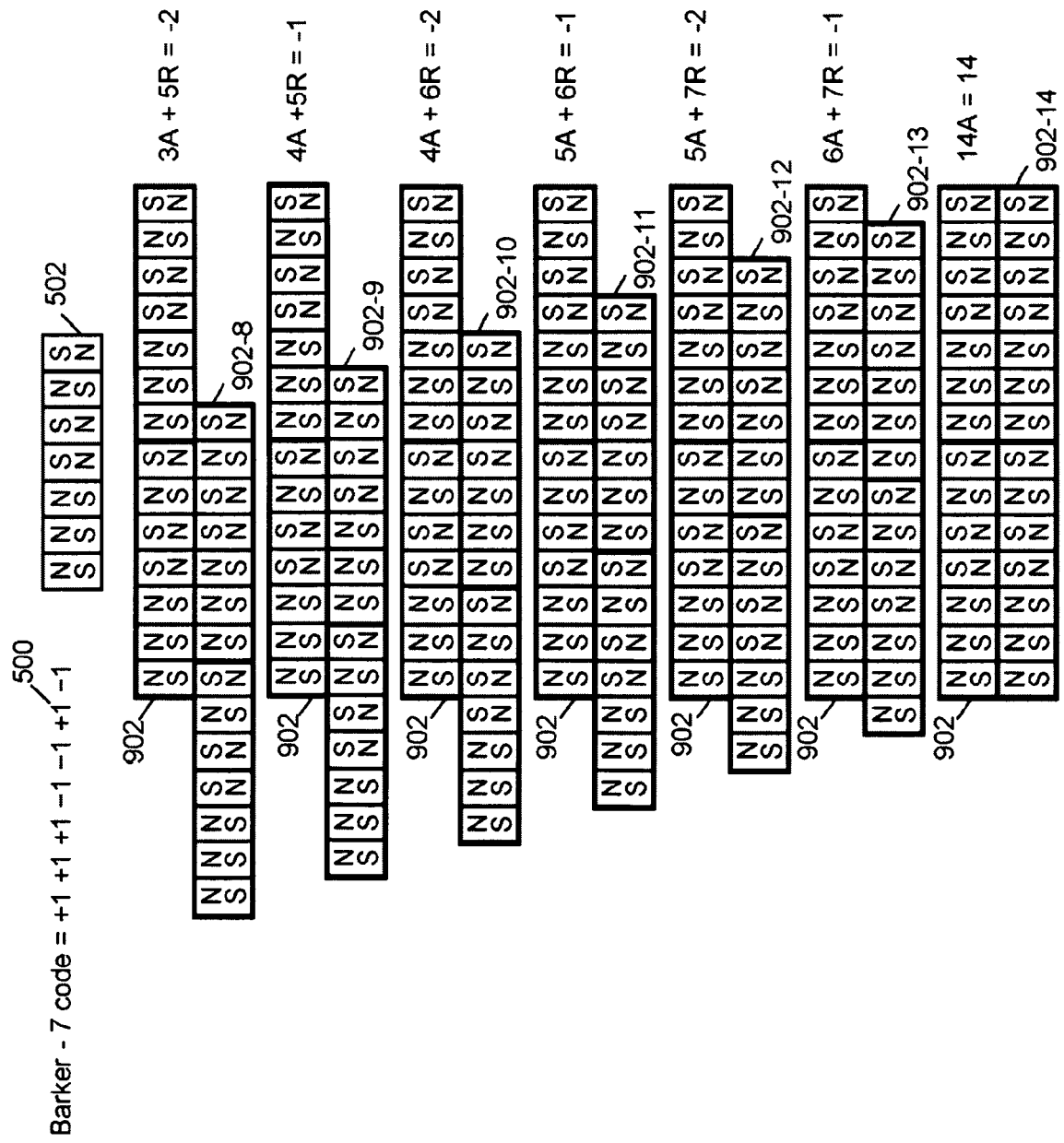
Figure 11D:
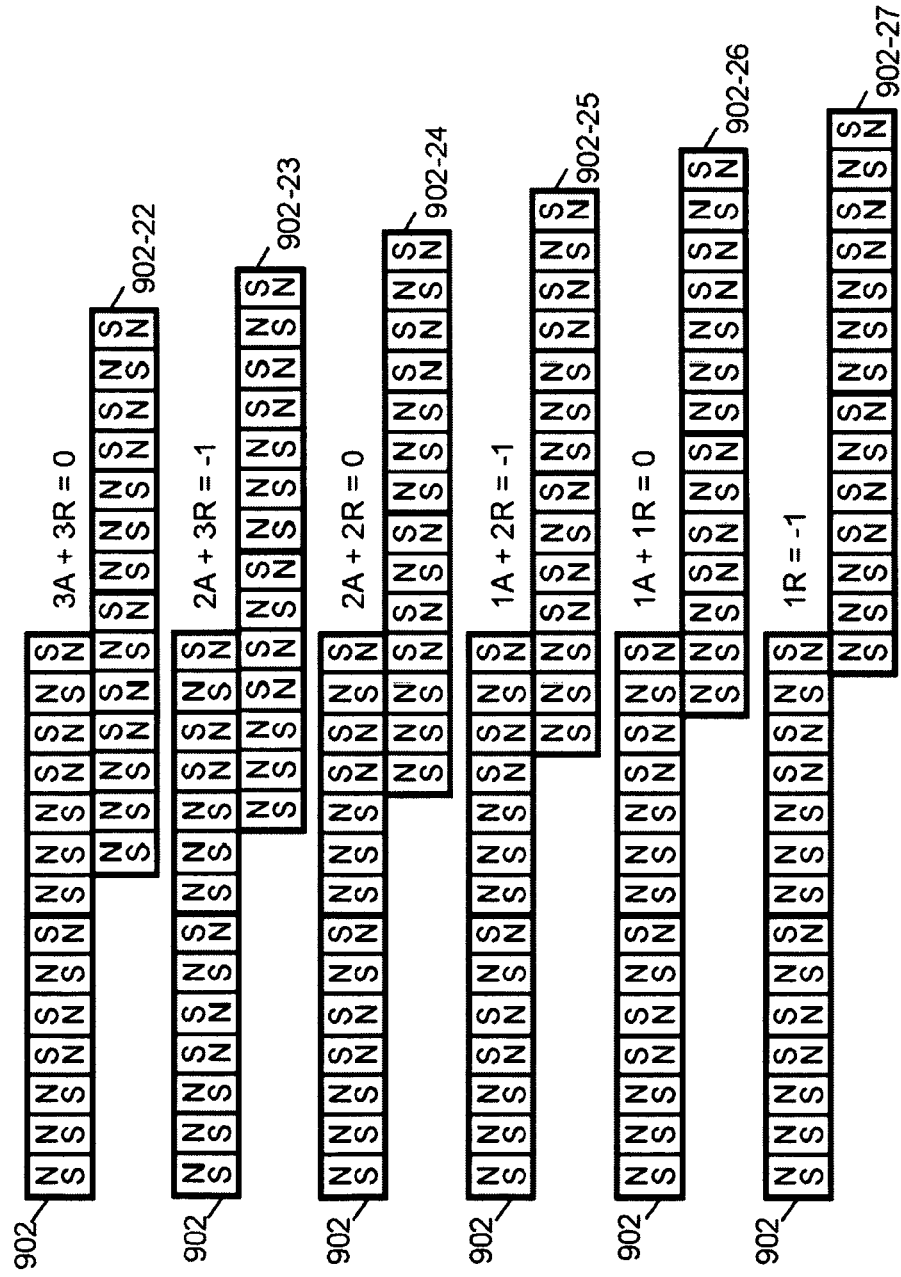

FIG. 6 depicts the binary autocorrelation function 600 of the Barker-7 code, where the values at each alignment position 1 through 13 correspond to the spatial force values calculated for the thirteen alignment positions shown in FIG. 5.

As such, since the magnets making up the magnetic field emission structures of FIG. 5 have the same magnetic field strengths, FIG. 6 also depicts the spatial force function of the two magnetic field emission structures of FIG. 5. As the true autocorrelation function for correlated magnet field structures is repulsive, and most of the uses envisioned will have attractive correlation peaks, the usage of the term 'autocorrelation' herein will refer to complementary correlation unless otherwise stated. That is, the interacting faces of two such correlated magnetic field emission structures will be complementary to (i.e., mirror images of) each other. This complementary autocorrelation relationship can be seen in FIG. 5 where the bottom face of the first magnetic field emission structure 502 having the pattern 'S S S N N S N' is shown interacting with the top face of the second magnetic field emission structures 502-1 through 502-13 each having the pattern 'N N N S S N S', which is the mirror image (pattern) of the bottom face of the first magnetic field emission structure 502.

FIG. 7 depicts a Barker length 7 code 500 used to determine polarities and positions of magnets making up a first magnetic field emission structure 502. Each magnet has the same or substantially the same magnetic field strength (or amplitude), which for the sake of this example is provided a unit of 1 (A=−R, A=1, R=−1), with the exception of two magnets indicated with bolded N and S that have twice the magnetic strength as the other magnets. As such, a bolded magnet and non-bolded magnet represent 1.5 times the strength as two non-bolded magnets and two bolded magnets represent twice the strength of two non-bolded magnets. A second magnetic field emission structure that is identical to the first is shown in 13 different alignments 502-1 through 502-13 relative to the first magnetic field emission structure. For each relative alignment, the number of magnets that repel plus the number of magnets that attract is calculated, where each alignment has a spatial force in accordance with a spatial force function based upon the correlation function and the magnetic field strengths of the magnets. With the specific Barker code used, the spatial force varies from −2.5 to 9, where the peak occurs when the two magnetic field emission structures are aligned such that their respective codes are aligned. The off peak spatial force, referred to as the side lobe force, varies from 0.5 to −2.5. As such, the spatial force function causes the structures to have minor repel and attract forces until about two-thirds aligned when there is a fairly strong repel force that weakens just before they are aligned. When the structures are substantially aligned their codes align and they strongly attract as if the magnets in the structures were not coded.

FIG. 8 depicts an exemplary spatial force function 800 of the two magnetic field emission structures of FIG. 7.

FIG. 9 depicts a code wrapping example of a Barker length 7 code 500 used to determine the polarities and the positions of magnets making up a first magnetic field emission structure 502. Each magnet has the same or substantially the same magnetic field strength (or amplitude), which for the sake of this example will be provided a unit of 1 (A=−R, A=1, R=−1). A second magnetic field emission structure 902 that corresponds to repeating code modulos of the first magnetic field emission structure is shown in 13 different alignments 902-1 through 902-13 relative to the first magnetic field emission structure 502 such that the first magnetic structure is in contact with the repeating second magnetic field emission structure. For each relative alignment, the number of magnets that repel plus the number of magnets that attract is calculated, where each alignment has a spatial force in accordance with a spatial force function based upon the correlation function and the magnetic field strengths of the magnets. With the specific Barker code used, the spatial force varies from −1 to 7, where the peak occurs when the two magnetic field emission structures are aligned such that their respective codes are aligned. The off peak spatial force, referred to as side lobe force, is −1. As such, the spatial force function causes the structures to generally repel each other unless they are substantially aligned when they will attract as if the magnets in the structures were not coded.

FIG. 10 depicts an exemplary spatial force function 1000 of the two magnetic field emission structures of FIG. 9 where the second magnetic field emission structure repeats. As such, there is a peak spatial force that repeats every seven alignment shifts.

FIGS. 11a through 11d depict 27 different alignments 902-1 through 902-27 of two magnetic field emission structures 902 where a Barker code of length 7 is used to determine the polarities and the positions of magnets making up a first magnetic field emission structure 902, which corresponds to two modulos of the Barker length 7 code end-to-end. Each magnet has the same or substantially the same magnetic field strength (or amplitude), which for the sake of this example is provided a unit of 1 (A=−R, A=1, R=−1). A second magnetic field emission structure that is identical to the first is shown in 27 different alignments 902-1 through 902-27 relative to the first magnetic field emission structure. For each relative alignment, the number of magnets that repel plus the number of magnets that attract is calculated, where each alignment has a spatial force in accordance with a spatial force function based upon the correlation function and magnetic field strengths of the magnets. With the specific Barker code used, the spatial force varies from −2 to 14, where the peak occurs when the two magnetic field emission structures are aligned such that their respective codes are aligned. Two secondary peaks occur when the structures are half aligned such that one of the successive codes of one structure aligns with one of the codes of the second structure. The off peak spatial force, referred to as the side lobe force, varies from −1 to −2 between the peak and secondary peaks and between 0 and −1 outside the secondary peaks.

Figure 12:
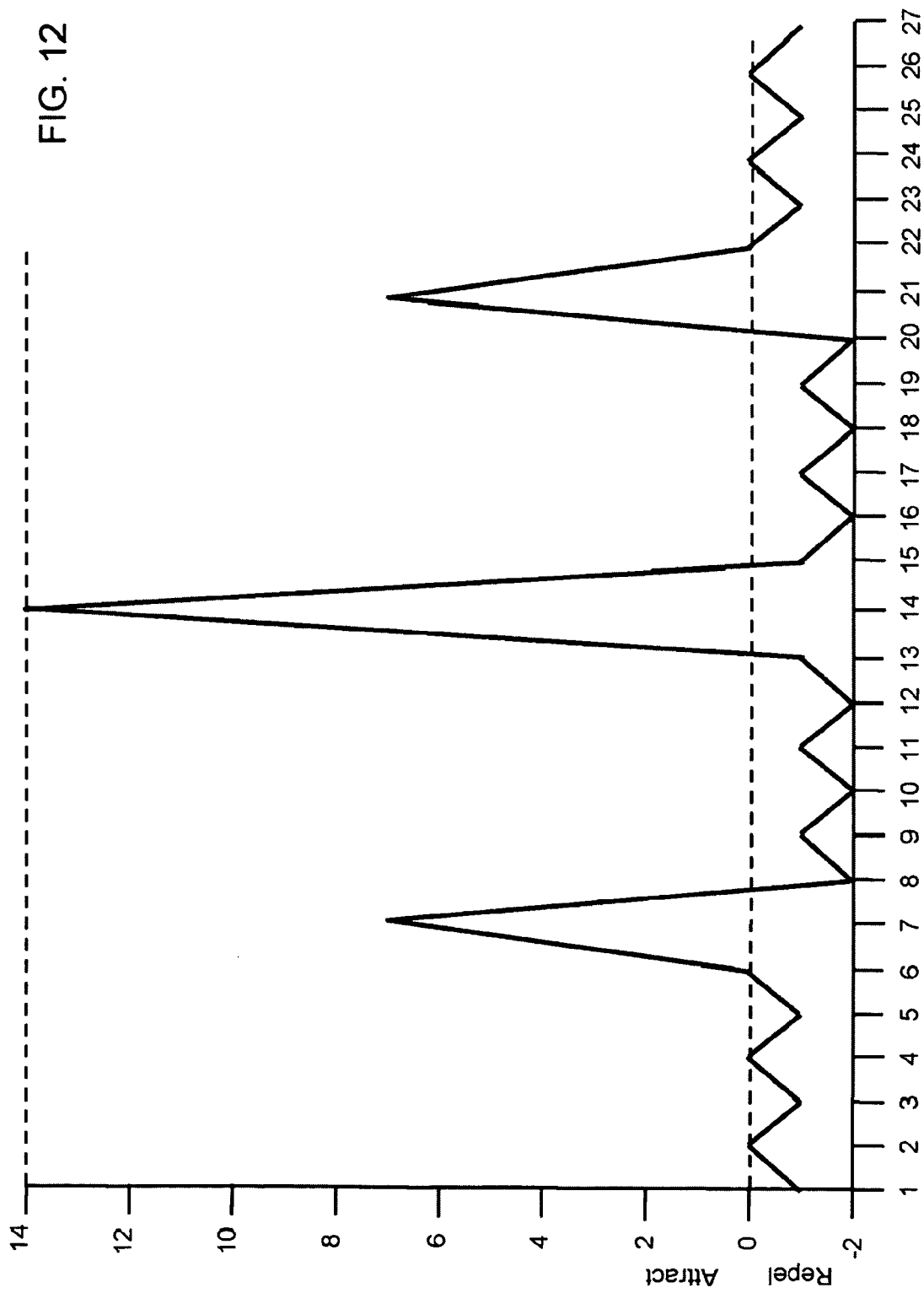
FIG. 12 depicts an exemplary spatial force function of the two magnetic field emission structures of FIGS. 11a through 11d.

FIG. 12 depicts an exemplary spatial force function of the two magnetic field emission structures of FIGS. 11a through 11d. Based on FIG. 5 and FIG. 10, FIG. 12 corresponds to the spatial functions in FIG. 5 and FIG. 10 added together.

Figure 13A:
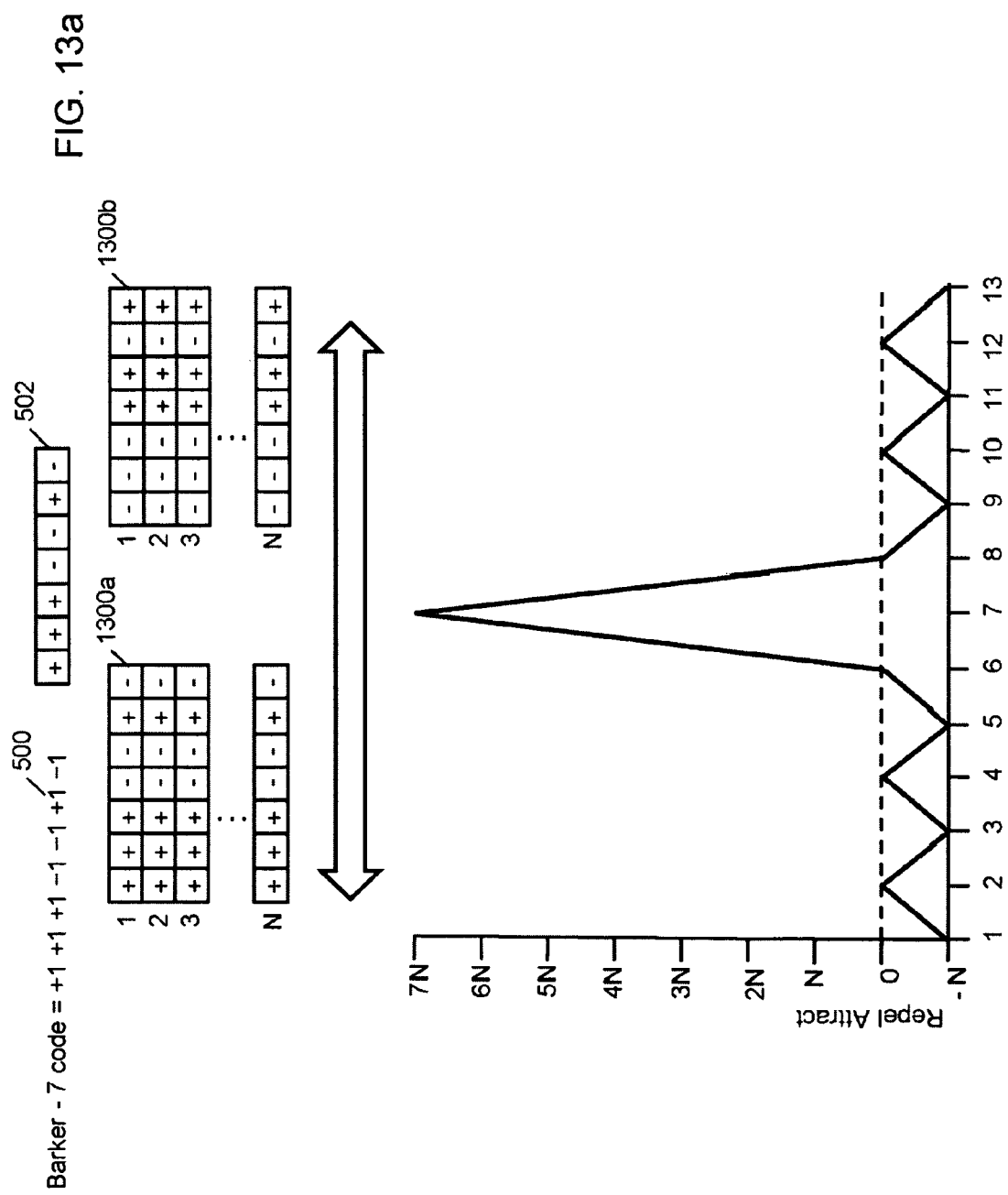
FIG. 13a depicts an exemplary spatial force function of magnetic field emission structures produced by repeating a one-dimensional code across a second dimension N times where movement is across the code.
Figure 13B:
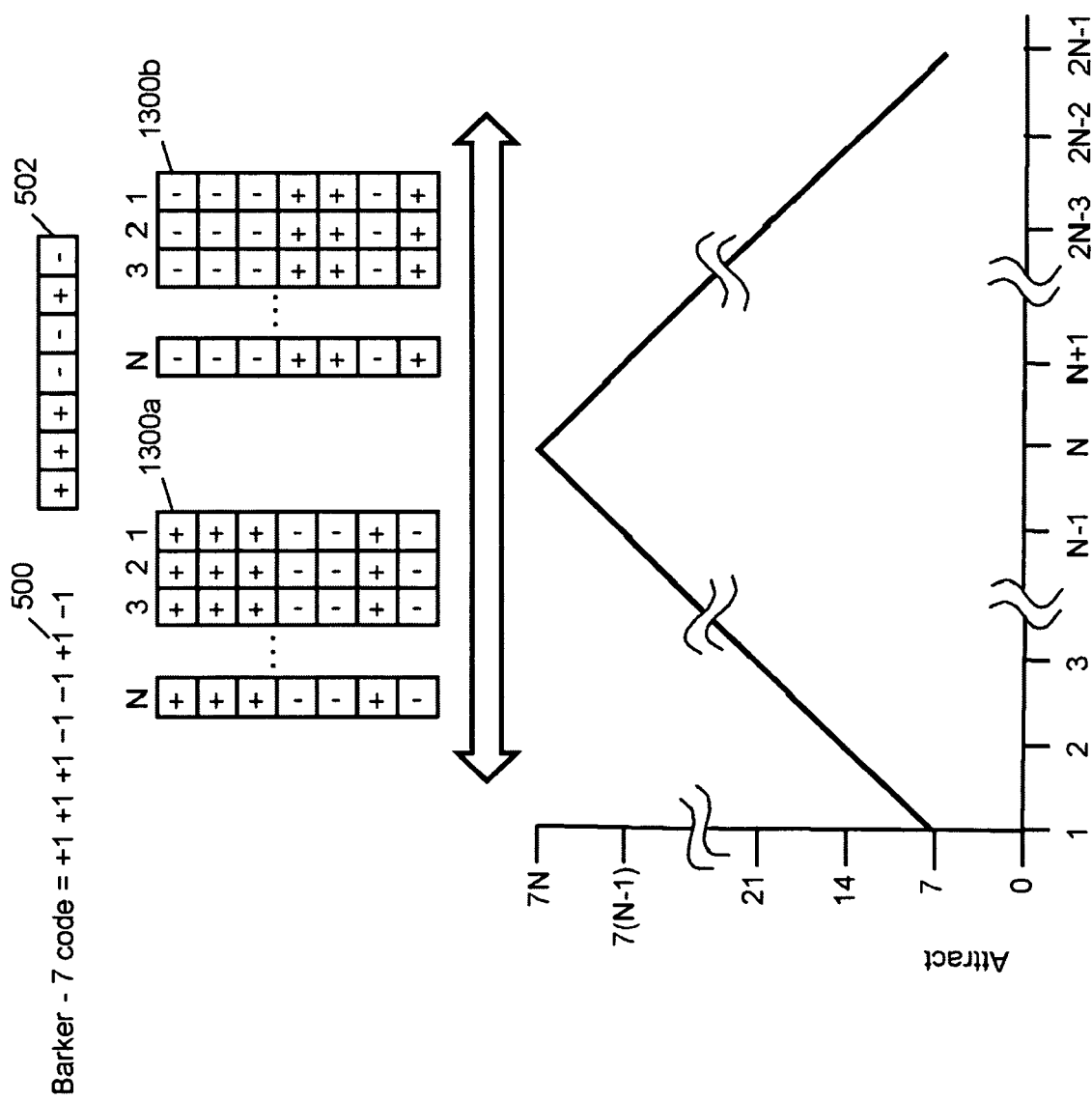
FIG. 13b depicts an exemplary spatial force function of magnetic field emission structures produced by repeating a one-dimensional code across a second dimension N times where movement, maintains alignment with up to all N coded rows of the structure and down to one.

FIG. 13a and FIG. 13b illustrate the spatial force functions of magnetic field emission structures produced by repeating a one-dimensional code across a second dimension N times (i.e., in rows each having same coding) where in FIG. 13a the movement is across the code (i.e., as in FIG. 5) or in FIG. 13b the movement maintains alignment with up to all N coded rows of the structure and down to one.

FIG. 14a depicts a two dimensional Barker-like code 1400 and a corresponding two-dimensional magnetic field emission structure 1402a. Referring to FIG. 14a, two dimensional Barker-like code 1400 is created by copying each row to a new row below, shifting the code in the new row to the left by one, and then wrapping the remainder to the right side. When applied to a two-dimensional field emission structure 1402a interesting rotation-dependent correlation characteristics are produced. Shown in FIG. 14a is a two-dimensional mirror image field emission structure 1402b, which is also shown rotated −90°, −180°, and −270° as 1402c-1402e, respectively. Autocorrelation cross-sections were calculated for the four rotations of the mirror image field emission structure 1402b-1402e moving across the magnetic field emission structure 1402a in the same direction 1404. Four corresponding numeric autocorrelation cross-sections 1406, 1408, 1410, and 1412, respectively, are shown. As indicated, when the mirror image is passed across the magnetic field emission structure 1402a each column has a net 1R (or −1) spatial force and as additional columns overlap, the net spatial forces add up until the entire structure aligns (+49) and then the repel force decreases as less and less columns overlap. With −90° and −270° degree rotations, there is symmetry but erratic correlation behavior. With −180° degrees rotation, symmetry is lost and correlation fluctuations are dramatic. The fluctuations can be attributed to directionality characteristics of the shift left and wrap approach used to generate the structure 1402a, which caused upper right to lower left diagonals to be produced which when the mirror image was rotated −180°, these diagonals lined up with the rotated mirror image diagonals.

Figure 14B:
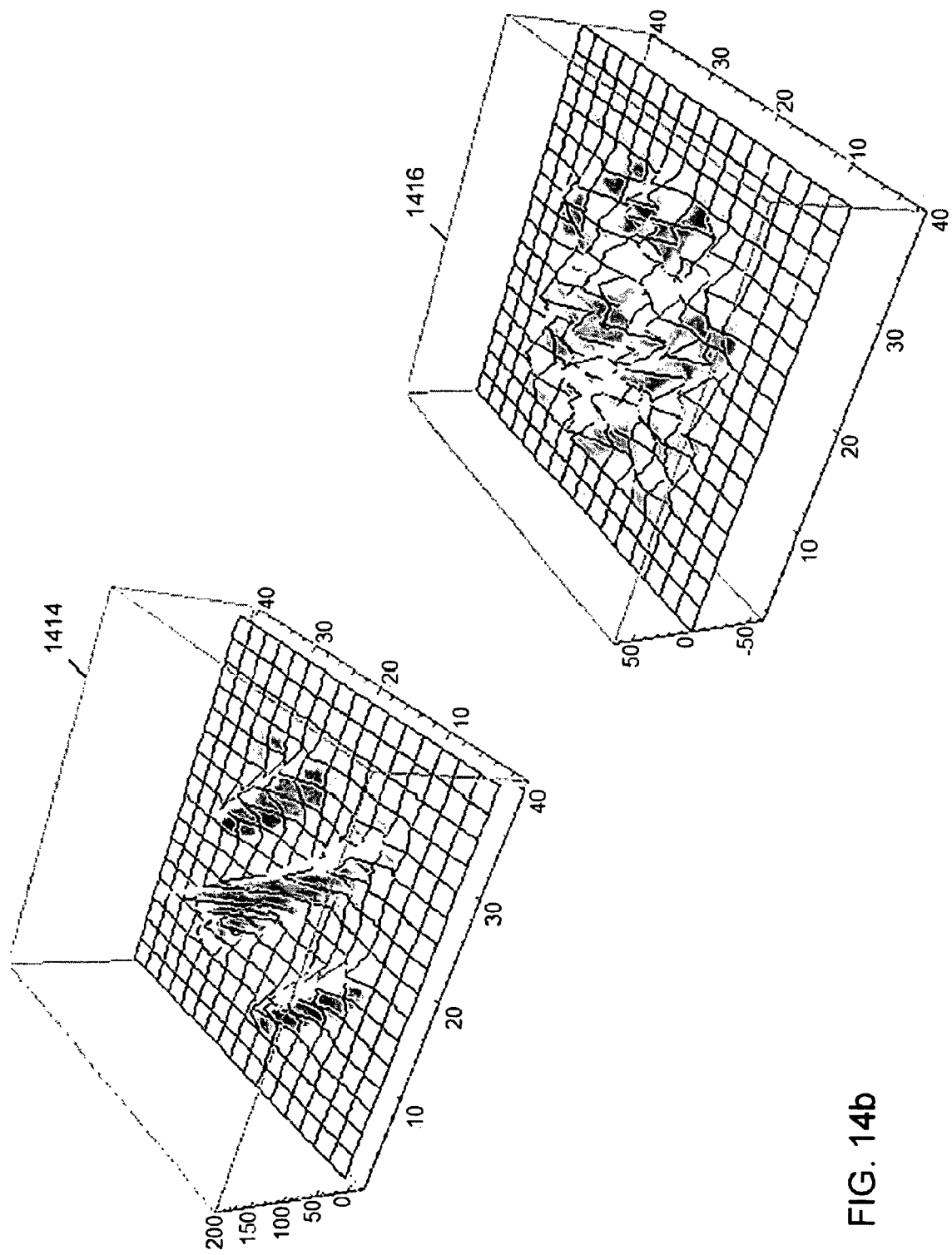
FIG. 14b depicts exemplary spatial force functions resulting from mirror image magnetic field emission structure and −90° rotated mirror image magnetic field emission structure moving across a magnetic field emission structure.

FIG. 14b depicts exemplary spatial force functions resulting from a mirror image magnetic field emission structure and a mirror image magnetic field emission structure rotated −90° moving across the magnetic field emission structure. Referring to FIG. 14b, spatial force function 1414 results from the mirror image magnetic field emission structure 1402b moving across the magnetic field emission structure 1402a in a direction 1404 and spatial force function 1416 results from the mirror image magnetic field emission structure rotated −90° 1402c moving across magnetic field emission structure 1402a in the same direction 1404. Characteristics of the spatial force function depicted in FIG. 12 may be consistent with a diagonal cross-section from 0,0 to 40,40 of spatial force function 1414 and at offsets parallel to that diagonal. Additionally, characteristics of the spatial force function depicted in FIG. 13b may be consistent with a diagonal from 40,0 to 0,40 of spatial force function 1414.

Figure 14C:
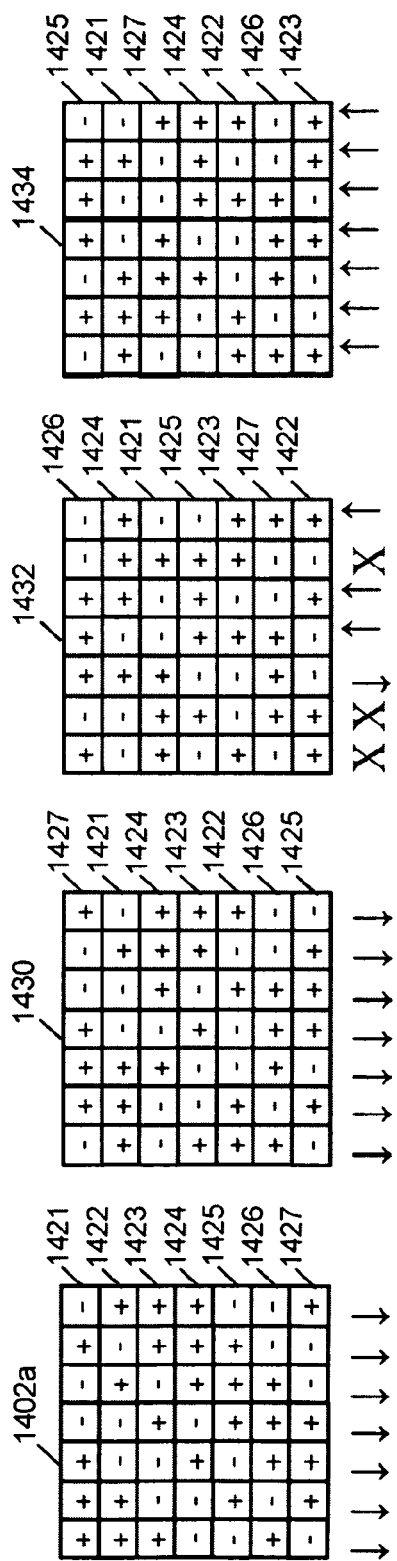
FIG. 14c depicts variations of a magnetic field emission structure where rows are reordered randomly in an attempt to affect its directionality characteristics.

FIG. 14c depicts variations of magnetic field emission structure 1402a where rows are reordered randomly in an attempt to affect its directionality characteristics. As shown, the rows of 1402a are numbered from top to bottom 1421 through 1427. A second magnetic field emission structure 1430 is produced by reordering the rows to 1427, 1421, 1424, 1423, 1422, 1426, and 1425. When viewing the seven columns produced, each follows the Barker 7 code pattern wrapping downward. A third magnetic field emission structure 1432 is produced by reordering the rows to 1426, 1424, 1421, 1425, 1423, 1427, and 1422. When viewing the seven columns produced, the first, second, and sixth columns do not follow the Barker 7 code pattern while the third column follows the Barker 7 code pattern wrapping downward while the fourth, fifth and seven columns follow the Barker 7 code pattern wrapping upward. A fourth magnetic field emission structure 1434 is produced by reordering the rows 1425, 1421, 1427, 1424, 1422, 1426, and 1423. When viewing the seven columns produced, each follows the Barker 7 code pattern wrapping upward.

Figure 14D:
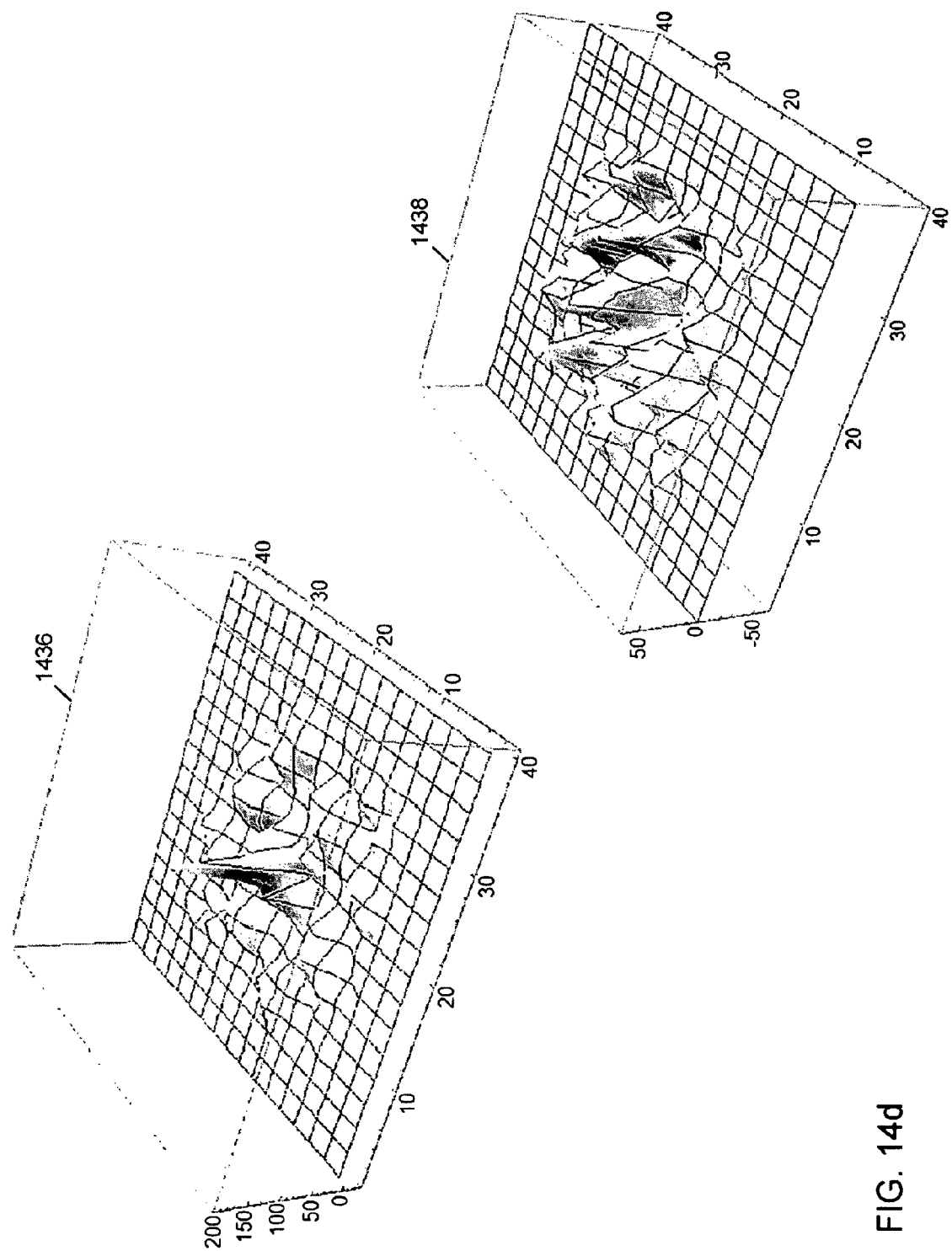
FIGS. 14d and 14e depict exemplary spatial force functions of selected magnetic field emission structures having randomly reordered rows moving across mirror image magnetic field emission structures both without rotation and as rotated −90, respectively.

FIG. 14d depicts a spatial force function 1436 resulting from the second magnetic field emission structure 1430 moving across its mirror image structure in one direction 1404 and a spatial force function 1438 resulting from the second magnetic field emission structure 1430 after being rotated −90° moving in the same direction 1404 across the mirror image of the second magnetic field emission structure 1430.

Figure 14E:
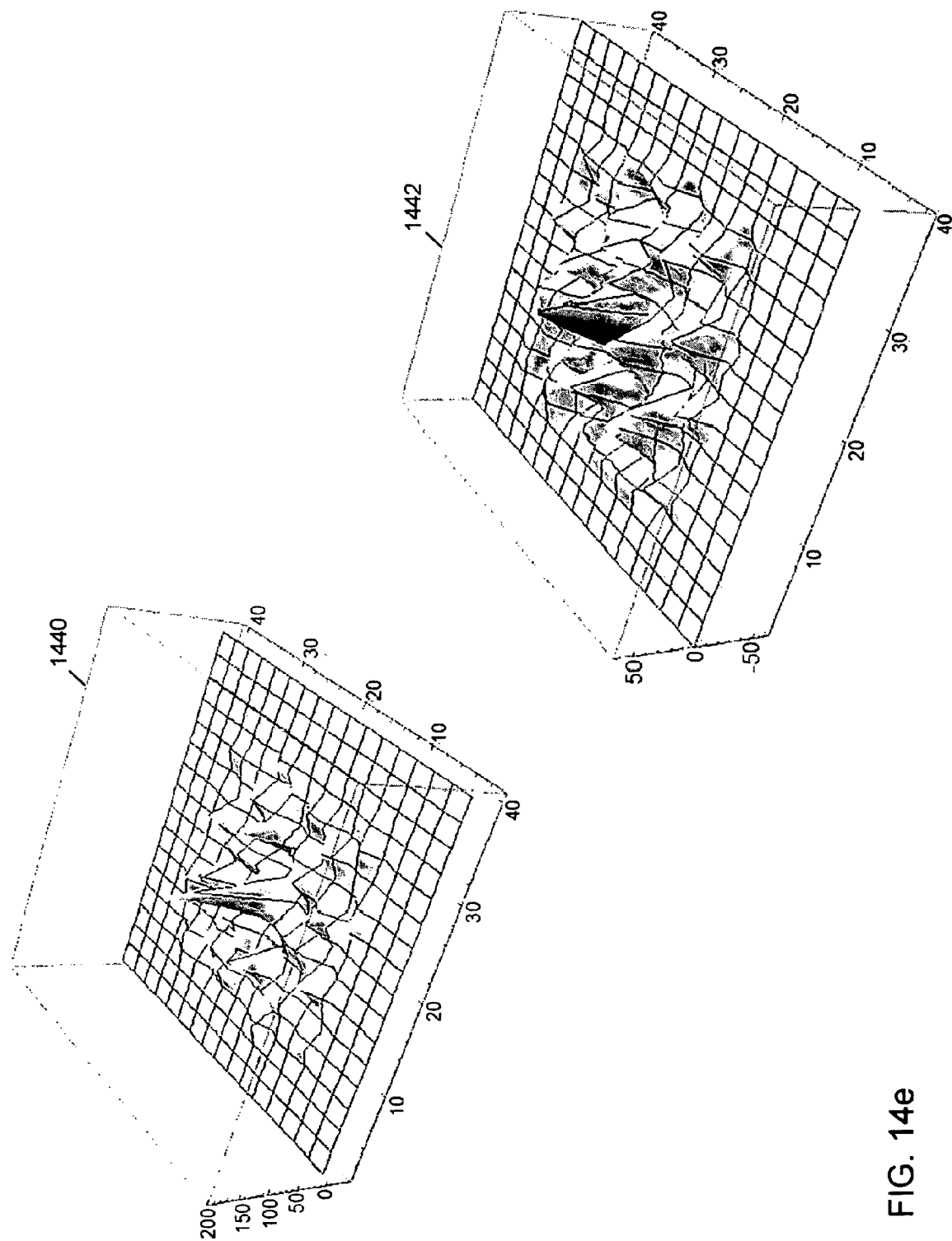

FIG. 14e depicts a spatial force function 1440 resulting from fourth magnetic field emission structure 1434 moving across its mirror image magnetic field emission structure in a direction 1404 and a spatial force function 1442 resulting from the fourth magnetic field emission structure 1434 being rotated −90° and moving in the same direction 1404 across its mirror image magnetic field emission structure.

Figure 15:
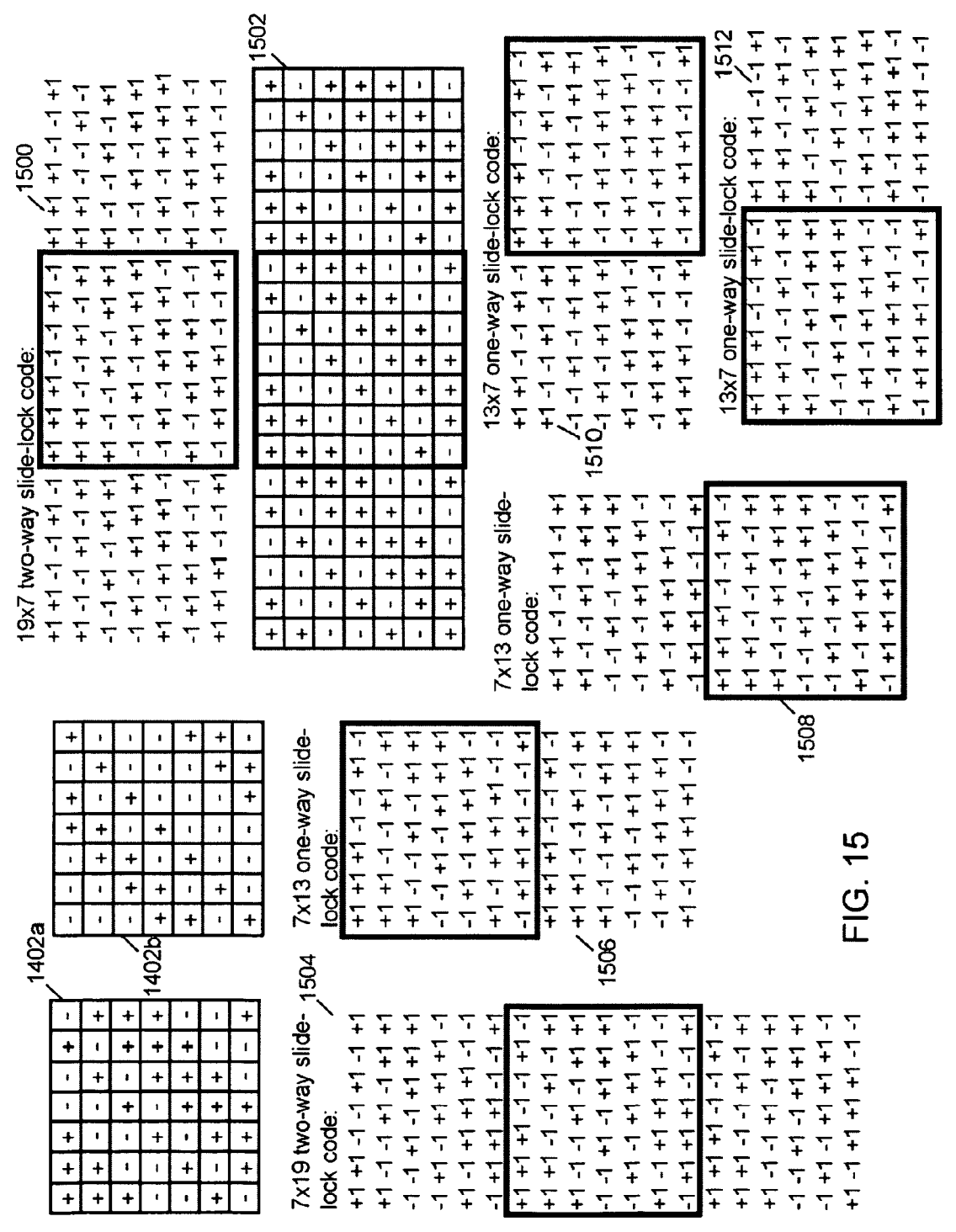

FIG. 15 depicts exemplary one-way slide lock codes and two-way slide lock codes. Referring to FIG. 15, a 19×7 two-way slide lock code 1500 is produced by starting with a copy of the 7×7 code 1402 and then by adding the leftmost 6 columns of the 7×7 code 1402*a* to the right of the code 1500 and the rightmost 6 columns of the 7×7 code to the left of the code 1550. As such, as the mirror image 1402*b* slides from side-to-side, all 49 magnets are in contact with the structure producing the autocorrelation curve of FIG. 10 from positions 1 to 13. Similarly, a 7×19 two-way slide lock code 1504 is produced by adding the bottommost 6 rows of the 7×7 code 1402*a* to the top of the code 1504 and the topmost 6 rows of the 7×7 code 140*a* to the bottom of the code 1504. The two structures 1500 and 1504 behave the same where as a magnetic field emission structure 1402*a* is slid from side to side it will lock in the center with +49 while at any other point off center it will be repelled with a force of −7. Similarly, one-way slide lock codes 1506, 1508, 1510, and 1512 are produced by adding six of seven rows or columns such that the code only partially repeats. Generally, various configurations (i.e., plus shapes, L shapes, Z shapes, donuts, crazy eight, etc.) can be created by continuing to add partial code modulos onto the structures provided in FIG. 15. As such, various types of locking mechanisms can be designed.

Figure 16A:
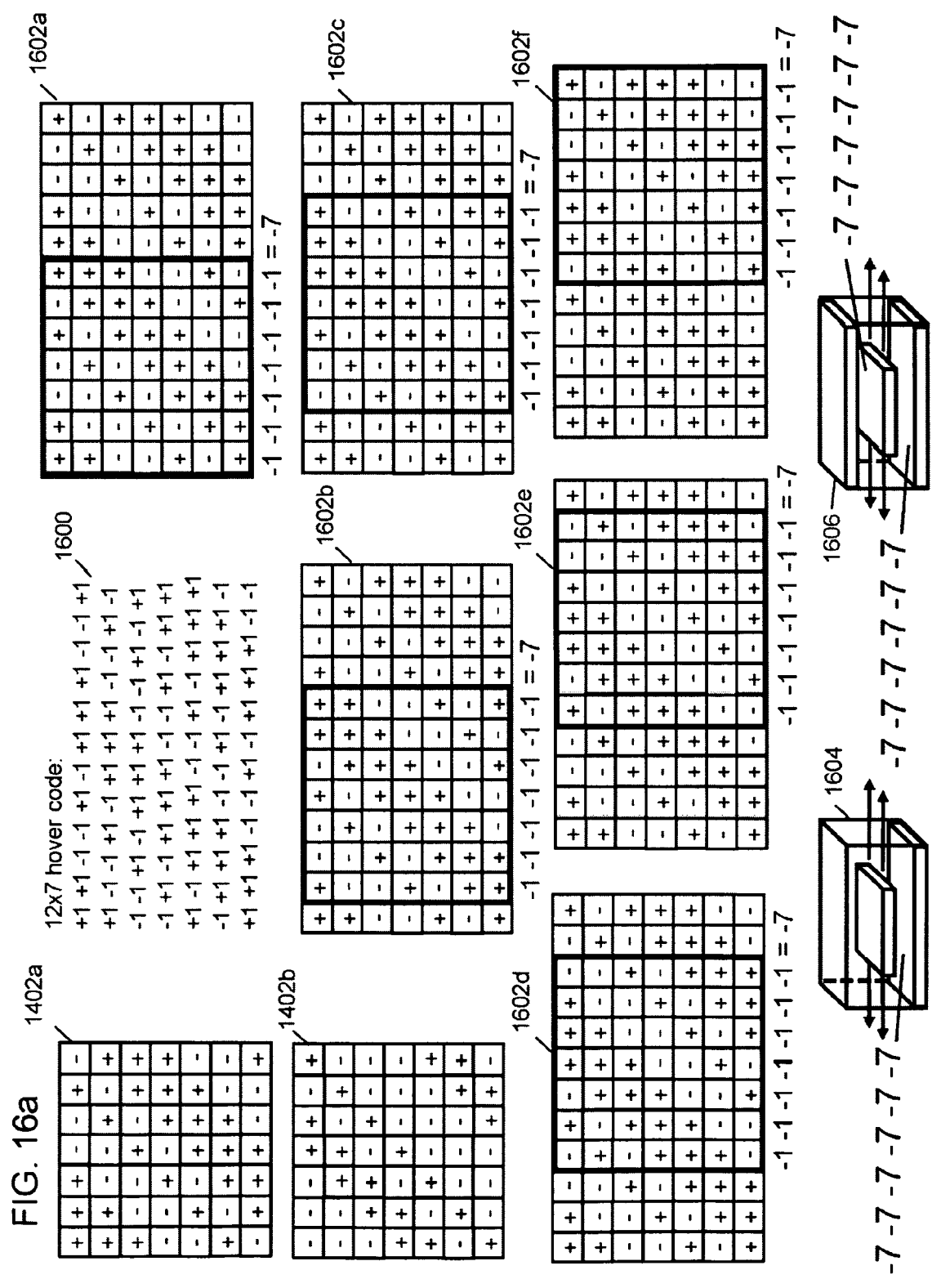

FIG. 16*a* depicts a hover code 1600 produced by placing two code modulos 1402*a* side-by-side and then removing the first and last columns of the resulting structure. As such, a mirror image 1402*b* can be moved across a resulting magnetic field emission structure from one side 1602*a* to the other side 1602*f* and at all times achieve a spatial force function of −7. Hover channel (or box) 1604 is shown where mirror image 1402*b* is hovering over a magnetic field emission structure produced in accordance with hover code 1600. With this approach, a mirror image 1402*b* can be raised or lowered by increasing or decreasing the magnetic field strength of the magnetic field emission structure below. Similarly, a hover channel 1606 is shown where a mirror image 1402 is hovering between two magnetic field emission structures produced in accordance with the hover code 1600. With this approach, the mirror image 1402*b* can be raised or lowered by increasing and decreasing the magnetic field strengths of the magnetic field emission structure below and the magnetic field emission structure above. As with the slide lock codes, various configurations can be created where partial code modulos are added to the structure shown to produce various movement areas above which the movement of a hovering object employing magnetic field emission structure 1402*b* can be controlled via control of the strength of the magnetic in the structure and/or using other forces.

FIG. 16*b* depicts a hover code 1608 produced by placing two code modulos 1402*a* one on top of the other and then removing the first and last rows. As such, mirror image 1402*b* can be moved across a resulting magnetic field emission structure from upper side 1610*a* to the bottom side 1610*f* and at all time achieve a spatial force function of −7.

Figure 16C:
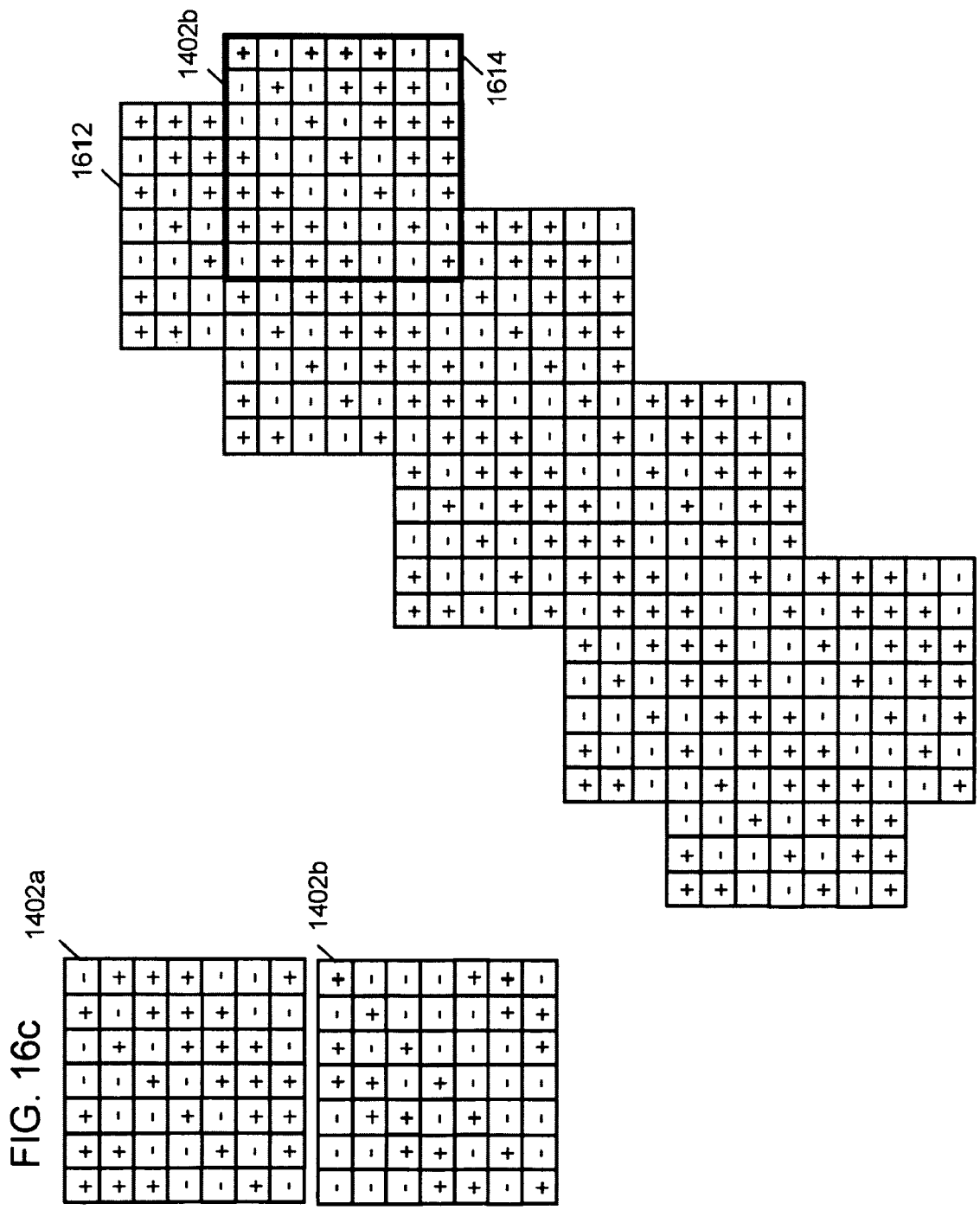
FIG. 16c depicts an exemplary magnetic field emission structure where a mirror image magnetic field emission structure corresponding to a 7×7 barker-like code will hover anywhere above the structure provided it does not rotate.

FIG. 16*c* depicts an exemplary magnetic field emission structure 1612 where a mirror image magnetic field emission structure 1402*b* of a 7×7 barker-like code will hover with a −7 (repel) force anywhere above the structure 1612 provided it is properly oriented (i.e., no rotation). Various sorts of such structures can be created using partial code modulos. Should one or more rows or columns of magnets have its magnetic strength increased (or decreased) then the magnetic field emission structure 1402*b* can be caused to move in a desired direction and at a desired velocity. For example, should the bolded column of magnets 1614 have magnetic strengths that are increased over the strengths of the rest of the magnets of the structure 1612, the magnetic field emission structure 1402*b* will be propelled to the left. As the magnetic field emission structure moves to the left, successive columns to the right might be provided the same magnetic strengths as column 1614 such that the magnetic field emission structure is repeatedly moved leftward. When the structure 1402*b* reaches the left side of the structure 1612 the magnets along the portion of the row beneath the top of structure 1402*b* could then have their magnetic strengths increased causing structure 1402*b* to be moved downward. As such, various modifications to the strength of magnets in the structure can be varied to effect movement of structure 1402*b*. Referring again to FIGS. 16*a* and 16*b*, one skilled in the art would recognize that the slide-lock codes could be similarly implemented so that when structure 1402*b* is slid further and further away from the alignment location (shown by the dark square), the magnetic strength of each row (or column) would become more and more increased. As such, structure 1402*b* could be slowly or quickly repelled back into its lock location. For example, a drawer using the slide-lock code with varied magnetic field strengths for rows (or columns) outside the alignment location could cause the drawer to slowly close until it locked in place. Variations of magnetic field strengths can also be implemented per magnet and do not require all magnets in a row (or column) to have the same strength.

Figures 17A, 17B:
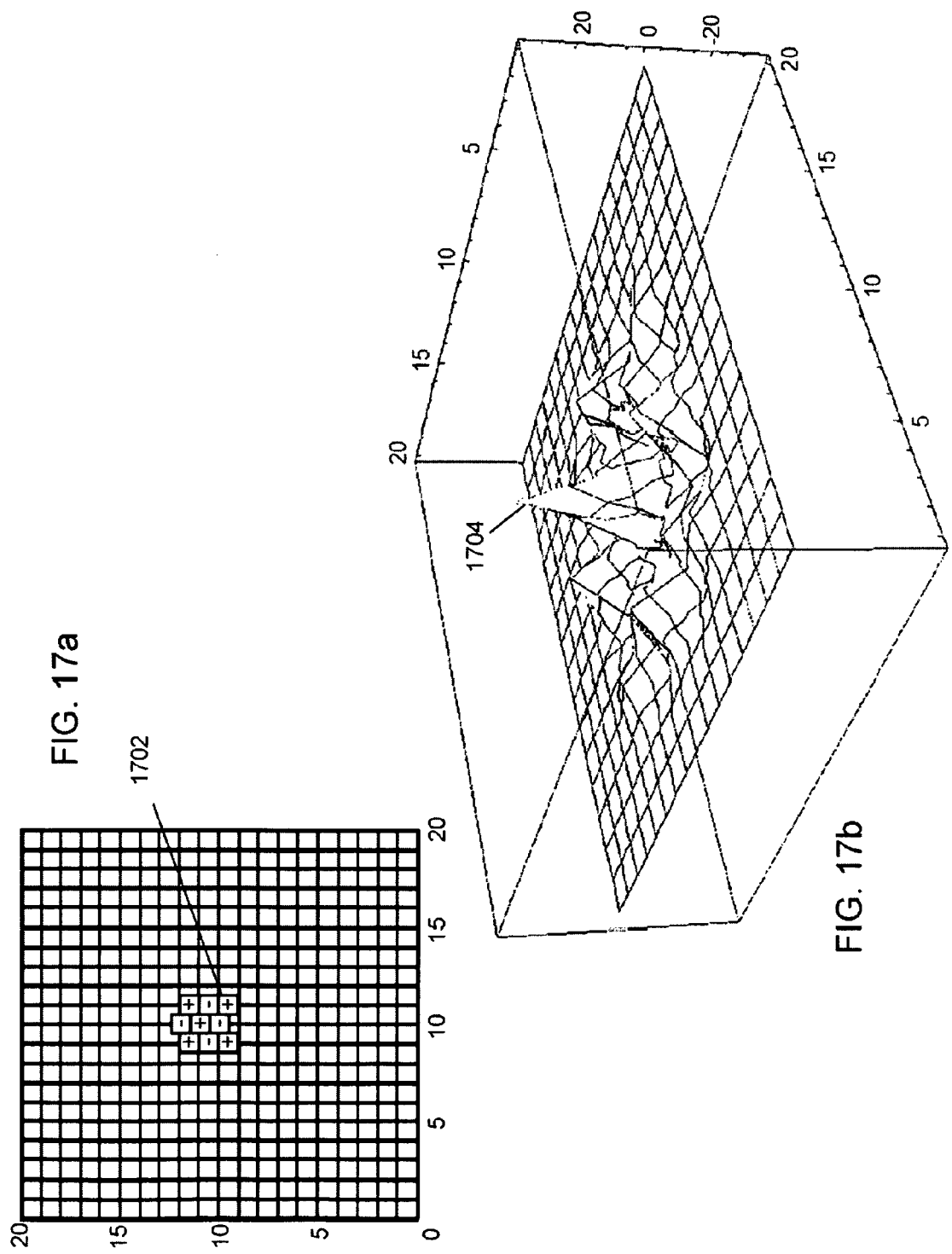
FIG. 17a depicts an exemplary magnetic field emission structure comprising nine magnets positioned such that they half overlap in one direction.
FIG. 17b depicts the spatial force function of the magnetic field emission structure of FIG. 17a interacting with its mirror image magnetic field emission structure.

FIG. 17*a* depicts a magnetic field emission structure 1702 comprising nine magnets positioned such that they half overlap in one direction. The structure is designed to have a peak spatial force when (substantially) aligned and have relatively minor side lobe strength at any rotation off alignment.

FIG. 17*b* depicts the spatial force function 1704 of a magnetic field emission structure 1702 interacting with its mirror image magnetic field emission structure. The peak occurs when substantially aligned.

Figures 18A, 18B, 18C:
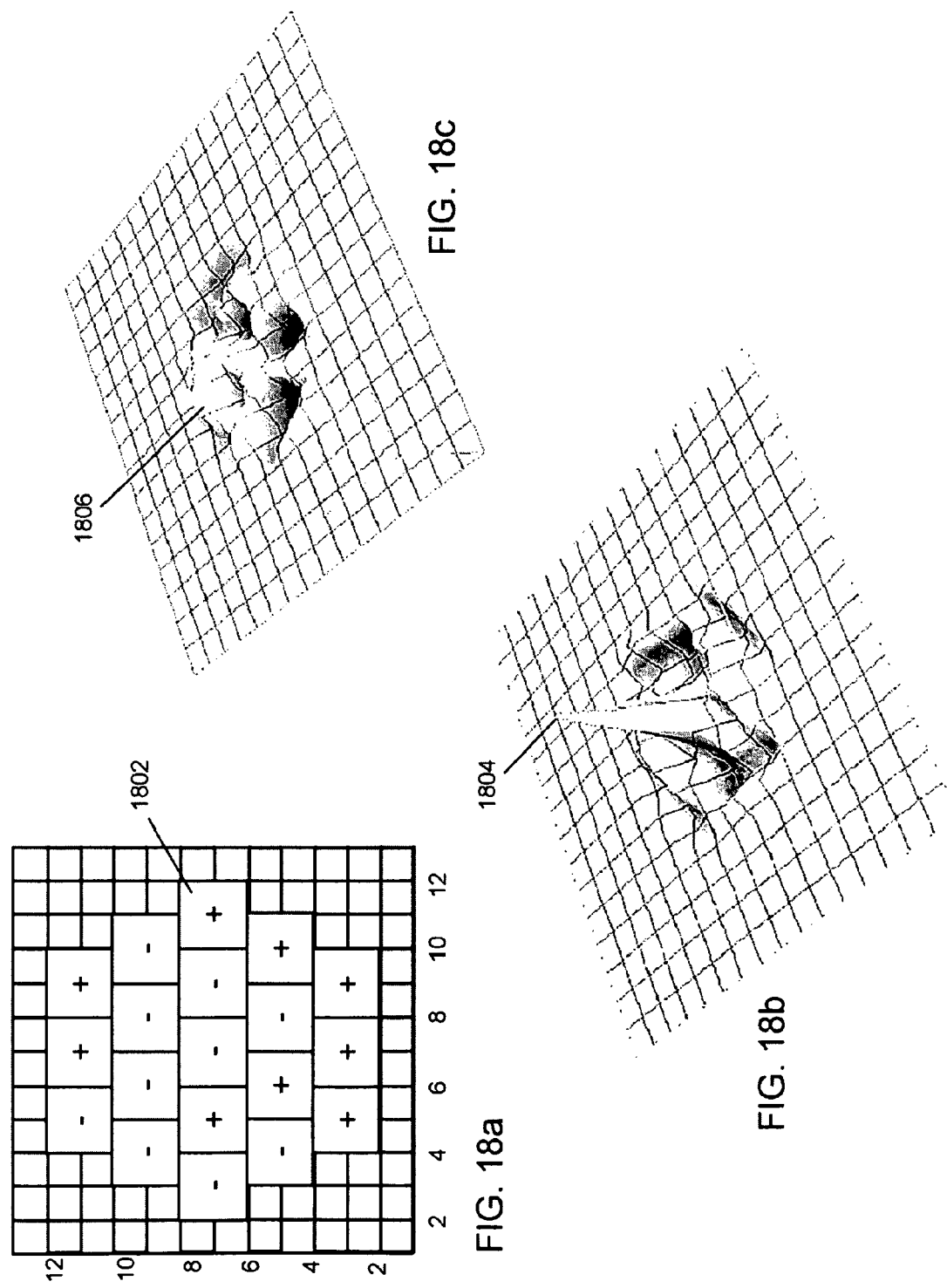
FIG. 18a depicts an exemplary code intended to produce a magnetic field emission structure having a first stronger lock when aligned with its mirror image magnetic field emission structure and a second weaker lock when rotated 90° relative to its mirror image magnetic field emission structure.
FIG. 18b depicts an exemplary spatial force function of the exemplary magnetic field emission structure of FIG. 18a interacting with its mirror magnetic field emission structure.
FIG. 18c depicts an exemplary spatial force function of the exemplary magnetic field emission structure of FIG. 18a interacting with its mirror magnetic field emission structure after being rotated 90°.

FIG. 18*a* depicts an exemplary code 1802 intended to produce a magnetic field emission structure having a first stronger lock when aligned with its mirror image magnetic field emission structure and a second weaker lock when rotated 90° relative to its mirror image magnetic field emission structure.

FIG. 18*b* depicts spatial force function 1804 of a magnetic field emission structure 1802 interacting with its mirror image magnetic field emission structure. The peak occurs when substantially aligned.

FIG. 18*c* depicts the spatial force function 1804 of magnetic field emission structure 1802 interacting with its mirror magnetic field emission structure after being rotated 90°. The peak occurs when substantially aligned but one structure rotated 90°.

FIGS. 19*a*-19*i* depict the exemplary magnetic field emission structure 1802*a* and its mirror image magnetic field emission structure 1802*b* and the resulting spatial forces produced in accordance with their various alignments as they are twisted relative to each other. In FIG. 19*a*, the magnetic field emission structure 1802*a* and the mirror image magnetic field emission structure 1802*b* are aligned producing a peak spatial force. In FIG. 19*b*, the mirror image magnetic field emission structure 1802*b* is rotated clockwise slightly relative to the magnetic field emission structure 1802*a* and the attractive force reduces significantly. In FIG. 19*c*, the mirror image magnetic field emission structure 1802*b* is further rotated and the attractive force continues to decrease. In FIG. 19*d*, the mirror image magnetic field emission structure 1802*b* is still further rotated until the attractive force becomes very small, such that the two magnetic field emission structures are easily separated as shown in FIG. 19*e*. Given the two magnetic field emission structures held somewhat apart as in FIG. 19*e*, the structures can be moved closer and rotated towards alignment producing a small spatial force as in FIG. 19*f*. The spatial force increases as the two structures become more and more aligned in FIGS. 19g and 19h and a peak spatial force is achieved when aligned as in FIG. 19i. It should be noted that the direction of rotation was arbitrarily chosen and may be varied depending on the code employed. Additionally, the mirror image magnetic field emission structure 1802b is the mirror of magnetic field emission structure 1802a resulting in an attractive peak spatial force. The mirror image magnetic field emission structure 1802b could alternatively be coded such that when aligned with the magnetic field emission structure 1802a the peak spatial force would be a repelling force in which case the directions of the arrows used to indicate amplitude of the spatial force corresponding to the different alignments would be reversed such that the arrows faced away from each other.

FIG. 20a depicts two magnetic field emission structures 1802a and 1802b. One of the magnetic field emission structures 1802b includes a turning mechanism 2000 that includes a tool insertion slot 2002. Both magnetic field emission structures include alignment marks 2004 along an axis 2003. A latch mechanism such as the hinged latch clip 2005a and latch knob 2005b may also be included preventing movement (particularly turning) of the magnetic field emission structures once aligned. Under one arrangement, a pivot mechanism (not shown) could be used to connect the two structures 1802a, 1802b at a pivot point such as at pivot location marks 2004 thereby allowing the two structures to be moved into or out of alignment via a circular motion about the pivot point (e.g., about the axis 2003).

FIG. 20b depicts a first circular magnetic field emission structure housing 2006 and a second circular magnetic field emission structure housing 2008 configured such that the first housing 2006 can be inserted into the second housing 2008. The second housing 2008 is attached to an alternative turning mechanism 2010 that is connected to a swivel mechanism 2012 that would normally be attached to some other object. Also shown is a lever 2013 that can be used to provide turning leverage.

FIG. 20c depicts an exemplary tool assembly 2014 including a drill head assembly 2016. The drill head assembly 2016 comprises a first housing 2006 and a drill bit 2018. The tool assembly 2014 also includes a drill head turning assembly 2020 comprising a second housing 2008. The first housing 2006 includes raised guides 2022 that are configured to slide into guide slots 2024 of the second housing 2008. The second housing 2008 includes a first rotating shaft 2026 used to turn the drill head assembly 2016. The second housing 2008 also includes a second rotating shaft 2028 used to align the first housing 2006 and the second housing 2008.

FIG. 20d depicts an exemplary hole cutting tool assembly 2030 having an outer cutting portion 3032 including a first magnetic field emission structure 1802a and an inner cutting portion 2034 including a second magnetic field emission structure 1802b. The outer cutting portion 2032 comprises a first housing 2036 having a cutting edge 2038. The first housing 2036 is connected to a sliding shaft 2040 having a first bump pad 2042 and a second bump pad 2044. It is configured to slide back and forth inside a guide 2046, where movement is controlled by the spatial force function of the first and second magnetic field emission structures 1802a and 1802b. The inner cutting portion 2034 comprises a second housing 2048 having a cutting edge 2050. The second housing 2048 is maintained in a fixed position by a first shaft 2052. The second magnetic field emission structure 1802b is turned using a shaft 2054 so as to cause the first and second magnetic field emission structures 1802a and 1802b to align momentarily at which point the outer cutting portion 2032 is propelled towards the inner cutting potion 2034 such that cutting edges 2038 and 2050 overlap. The circumference of the first housing 2036 is slightly larger than the second housing 2048 so as to cause the two cutting edges 2038 and 2050 to precisely cut a hole in something passing between them (e.g., cloth). As the shaft 2054 continues to turn, the first and second magnetic field emission structures 1802a and 1802b quickly become misaligned whereby the outer cutting portion 2032 is propelled away from the inner cutting portion 2034. Furthermore, if the shaft 2054 continues to turn at some revolution rate (e.g., 1 revolution/second) then that rate defines the rate at which holes are cut (e.g., in the cloth). As such, the spatial force function can be controlled as a function of the movement of the two objects to which the first and second magnetic field emission structures are associated. In this instance, the outer cutting portion 3032 can move from left to right and the inner cutting portion 2032 turns at some revolution rate.

FIG. 20e depicts an exemplary machine press tool comprising a bottom portion 2058 and a top portion 2060. The bottom portion 2058 comprises a first tier 2062 including a first magnetic field emission structure 1802a, a second tier 2064 including a second magnetic field emission structure 2066a, and a flat surface 2068 having below it a third magnetic field emission structure 2070a. The top portion 2060 comprises a first tier 2072 including a fourth magnetic field emission structure 1802b having mirror coding as the first magnetic field emission structure 1802a, a second tier 2074 including a fifth magnetic field emission structure 2066b having mirror coding as the second magnetic field emission structure 2066a, and a third tier 2076 including a sixth magnetic field emission structure 2070b having mirror coding as the third magnetic field emission structure 2070a. The second and third tiers of the top portion 2060 are configured to receive the two tiers of the bottom portion 2058. As the bottom and top portions 2058, 2060 are brought close to each other and the top portion 2060 becomes aligned with the bottom portion 2058 the spatial force functions of the complementary pairs of magnetic field emission structures causes a pressing of any material (e.g., aluminum) that is placed between the two portions. By turning either the bottom portion 2058 or the top portion 2060, the magnetic field emission structures become misaligned such that the two portions separate.

FIG. 20f depicts an exemplary gripping apparatus 2078 including a first part 2080 and a second part 2082. The first part 2080 comprises a saw tooth or stairs like structure where each tooth (or stair) has corresponding magnets making up a first magnetic field emission structure 2084a. The second part 2082 also comprises a saw tooth or stairs like structure where each tooth (or stair) has corresponding magnets making up a second magnetic field emission structure 2084b that is a mirror image of the first magnetic field emission structure 2084a. Under one arrangement each of the two parts shown are cross-sections of parts that have the same cross section as rotated up to 360° about a center axis 2086. Generally, the present invention can be used to produce all sorts of holding mechanism such as pliers, jigs, clamps, etc. As such, the present invention can provide a precise gripping force and inherently maintains precision alignment.

Figure 20G:
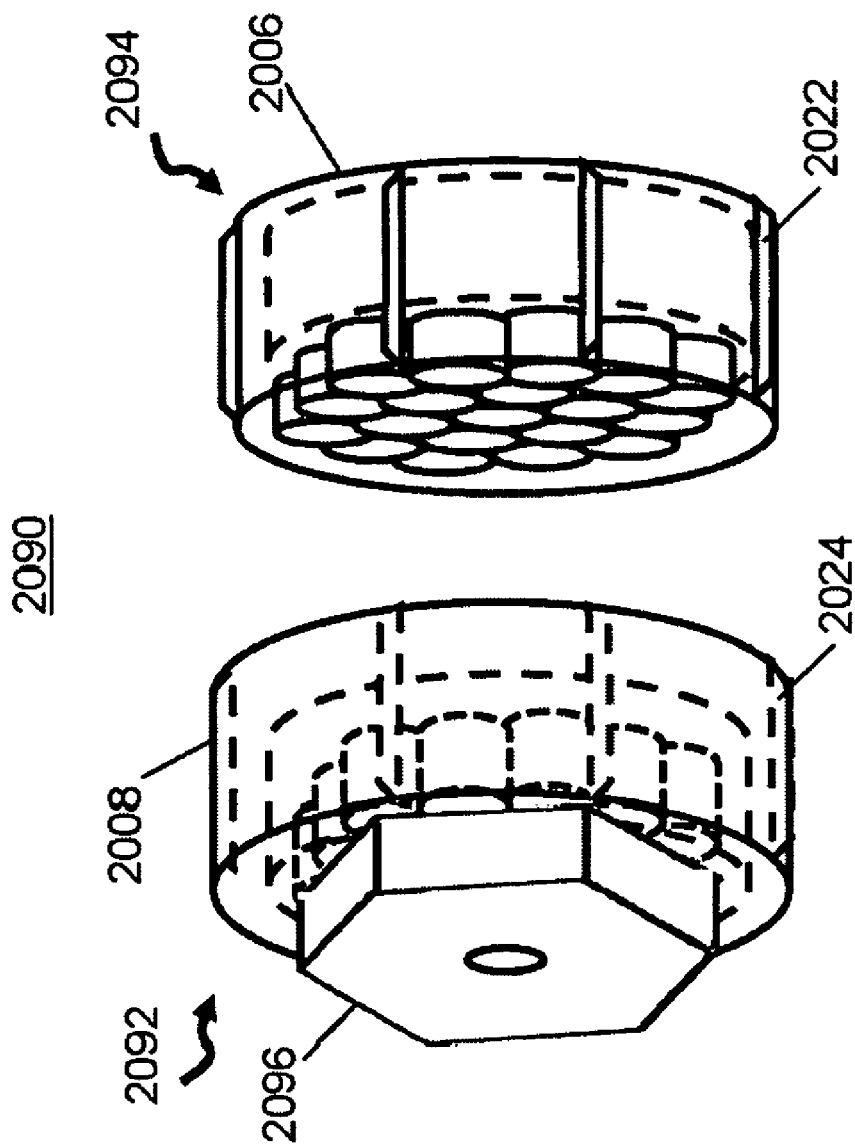
FIG. 20g depicts an exemplary clasp mechanism including a magnetic field emission structure slip ring mechanism.

FIG. 20g depicts an exemplary clasp mechanism 2090 including a first part 2092 and a second part 2094. The first part 2092 includes a first housing 2008 supporting a first magnetic field emission structure. The second part 2094 includes a second housing 2006 used to support a second magnetic field emission structure. The second housing 2006 includes raised guides 2022 that are configured to slide into guide slots 2024 of the first housing 2008. The first housing 2008 is also associated with a magnetic field emission structure slip ring mechanism 2096 that can be turned to rotate the magnetic field emission structure of the first part 2092 so as to align or misalign the two magnetic field emission structures of the clasp mechanism 2090. Generally, all sorts of clasp mechanisms can be constructed in accordance with the present invention whereby a slip ring mechanism can be turned to cause the clasp mechanism to release. Such clasp mechanisms can be used as receptacle plugs, plumbing connectors, connectors involving piping for air, water, steam, or any compressible or incompressible fluid. The technology is also applicable to Bayonette Neil-Concelman (BNC) electronic connectors, Universal Serial Bus (USB) connectors, and most any other type of connector used for any purpose.

The gripping force described above can also be described as a mating force. As such, in certain electronics applications this ability to provide a precision mating force between two electronic parts or as part of a connection may correspond to a desired characteristic, for example, a desired impedance. Furthermore, the invention is applicable to inductive power coupling where a first magnetic field emission structure that is driven with AC will achieve inductive power coupling when aligned with a second magnetic field emission structure made of a series of solenoids whose coils are connected together with polarities according to the same code used to produce the first magnetic field emission structure. When not aligned, the fields will close on themselves since they are so close to each other in the driven magnetic field emission structure and thereby conserve power. Ordinary inductively coupled systems' pole pieces are rather large and cannot conserve their fields in this way since the air gap is so large.

FIG. 21 depicts a first elongated structural member 2102 having magnetic field emission structures 2104 on each of two ends and also having an alignment marking 2106 ("AA"). FIG. 21 also depicts a second elongated structural member 2108 having magnetic field emission structures 2110 on both ends of one side. The magnetic field emission structures 2104 and 2110 are configured such that they can be aligned to attach the first and second structural members 2102 and 2108. FIG. 21 further depicts a structural assembly 2112 including two of the first elongated structural members 2102 attached to two of the second elongated structural members 2108 whereby four magnetic field emission structure pairs 2104/2110 are aligned. FIG. 21 includes a cover panel 2114 having four magnetic field emission structures 1802a that are configured to align with four magnetic field emission structures 1802b to attach the cover panel 2114 to the structural assembly 2112 to produce a covered structural assembly 2116.

Generally, the ability to easily turn correlated magnetic structures such that they disengage is a function of the torque easily created by a person's hand by the moment arm of the structure. The larger it is, the larger the moment arm, which acts as a lever. When two separate structures are physically connected via a structural member, as with the cover panel 2114, the ability to use torque is defeated because the moment arms are reversed. This reversal is magnified with each additional separate structure connected via structural members in an array. The force is proportional to the distance between respective structures, where torque is proportional to force times radius. As such, under one arrangement, the magnetic field emission structures of the covered structural assembly 2116 include a turning mechanism enabling them to be aligned or misaligned in order to assemble or disassemble the covered structural assembly. Under another arrangement, the magnetic field emission structures do not include a turning mechanism.

Figure 22:
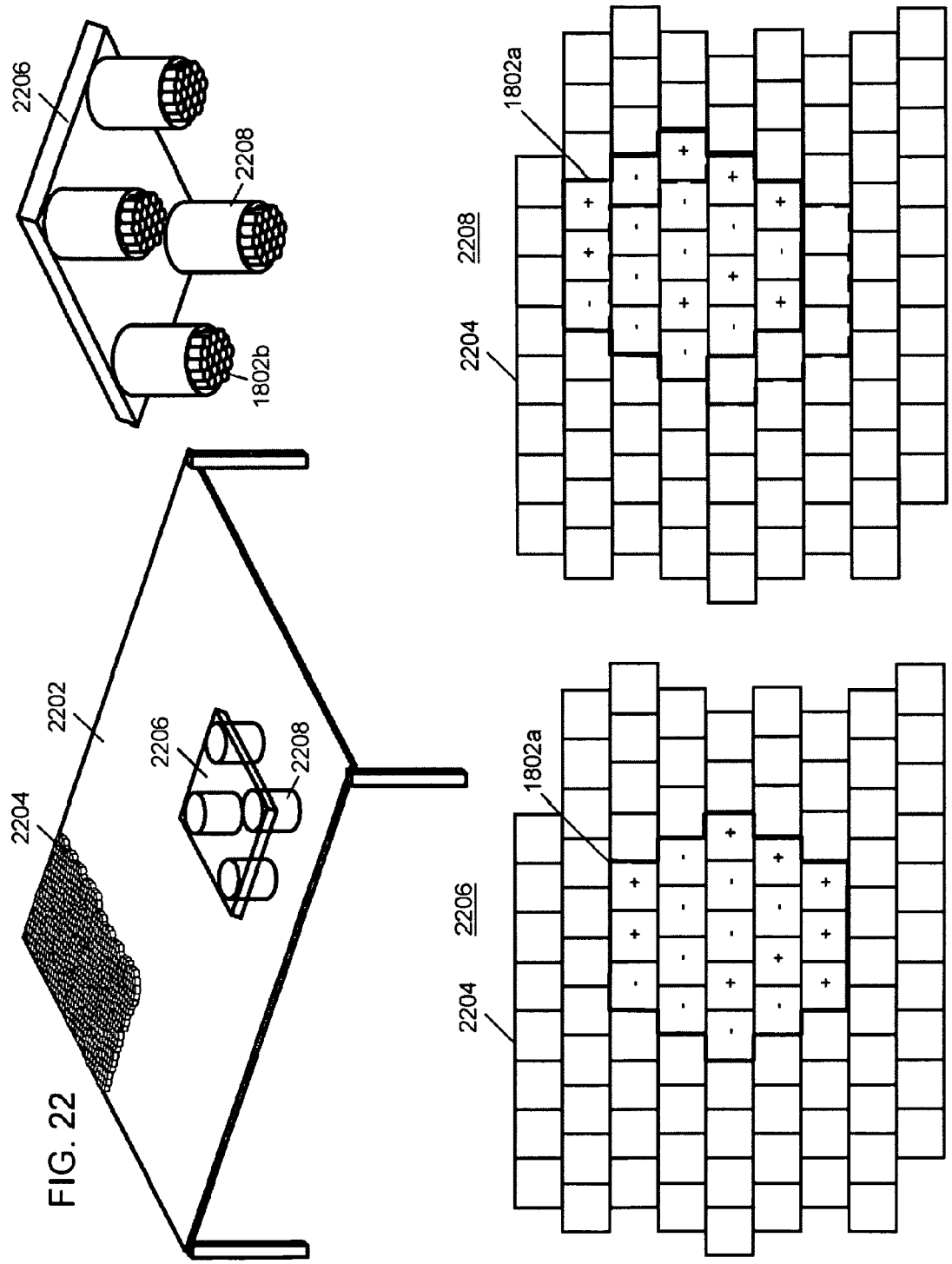
FIG. 22 depicts a table having beneath its surface a two-dimensional electromagnetic array where an exemplary movement platform having contact members with magnetic field emission structures can be moved by varying the states of the individual electromagnets of the electromagnetic array.
Figure 23:
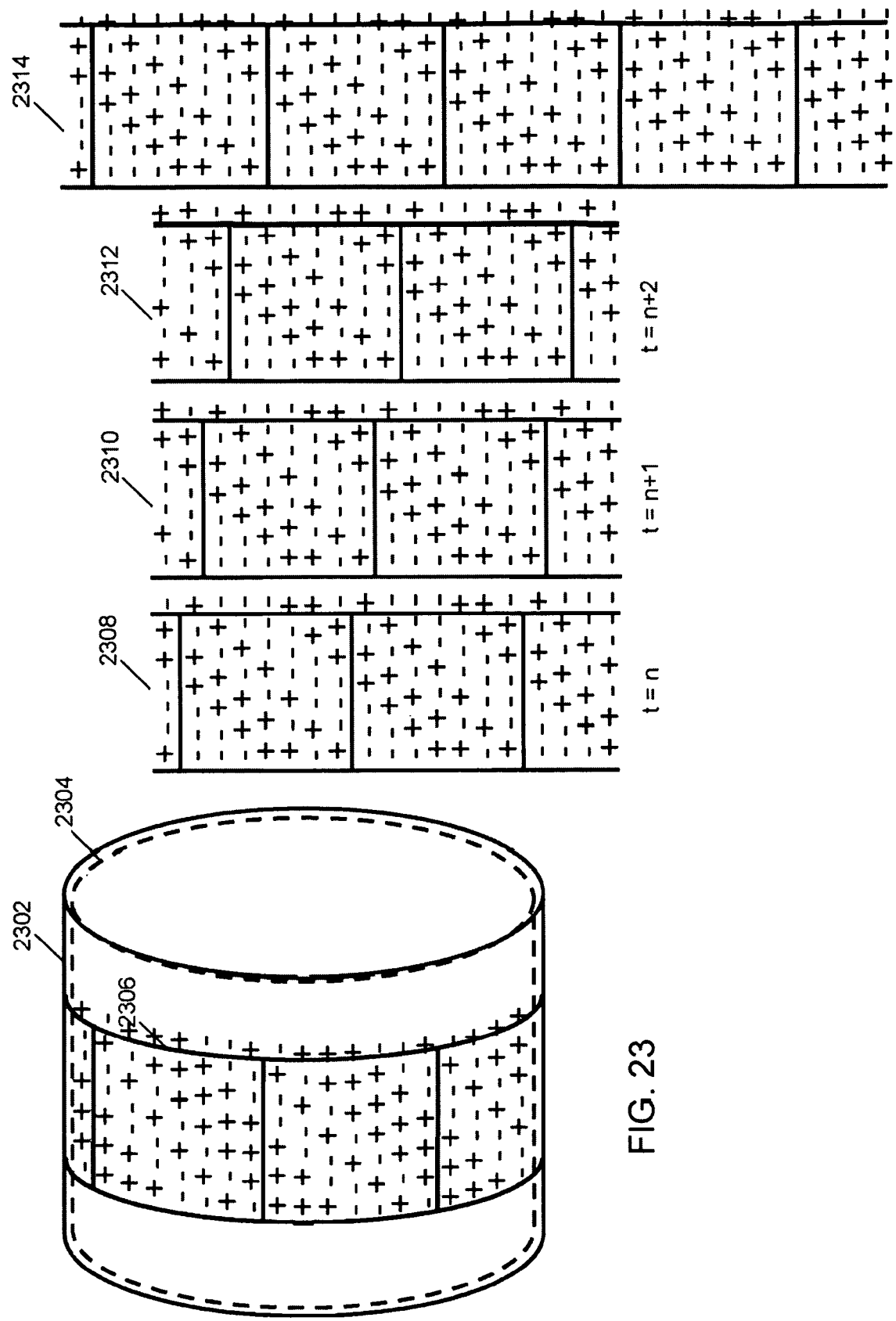
FIG. 23 depicts a cylinder inside another cylinder where either cylinder can be moved relative to the other cylinder by varying the state of individual electromagnets of an electromagnetic array associated with one cylinder relative to a magnetic field emission structure associated with the other cylinder.
Figure 24:
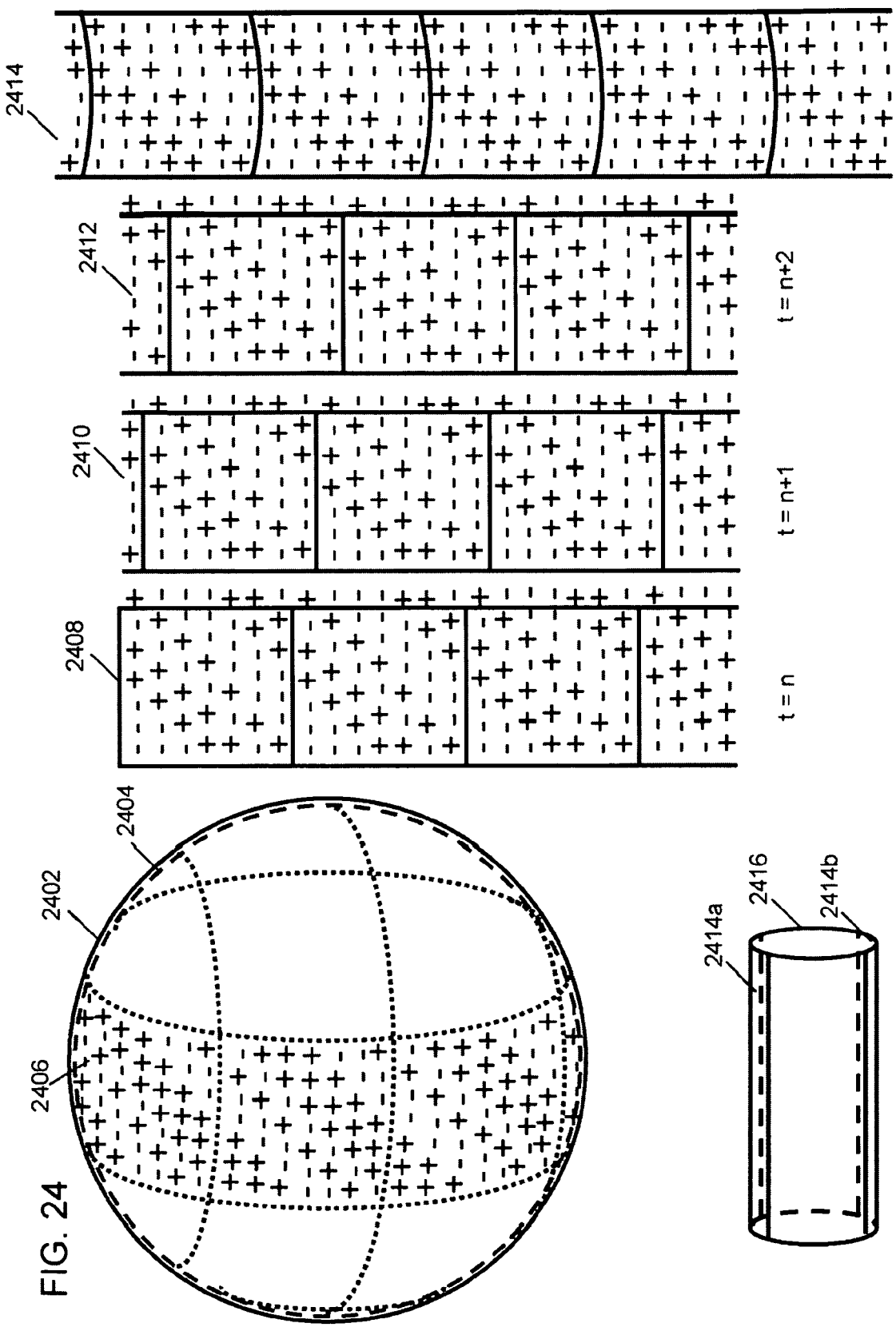
FIG. 24 depicts a sphere inside another sphere where either sphere can be moved relative to the other sphere by varying the state of individual electromagnets of an electromagnetic array associated with one sphere relative to a magnetic field emission structure associated with the other sphere.

FIGS. 22-24 depict uses of arrays of electromagnets used to produce a magnetic field emission structure that is moved in time relative to a second magnetic field emission structure associated with an object thereby causing the object to move.

FIG. 22 depicts a table 2202 having a two-dimensional electromagnetic array 2204 beneath its surface as seen via a cutout. On the table 2202 is a movement platform 2206 comprising at least one table contact member 2208. The movement platform 2206 is shown having four table contact members 2208 each having a magnetic field emission structure 1802b that would be attracted by the electromagnet array 2204. Computerized control of the states of individual electromagnets of the electromagnet array 2204 determines whether they are on or off and determines their polarity. A first example 2210 depicts states of the electromagnetic array 2204 configured to cause one of the table contact members 2208 to attract to a subset of the electromagnets corresponding to the magnetic field emission structure 1802a. A second example 2212 depicts different states of the electromagnetic array 2204 configured to cause the table contact member 2208 to be attracted (i.e., move) to a different subset of the electromagnetic corresponding to the magnetic field emission structure 1802a. Per the two examples, one skilled in the art can recognize that the table contact member(s) can be moved about table 2202 by varying the states of the electromagnets of the electromagnetic array 2204.

FIG. 23 depicts a first cylinder 2302 slightly larger than a second cylinder 2304 contained inside the first cylinder 2302. A magnetic field emission structure 2306 is placed around the first cylinder 2302 (or optionally around the second cylinder 2304). An array of electromagnets (not shown) is associated with the second cylinder 2304 (or optionally the first cylinder 2302) and their states are controlled to create a moving mirror image magnetic field emission structure to which the magnetic field emission structure 2306 is attracted so as to cause the first cylinder 2302 (or optionally the second cylinder 2304) to rotate relative to the second cylinder 2304 (or optionally the first cylinder 2302). The magnetic field emission structures 2308, 2310, and 2312 produced by the electromagnetic array at time t=n, t=n+1, and t=n+2, show a pattern mirroring that of the magnetic field emission structure 2306 around the first cylinder 2302. The pattern is shown moving downward in time so as to cause the first cylinder 2302 to rotate counterclockwise. As such, the speed and direction of movement of the first cylinder 2302 (or the second cylinder 2304) can be controlled via state changes of the electromagnets making up the electromagnetic array. Also depicted in FIG. 23 is a electromagnetic array 2314 that corresponds to a track that can be placed on a surface such that a moving mirror image magnetic field emission structure can be used to move the first cylinder 2302 backward or forward on the track using the same code shift approach shown with magnetic field emission structures 2308, 2310, and 2312.

FIG. 24 depicts a first sphere 2402 slightly larger than a second sphere 2404 contained inside the first sphere 2402. A magnetic field emission structure 2406 is placed around the first sphere 2402 (or optionally around the second sphere 2404). An array of electromagnets (not shown) is associated with the second sphere 2404 (or optionally the first sphere 2402) and their states are controlled to create a moving mirror image magnetic field emission structure to which the magnetic field emission structure 2406 is attracted so as to cause the first sphere 2402 (or optionally the second sphere 2404) to rotate relative to the second sphere 2404 (or optionally the first sphere 2402). The magnetic field emission structures 2408, 2410, and 2412 produced by the electromagnetic array at time t=n, t=n+1, and t=n+2, show a pattern mirroring that of the magnetic field emission structure 2406 around the first sphere 2402. The pattern is shown moving downward in time so as to cause the first sphere 2402 to rotate counterclockwise and forward. As such, the speed and direction of movement of the first sphere 2402 (or the second sphere 2404) can be controlled via state changes of the electromagnets making up the electromagnetic array. Also note that the electromagnets and/or magnetic field emission structure could extend so as to completely cover the surface(s) of the first and/or second spheres 2402, 2404 such that the movement of the first sphere 2402 (or second sphere 2404) can be controlled in multiple directions along multiple axes. Also depicted in FIG. 24 is an electromagnetic array 2414 that corresponds to a track that can be placed on a surface such that moving magnetic field emission structure can be used to move first sphere 2402 backward or forward on the track using the same code shift approach shown with magnetic field emission structures 2408, 2410, and 2412. A cylinder 2416 is shown having a first electromagnetic array 2414a and a second electromagnetic array 2414b which would control magnetic field emission structures to cause sphere 2402 to move backward or forward in the cylinder.

Figure 25:
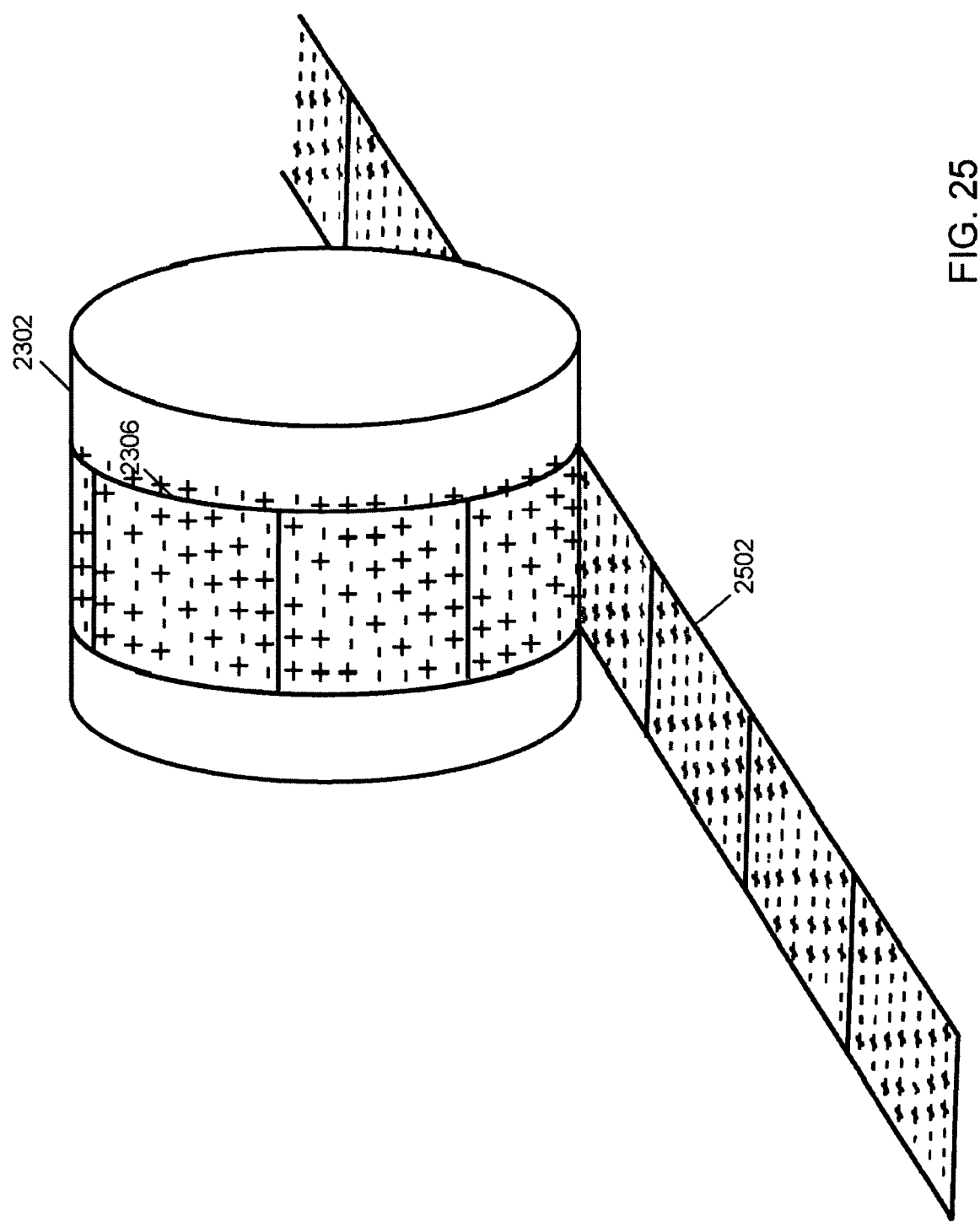
FIG. 25 depicts an exemplary cylinder having a magnetic field emission structure and a correlated surface where the magnetic field emission structure and the correlated surface provide traction and a gripping force as the cylinder is turned.

FIGS. 25-27 depict a correlating surface being wrapped back on itself to form either a cylinder (disc, wheel), a sphere, and a conveyor belt/tracked structure that when moved relative to a mirror image correlating surface will achieve strong traction and a holding (or gripping) force. Any of these rotary devices can also be operated against other rotary correlating surfaces to provide gear-like operation. Since the hold-down force equals the traction force, these gears can be loosely connected and still give positive, non-slipping rotational accuracy. Correlated surfaces can be perfectly smooth and still provide positive, non-slip traction. As such, they can be made of any substance including hard plastic, glass, stainless steel or tungsten carbide. In contrast to legacy friction-based wheels the traction force provided by correlated surfaces is independent of the friction forces between the traction wheel and the traction surface and can be employed with low friction surfaces. Devices moving about based on magnetic traction can be operated independently of gravity for example in weightless conditions including space, underwater, vertical surfaces and even upside down.

If the surface in contact with the cylinder is in the form of a belt, then the traction force can be made very strong and still be non-slipping and independent of belt tension. It can replace, for example, toothed, flexible belts that are used when absolutely no slippage is permitted. In a more complex application the moving belt can also be the correlating surface for self-mobile devices that employ correlating wheels. If the conveyer belt is mounted on a movable vehicle in the manner of tank treads then it can provide formidable traction to a correlating surface or to any of the other rotating surfaces described here.

FIG. 25 depicts an alternative approach to that shown in FIG. 23. In FIG. 25 a cylinder 2302 having a first magnetic field emission structure 2306 and being turned clockwise or counter-clockwise by some force will roll along a second magnetic field emission structure 2502 having mirror coding as the first magnetic field emission structure 2306. Thus, whereas in FIG. 23, an electromagnetic array was shifted in time to cause forward or backward movement, the fixed magnetic field emission structure 2502 values provide traction and a gripping (i.e., holding) force as cylinder 2302 is turned by another mechanism (e.g., a motor). The gripping force would remain substantially constant as the cylinder moved down the track independent of friction or gravity and could therefore be used to move an object about a track that moved up a wall, across a ceiling, or in any other desired direction within the limits of the gravitational force (as a function of the weight of the object) overcoming the spatial force of the aligning magnetic field emission structures. The approach of FIG. 25 can also be combined with the approach of FIG. 23 whereby a first cylinder having an electromagnetic array is used to turn a second cylinder having a magnetic field emission structure that also achieves traction and a holding force with a mirror image magnetic field emission structure corresponding to a track.

FIG. 26 depicts an alternative approach to that shown in FIG. 24. In FIG. 26 a sphere 2402 having a first magnetic field emission structure 2406 and being turned clockwise or counter-clockwise by some force will roll along a second magnetic field emission structure 2602 having mirror coding as the first magnetic field emission structure 2406. Thus, whereas in FIG. 24, an electromagnetic array was shifted in time to cause forward or backward movement, the fixed second magnetic field emission structure 2602 values provide traction and a gripping (i.e., holding) force as sphere 2402 is turned by another mechanism (e.g., a motor). The gripping force would remain substantially constant as the sphere 2402 moved down the track independent of friction or gravity and could therefore be used to move an object about a track that moved up a wall, across a ceiling, or in any other desired direction within the limits of the gravitational force (as a function of the weight of the object) overcoming the spatial force of the aligning magnetic field emission structures. A cylinder 2416 is shown having a first magnetic field emission structure 2602a and second magnetic field emission structure 2602b which have mirror coding as magnetic field emission structure 2406. As such they work together to provide a gripping force causing sphere 2402 to move backward or forward in the cylinder 2416 with precision alignment.

FIG. 27a and FIG. 27b depict an arrangement where a first magnetic field emission structure 2702 wraps around two cylinders 2302 such that a much larger portion 2704 of the first magnetic field emission structure is in contact with a second magnetic field emission structure 2502 having mirror coding as the first magnetic field emission structure 2702. As such, the larger portion 2704 directly corresponds to a larger gripping force.

An alternative approach for using a correlating surface is to have a magnetic field emission structure on an object (e.g., an athlete's or astronaut's shoe) that is intended to partially correlate with the correlating surface regardless of how the surface and the magnetic field emission structure are aligned. Essentially, correlation areas would be randomly placed such the object (shoe) would achieve partial correlation (gripping force) as it comes randomly in contact with the surface. For example, a runner on a track wearing shoes having a magnetic field emission structure with partial correlation encoding could receive some traction from the partial correlations that would occur as the runner was running on a correlated track.

Figure 28A:
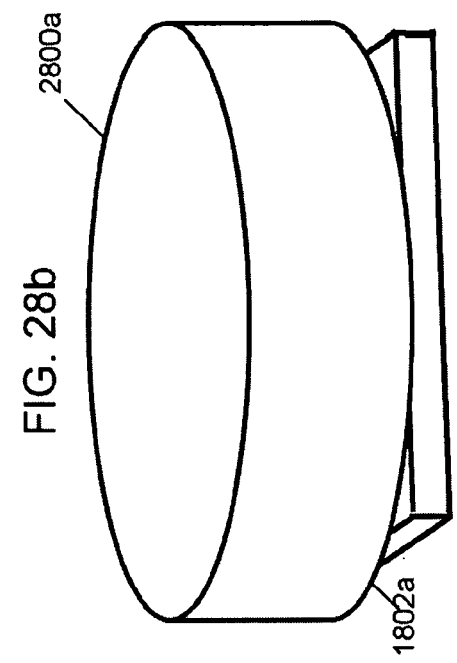
FIGS. 28a through 28d depict an exemplary method of manufacturing magnetic field emission structures using a ferromagnetic material.
Figure 28B:
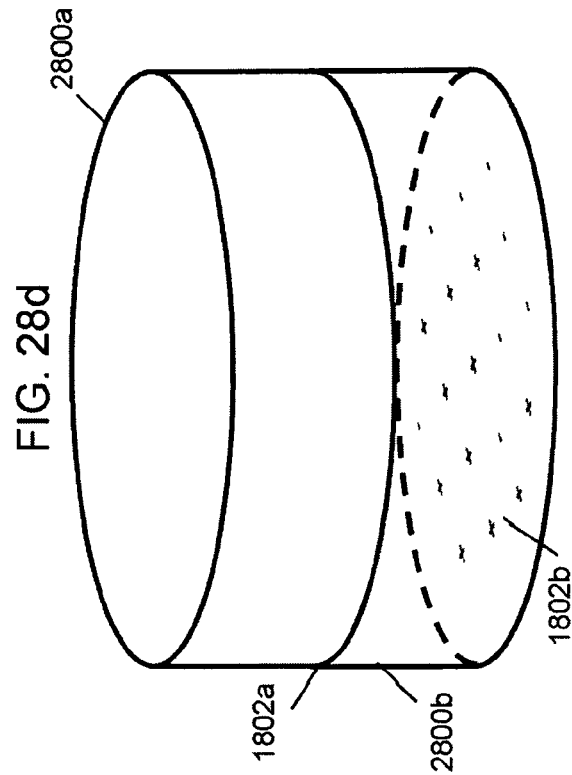
Figure 28C:
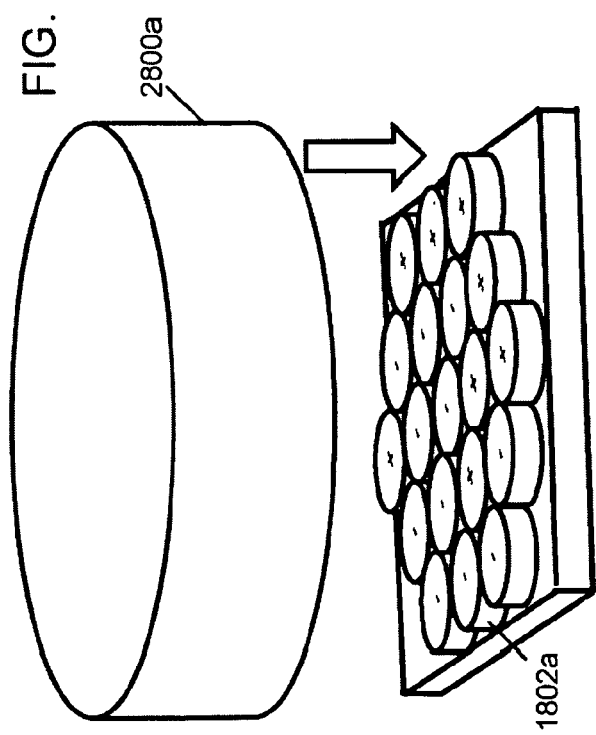
Figure 28D:
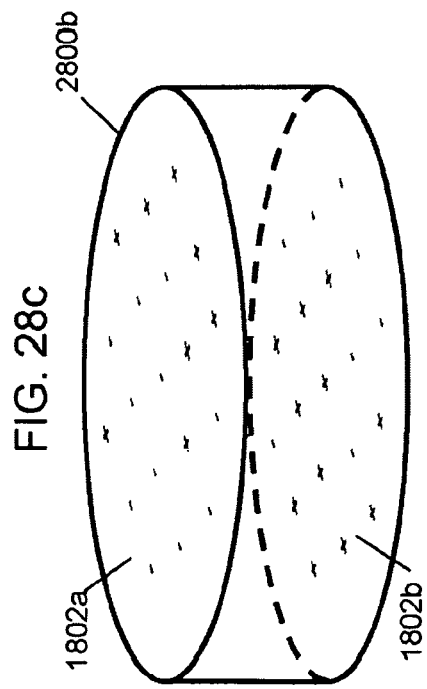

FIGS. 28a through 28d depict a manufacturing method for producing magnetic field emission structures. In FIG. 28a, a first magnetic field emission structure 1802a comprising an array of individual magnets is shown below a ferromagnetic material 2800a (e.g., iron) that is to become a second magnetic field emission structure having the same coding as the first magnetic field emission structure 1802a. In FIG. 28b, the ferromagnetic material 2800a has been heated to its Curie temperature (for antiferromagnetic materials this would instead be the Neel temperature). The ferromagnetic material 2800a is then brought in contact with the first magnetic field emission structure 1802a and allowed to cool. Thereafter, the ferromagnetic material 2800a takes on the same magnetic field emission structure properties of the first magnetic field emission structure 1802a and becomes a magnetized ferromagnetic material 2800b, which is itself a magnetic field emission structure, as shown in FIG. 28c. As depicted in FIG. 28d, should another ferromagnetic material 2800a be heated to its Curie temperature and then brought in contact with the magnetized ferromagnetic material 2800b, it too will take on the magnetic field emission structure properties of the magnetized ferromagnetic material 2800b as previously shown in FIG. 28c.

An alternative method of manufacturing a magnetic field emission structure from a ferromagnetic material would be to use one or more lasers to selectively heat up field emission source locations on the ferromagnetic material to the Curie temperature and then subject the locations to a magnetic field. With this approach, the magnetic field to which a heated field emission source location may be subjected may have a constant polarity or have a polarity varied in time so as to code the respective source locations as they are heated and cooled.

To produce superconductive magnet field structures, a correlated magnetic field emission structure would be frozen into a super conductive material without current present when it is cooled below its critical temperature.

FIG. 29 depicts the addition of two intermediate layers 2902 to a magnetic field emission structure 2800b. Each intermediate layer 2902 is intended to smooth out (or suppress) spatial forces when any two magnetic field emission structures are brought together such that sidelobe effects are substantially shielded. An intermediate layer 2902 can be active (i.e., saturable such as iron) or inactive (i.e., air or plastic).

FIGS. 30a through 30c provide a side view, an oblique projection, and a top view, respectively, of a magnetic field emission structure 2800b having a surrounding heat sink material 3000 and an embedded kill mechanism comprising an embedded wire (e.g., nichrome) coil 3002 having connector leads 3004. As such, if heat is applied from outside the magnetic field emission structure 2800b, the heat sink material 3000 prevents magnets of the magnetic field emission structure from reaching their Curie temperature. However, should it be desirable to kill the magnetic field emission structure, a current can be applied to connector leads 3004 to cause the wire coil 3002 to heat up to the Curie temperature. Generally, various types of heat sink and/or kill mechanisms can be employed to enable control over whether a given magnetic field emission structure is subjected to heat at or above the Curie temperature. For example, instead of embedding a wire coil, a nichrome wire might be plated onto individual magnets.

Figure 31A:
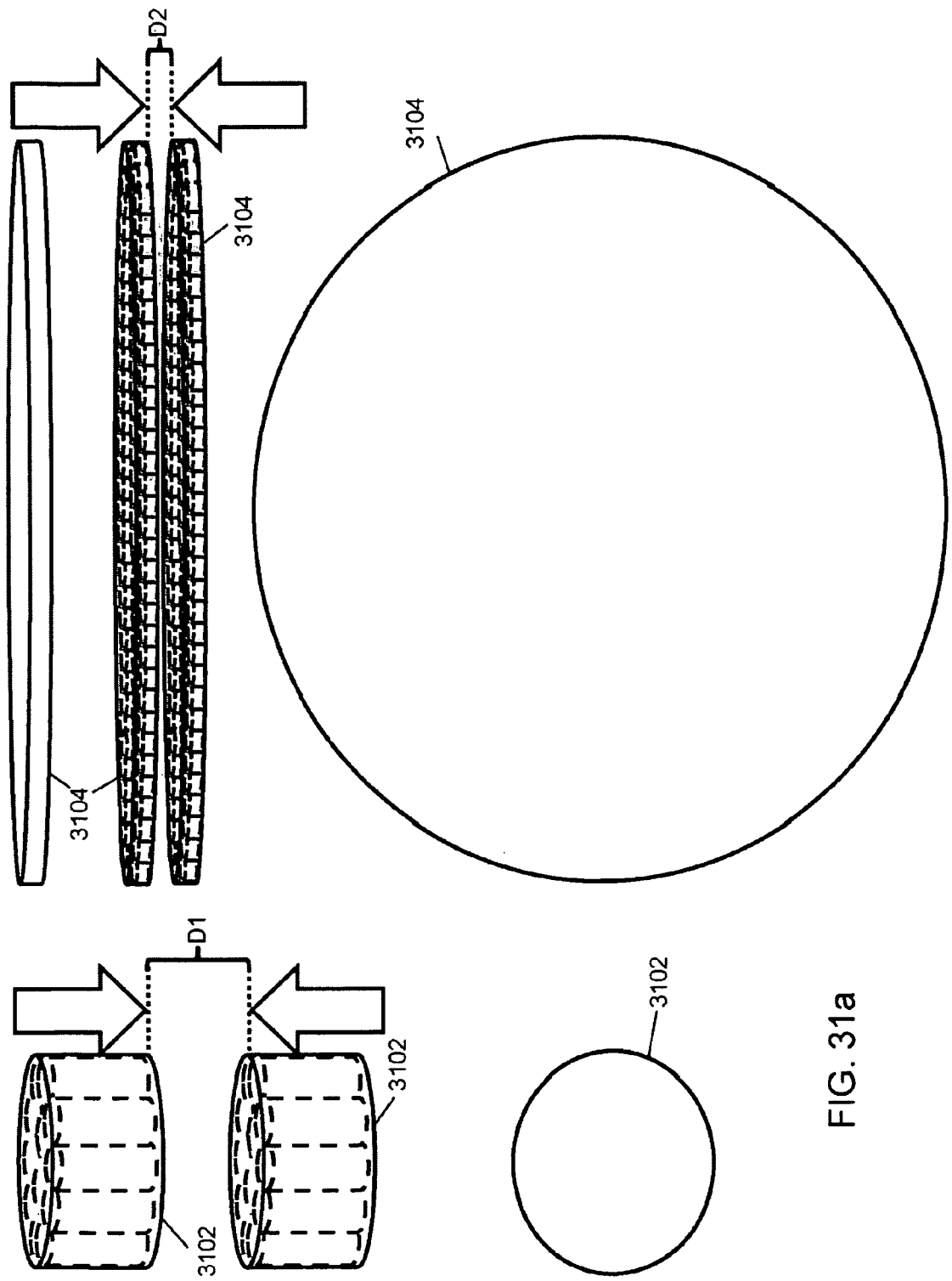
FIG. 31a depicts exemplary distribution of magnetic forces over a wider area to control the distance apart at which two magnetic field emission structures will engage when substantially aligned.

FIG. 31a depicts an oblique projection of a first pair of magnetic field emission structures 3102 and a second pair of magnetic field emission structures 3104 each having magnets indicated by dashed lines. Above the second pair of magnetic field emission structures 3104 (shown with magnets) is another magnetic field emission structure where the magnets are not shown, which is intended to provide clarity to the interpretation of the depiction of the two magnetic field emission structures 3104 below. Also shown are top views of the circumferences of the first and second pair of magnetic field emission structures 3102 and 3104. As shown, the first pair of magnetic field emission structures 3102 have a relatively small number of relatively large (and stronger) magnets when compared to the second pair of magnetic field emission structures 3104 that have a relatively large number of relatively small (and weaker) magnets. For this figure, the peak spatial force for each of the two pairs of magnetic field emission structures 3102 and 3104 are the same. However, the distances D1 and D2 at which the magnetic fields of each of the pairs of magnetic field emission structures 3102 and 3104 substantially interact (shown by up and down arrows) depends on the strength of the magnets and the area over which they are distributed. As such, the much larger surface of the second magnetic field emission structure 3104 having much smaller magnets will not substantially attract until much closer than that of first magnetic field emission structure 3102. This magnetic strength per unit area attribute as well as a magnetic spatial frequency (i.e., # magnetic reversals per unit area) can be used to design structures to meet safety requirements. For example, two magnetic field emission structures 3104 can be designed to not have significant attraction force if a finger is between them (or in other words the structures wouldn't have significant attraction force until they are substantially close together thereby reducing (if not preventing) the opportunity/likelihood for body parts or other things such as clothing getting caught in between the structures).

Figure 31B:
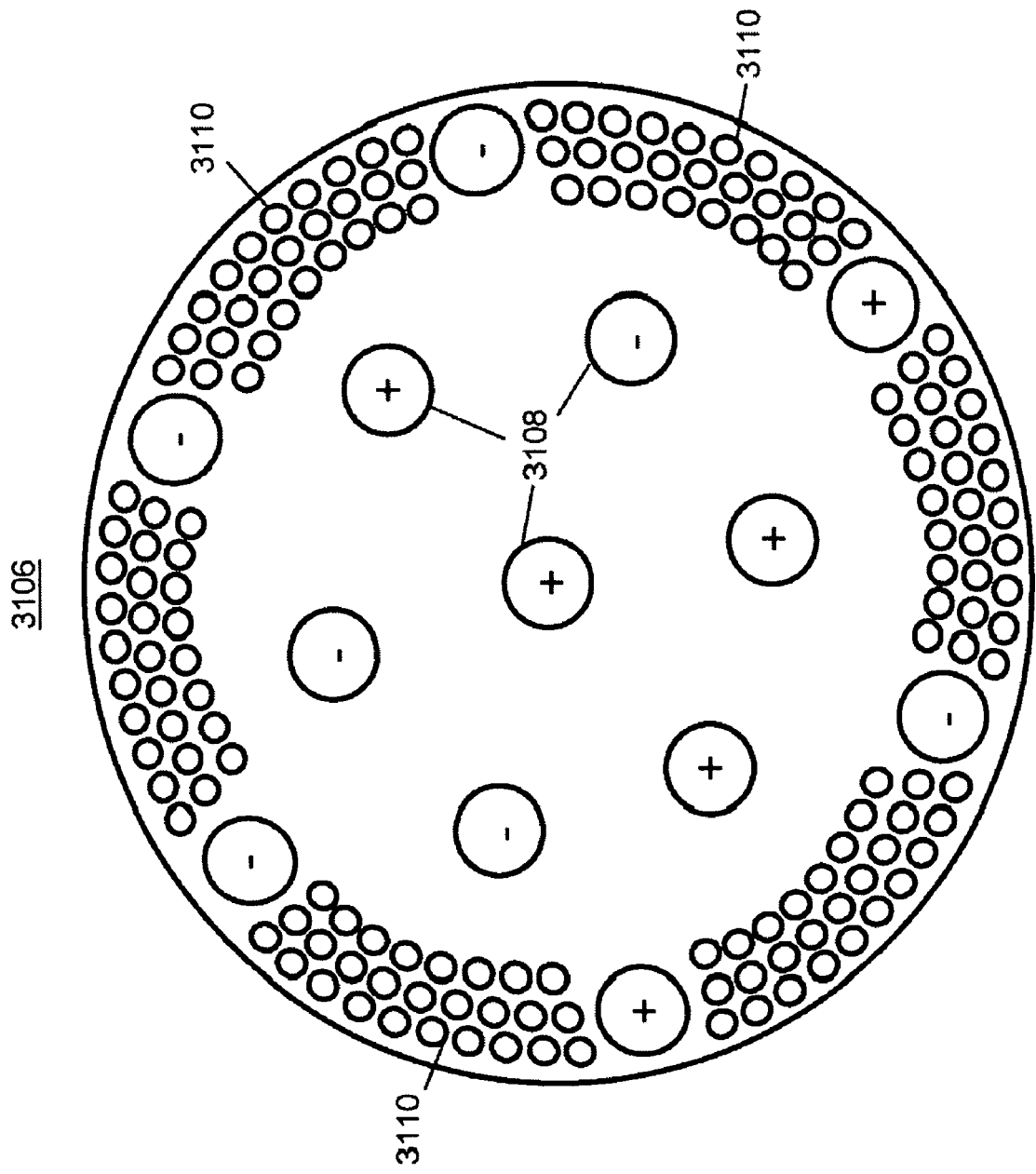
FIG. 31b depicts a magnetic field emission structure made up of a sparse array of large magnetic sources combined with a large number of smaller magnetic sources whereby alignment with a mirror magnetic field emission structure is provided by the large sources and a repel force is provided by the smaller sources.

FIG. 31b depicts a magnetic field emission structure 3106 made up of a sparse array of large magnetic sources 3108 combined with a large number of smaller magnetic sources 3110 whereby alignment with a mirror image magnetic field emission structure would be provided by the large sources and a repel force would be provided by the smaller sources. Generally, as was the case with FIG. 31a, the larger (i.e., stronger) magnets achieve a significant attraction force (or repelling force) at a greater separation distance than smaller magnets. Because of this characteristic, combinational structures having magnetic sources of different strengths can be constructed that effectively have two (or more) spatial force functions corresponding to the different levels of magnetic strengths employed. As the magnetic field emission structures are brought closer together, the spatial force function of the strongest magnets is first to engage and the spatial force functions of the weaker magnets will engage when the magnetic field emission structures are moved close enough together at which the spatial force functions of the different sized magnets will combine. Referring back to FIG. 31b, the sparse array of stronger magnets 3108 is coded such that it can correlate with a mirror image sparse array of comparable magnets. However, the number and polarity of the smaller (i.e., weaker) magnets 3110 can be tailored such that when the two magnetic field emission structures are substantially close together, the magnetic force of the smaller magnets can overtake that of the larger magnets 3108 such that an equilibrium will be achieved at some distance between the two magnetic field emission structures. As such, alignment can be provided by the stronger magnets 3108 but contact of the two magnetic field emission structures can be prevented by the weaker magnets 3110. Similarly, the smaller, weaker magnets can be used to add extra attraction strength between the two magnetic field emission structures.

One skilled in the art will recognize that the all sorts of different combinations of magnets having different strengths can be oriented in various ways to achieve desired spatial forces as a function of orientation and separation distance between two magnetic field emission structures. For example, a similar aligned attract—repel equilibrium might be achieved by grouping the sparse array of larger magnets 3108 tightly together in the center of magnetic field emission structure 3106. Moreover, combinations of correlated and non-correlated magnets can be used together, for example, the weaker magnets 3110 of FIG. 31b may all be uncorrelated magnets. Furthermore, one skilled in the art will recognize that such an equilibrium enables frictionless traction (or hold) forces to be maintained and that such techniques could be employed for many of the exemplary drawings provided herein. For example, the magnetic field emission structures of the two spheres shown in FIG. 24 could be configured such that the spheres never come into direct contact, which could be used, for example, to produce frictionless ball joints.

FIG. 32 depicts an exemplary magnetic field emission structure assembly apparatus comprising one or more vacuum tweezers 3202 that are capable of placing magnets 100a and 100b having first and second polarities into machined holes 3204 in a support frame 3206. Magnets 100a and 100b are taken from at least one magnet supplying device 3208 and inserted into holes 3204 of support frame 3206 in accordance with a desired code. Under one arrangement, two magnetic tweezers are employed with each being integrated with its own magnet supply device 3208 allowing the vacuum tweezers 3202 to only move to the next hole 3204 whereby a magnet is fed into vacuum tweezers 3202 from inside the device. Magnets 100a and 100b may be held in place in a support frame 3206 using an adhesive (e.g., a glue). Alternatively, holes 3204 and magnets 100a and 100b could have threads whereby vacuum tweezers 3202 or an alternative insertion tool would screw them into place. A completed magnetic field assembly 3210 is also depicted in FIG. 32. Under an alternative arrangement the vacuum tweezers would place more than one magnet into a frame 3206 at a time to include placing all magnets at one time. Under still another arrangement, an array of coded electromagnets 3212 is used to pick up and place at one time all the magnets 3214 to be placed into the frame 3206 where the magnets are provided by a magnet supplying device 3216 that resembles the completed magnetic field assembly 3210 such that magnets are fed into each supplying hole from beneath (as shown in 3208) and where the coded electromagnets attract the entire array of loose magnets. With this approach the array of electromagnets 3212 may be recessed such that there is a guide 3218 for each loose magnet as is the case with the bottom portion of the vacuum tweezers 3202. With this approach, an entire group of loose magnets can be inserted into a frame 3206 and when a previously applied sealant has dried sufficiently the array of electromagnets 3212 can be turned so as to release the now placed magnets. Under an alternative arrangement the magnetic field emission structure assembly apparatus would be put under pressure. Vacuum can also be used to hold magnets into a support frame 3206.

As described above, vacuum tweezers can be used to handle the magnets during automatic placement manufacturing. However, the force of vacuum, i.e. 14.7 psi, on such a small surface area may not be enough to compete with the magnetic force. If necessary, the whole manufacturing unit can be put under pressure. The force of a vacuum is a function of the pressure of the medium. If the workspace is pressurize to 300 psi (about 20 atmospheres) the force on a tweezer tip 1/16" across would be about 1 pound which depending on the magnetic strength of a magnet might be sufficient to compete with its magnetic force. Generally, the psi can be increased to whatever is needed to produce the holding force necessary to manipulate the magnets.

If the substrate that the magnets are placed in have tiny holes in the back then vacuum can also be used to hold them in place until the final process affixes them permanently with, for example, ultraviolet curing glue. Alternatively, the final process by involve heating the substrate to fuse them all together, or coating the whole face with a sealant and then wiping it clean (or leaving a thin film over the magnet faces) before curing. The vacuum gives time to manipulate the assembly while waiting for whatever adhesive or fixative is used.

FIG. 33 depicts a cylinder 2302 having a first magnetic field emission structure 2306 on the outside of the cylinder where the code pattern 1402a is repeated six times around the cylinder. Beneath the cylinder 2302 is an object 3302 having a curved surface with a slightly larger curvature as does the cylinder 2302 (such as the curvature of cylinder 2304) and having a second magnetic field emission structure 3304 that is also coded using the code pattern 1402a. The cylinder 2302 is turned at a rotational rate of 1 rotation per second by shaft 3306. Thus, as the cylinder 2302 turns, six times a second the code pattern 1402a of the first magnetic field emission structure 2306 of the cylinder 2302 aligns with the second magnetic field emission structure 3304 of the object 3302 causing the object 3302 to be repelled (i.e., moved downward) by the peak spatial force function of the two magnetic field emission structures 2306, 3304. Similarly, had the second magnetic field emission structure 3304 been coded using code pattern 1402b, then 6 times a second the code pattern 1402a of the first magnetic field emission structure 2306 of the cylinder 2302 aligns with the second magnetic field emission structure 3304 of the object 3302 causing the object 3302 to be attracted (i.e., moved upward) by the peak spatial force function of the two magnetic field emission structures. Thus, the movement of the cylinder 2302 and corresponding first magnetic field emission structure 2306 can be used to control the movement of the object 3302 having its corresponding second magnetic field emission structure 3304. Additional magnetic field emission structures and/or other devices capable of controlling movement (e.g., springs) can also be used to control movement of the object 3302 based upon the movement of the first magnetic field emission structure 2306 of the cylinder 2302. One skilled in the art will recognize that a shaft 3306 may be turned as a result of wind turning a windmill, a water wheel or turbine, ocean wave movement, and other methods whereby movement of the object 3302 can result from some source of energy scavenging. Another example of energy scavenging that could result in movement of object 3302 based on magnetic field emission structures is a wheel of a vehicle that would correspond to a cylinder 2302 where the shaft 3306 would correspond to the wheel axle. Generally, the present invention can be used in accordance with one or more movement path functions of one or more objects each associated with one or more magnetic field emission structures, where each movement path function defines the location and orientation over time of at least one of the one or more objects and thus the corresponding location and orientation over time of the one or more magnetic field emission structures associated with the one or more objects. Furthermore, the spatial force functions of the magnetic field emission structures can be controlled over time in accordance with such movement path functions as part of a process which may be controlled in an open-loop or closed-loop manner. For example, the location of a magnetic field emission structure produced using an electromagnetic array may be moved, the coding of such a magnetic field emission structure can be changed, the strengths of magnetic sources can be varied, etc. As such, the present invention enables the spatial forces between objects to be precisely controlled in accordance with their movement and also enables movement of objects to be precisely controlled in accordance with such spatial forces.

FIG. 34 depicts a valve mechanism 3400 based upon the sphere of FIG. 24 where a magnetic field emission structure 2414 is varied to move the sphere 2402 upward or downward in a cylinder having a first opening 3404 having a circumference less than or equal to that of a sphere 2402 and a second opening 3406 having a circumference greater than the sphere 2402. As such, a magnetic field emission structure 2414 can be varied such as described in relation to FIG. 24 to control the movement of the sphere 2402 so as to control the flow rate of a gas or liquid through the valve 3402. Similarly, a valve mechanism 3400 can be used as a pressure control valve. Furthermore, the ability to move an object within another object having a decreasing size enables various types of sealing mechanisms that can be used for the sealing of windows, refrigerators, freezers, food storage containers, boat hatches, submarine hatches, etc., where the amount of sealing force can be precisely controlled. One skilled in the art will recognized that many different types of seal mechanisms to include gaskets, o-rings, and the like can be employed with the present invention.

FIG. 35 depicts a cylinder apparatus 3500 where a movable object such as sphere 2042 or closed cylinder 3502 having a first magnetic field emission structure 2406 is moved in a first direction or in second opposite direction in a cylinder 2416 having second magnetic field emission structure 2414a (and optionally 2414b). By sizing the movable object (e.g., a sphere or a closed cylinder) such that an effective seal is maintained in cylinder 2416, the cylinder apparatus 3500 can be used as a hydraulic cylinder, pneumatic cylinder, or gas cylinder. In a similar arrangement cylinder apparatus 3500 can be used as a pumping device.

Figure 36C:
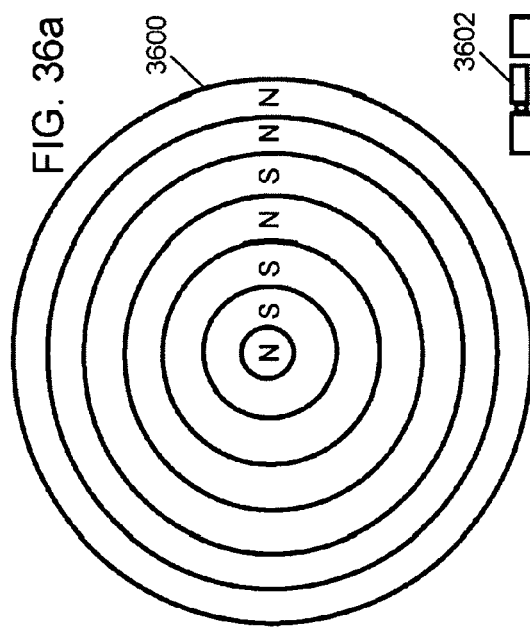
FIG. 36c depicts an exemplary magnetic field emission structure having sources resembling spokes of a wheel.
Figure 36A:
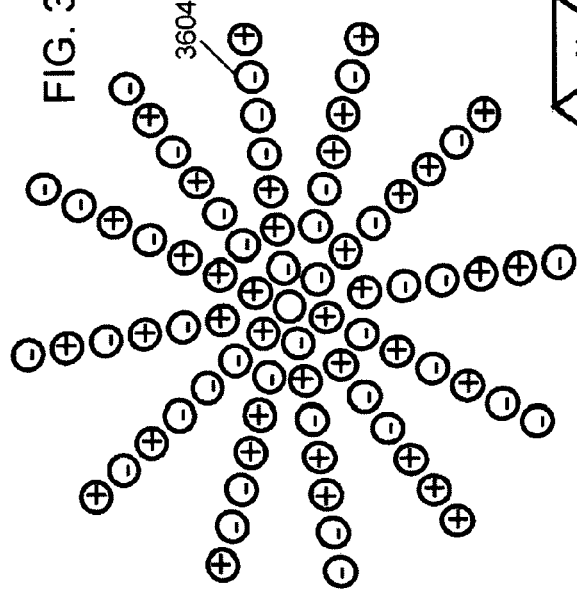
FIG. 36a depicts an exemplary magnetic field emission structure made up of rings about a circle.
Figure 36B:
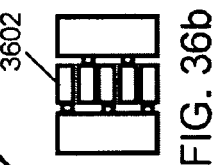
Figure 36F:
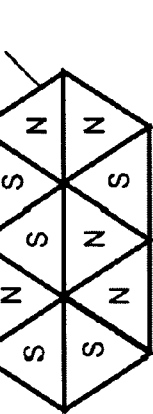
FIG. 36f depicts an exemplary magnetic field emission structure made up of hexagon-shaped sources.
Figure 36G:
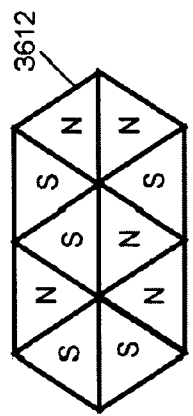
FIG. 36g depicts an exemplary magnetic field emission structure made up of triangular sources.
Figure 36H:
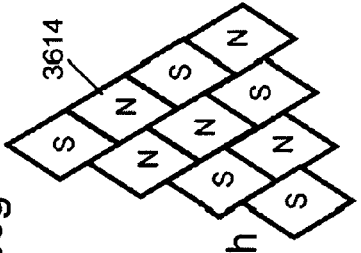
FIG. 36h depicts an exemplary magnetic field emission structure made up of partially overlapped diamond-shaped sources.

As described herein, magnetic field emission structures can be produced with any desired arrangement of magnetic (or electric) field sources. Such sources may be placed against each other, placed in a sparse array, placed on top of, below, or within surfaces that may be flat or curved. Such sources may be in multiple layers (or planes), may have desired directionality characteristics, and so on. Generally, by varying polarities, positions, and field strengths of individual field sources over time, one skilled in the art can use the present invention to achieve numerous desired attributes. Such attributes include, for example:

Precision alignment, position control, and movement control
Non-wearing attachment
Repeatable and consistent behavior
Frictionless holding force/traction
Ease/speed/accuracy of assembly/disassembly
Increased architectural strength
Reduced training requirements
Increased safety
Increased reliability
Ability to control the range of force
Quantifiable, sustainable spatial forces (e.g., holding force, sealing force, etc.)
Increased maintainability/lifetime
Efficiency FIGS. 36a through 36g provide a few more examples of how magnetic field sources can be arranged to achieve desirable spatial force function characteristics. FIG. 36a depicts an exemplary magnetic field emission structure 3600 made up of rings about a circle. As shown, each ring comprises one magnet having an identified polarity. Similar structures could be produced using multiple magnets in each ring, where each of the magnets in a given ring is the same polarity as the other magnets in the ring, or each ring could comprise correlated magnets. Generally, circular rings, whether single layer or multiple layer, and whether with or without spaces between the rings, can be used for electrical, fluid, and gas connectors, and other purposes where they could be configured to have a basic property such that the larger the ring, the harder it would be to twist the connector apart. As shown in FIG. 36b, one skilled in the art would recognize that a hinge 3602 could be constructed using alternating magnetic field emission structures attached two objects where the magnetic field emission structures would be interleaved so that they would align (i.e., effectively lock) but they would still pivot about an axes extending though their innermost circles. FIG. 36c depicts an exemplary magnetic field emission structure 3604 having sources resembling spokes of a wheel. FIG. 36d depicts an exemplary magnetic field emission structure 3606 resembling a rotary encoder where instead of on and off encoding, the sources are encoded such that their polarities vary. The use of a magnetic field emission structure in accordance with the present invention instead of on and off encoding should eliminate alignment problems of conventional rotary encoders.

Figure 36E:
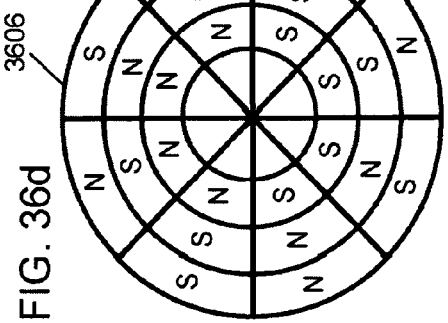
FIG. 36e depicts an exemplary magnetic field emission structure having sources arranged as curved spokes.
Figure 36D:
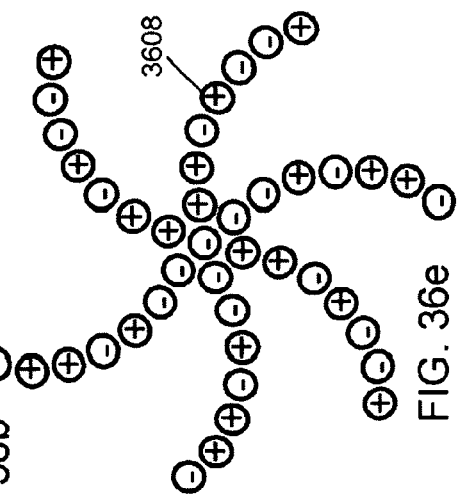
FIG. 36d depicts an exemplary magnetic field emission structure resembling a rotary encoder.

FIG. 36e depicts an exemplary magnetic field emission structure having sources arranged as curved spokes. FIG. 36f depicts an exemplary magnetic field emission structure made up of hexagon-shaped sources. FIG. 36g depicts an exemplary magnetic field emission structure made up of triangular sources. FIG. 36h depicts an exemplary magnetic field emission structure made up of partially overlapped diamond-shaped sources. Generally, the sources making up a magnetic field emission structure can have any shape and multiple shapes can be used within a given magnetic field emission structure. Under one arrangement, one or more magnetic field emission structures correspond to a Fractal code.

Exemplary applications of the invention:
Position based function control.
Gyroscope, Linear motor, Fan motor.
Precision measurement, precision timing.
Computer numerical control machines.
Linear actuators, linear stages, rotation stages, goniometers, mirror mounts.
Cylinders, turbines, engines (no heat allows lightweight materials).
Seals for food storage.
Scaffolding.
Structural beams, trusses, cross-bracing.
Bridge construction materials (trusses).
Wall structures (studs, panels, etc.), floors, ceilings, roofs.
Magnetic shingles for roofs.
Furniture (assembly and positioning).
Picture frames, picture hangers.
Child safety seats.
Seat belts, harnesses, trapping.
Wheelchairs, hospital beds.
Toys—self assembling toys, puzzles, construction sets (e.g., Legos, magnetic logs).
Hand tools—cutting, nail driving, drilling, sawing, etc.
Precision machine tools—drill press, lathes, mills, machine press.
Robotic movement control.
Assembly lines—object movement control, automated parts assembly.
Packaging machinery.
Wall hangers—for tools, brooms, ladders, etc.
Pressure control systems, Precision hydraulics.
Traction devices (e.g., window cleaner that climbs building).
Gas/Liquid flow rate control systems, ductwork, ventilation control systems.
Door/window seal, boat/ship/submarine/space craft hatch seal.
Hurricane/storm shutters, quick assembly home tornado shelters.
Gate Latch—outdoor gate (dog proof), Child safety gate latch (child proof).
Clothing buttons, Shoe/boot clasps.

Drawer/cabinet door fasteners.
Child safety devices—lock mechanisms for appliances, toilets, etc.
Safes, safe prescription drug storage.
Quick capture/release commercial fishing nets, crab cages.
Energy conversion—wind, falling water, wave movement.
Energy scavenging—from wheels, etc.
Microphone, speaker.
Applications in space (e.g., seals, gripping places for astronauts to hold/stand).
Analog-to-digital (and vice versa) conversion via magnetic field control.
Use of correlation codes to affect circuit characteristics in silicon chips.
Use of correlation codes to effect attributes of nanomachines (force, torque, rotation, and translations).
Ball joints for prosthetic knees, shoulders, hips, ankles, wrists, etc.
Ball joints for robotic arms.
Robots that move along correlated magnetic field tracks.
Correlated gloves, shoes.
Correlated robotic "hands" (all sorts of mechanisms used to move, place, lift, direct, etc. objects could use invention).
Communications/symbology.
Skis, skateboards.
Keys, locking mechanisms.
Cargo containers (how they are made and how they are moved).
Credit, debit, and ATM cards.
Magnetic data storage, floppy disks, hard drives, CDs, DVDs.
Scanners, printers, plotters.
Televisions and computer monitors.
Electric motors, generators, transformers.
Chucks, fastening devices, clamps.
Secure Identification Tags.
Door hinges.
Jewelry, watches.
Vehicle braking systems.
Maglev trains and other vehicles.
Magnetic Resonance Imaging and Nuclear Magnetic Resonance Spectroscopy.
Bearings (wheels), axles.
Particle accelerators.

While particular embodiments of the invention have been described, it will be understood, however, that the invention is not limited thereto, since modifications may be made by those skilled in the art, particularly in light of the foregoing teachings.

The invention claimed is:

1. A field emission system, comprising:
a first field emission structure; and
a second field emission structure, said first and second field emission structures each comprising an array of field emission sources each having positions and polarities relating to a spatial force function that corresponds to the relative alignment of the first and second field emission structures within a field domain, said spatial force function being in accordance with a code, said code corresponding to a code modulo of said first field emission structure and a code modulo of said second field emission structure, said code defining a peak spatial force corresponding to substantial alignment of said code modulo of said first field emission structure with said code modulo of said second field emission structure, said code also defining a plurality of off peak spatial forces corresponding to a plurality of different misalignments of said code modulo of said first field emission structure and said code modulo of said second field emission structure, said plurality of off peak spatial forces having a largest off peak spatial force, said largest off peak spatial force being less than half of said peak spatial force.

2. The field emission system of claim 1, wherein said positions and said polarities of each field emission source of each said array of field emission sources are determined in accordance with at least one correlation function.

3. The field emission system of claim 2, wherein said at least one correlation function is in accordance with said code.

4. The field emission system of claim 1, wherein said code is at least one of a pseudorandom code, a deterministic code, or a designed code.

5. The field emission system of claim a 1, wherein said code is one of a one dimensional code, a two dimensional code, a three dimensional code, or a four dimensional code.

6. The field emission system of claim 1, wherein each field emission source of each said array of field emission sources has a corresponding field emission amplitude and vector direction determined in accordance with the spatial force function, wherein a separation distance between the first and second field emission structures and the relative alignment of the first and second field emission structures creates a spatial force in accordance the spatial force function.

7. The field emission system of claim 6, wherein said spatial force comprises at least one of an attractive spatial force or a repellant spatial force.

8. The field emission system of claim 6, wherein said spatial force corresponds to a peak spatial force of said spatial force function when said first and second field emission structures are substantially aligned such that each field emission source of said first field emission structure substantially aligns with a corresponding field emission source of said second field emission structure.

9. The field emission system of claim 6, wherein said spatial force is at least one of used to produce energy, used to transfer energy, used to move an object, use to affix an object, used as part of an automation function, used to control a tool, used to make sound, used to heat an environment, used to cool an environment, used to affect pressure of an environment, used to control flow of a fluid, used to control flow of a gas, or used to control centrifugal forces.

10. The field emission system of claim 8, wherein the spatial force is at least an order of magnitude less than the peak spatial force when said first and second field emission structures are not substantially aligned such that field emission source of said first field emission structure substantially aligns with a corresponding field emission source of said second field emission structure.

11. The field emission system of claim 1, wherein said field domain corresponds to first field emissions from said array of first field emission sources of said first field emission structure interacting with second field emissions from said array of second field emission sources of said second field emission structure.

12. The field emission system of claim 1, wherein the relative alignment of the first and second field emission structures is resulted from a respective movement path function of at least one of the first and second field emission structures.

13. The field emission system of claim 12, wherein the respective movement path function is one of one-dimensional movement path function, a two-dimensional movement path function or a three-dimensional movement path function.

14. The field emission system of claim 12, wherein the respective movement path function comprises at least one of a linear movement path function, a non-linear movement path function, a rotational movement path function, a cylindrical movement path function, or a spherical movement path function.

15. The field emission system of claim 12, wherein the respective movement path function defines movement versus time for at least one of the first and second field emission structures, said movement comprising at least one of forward movement, backward movement, upward movement, downward movement, left movement, right movement, yaw, pitch, and or roll.

16. The field emission system of claim 1, wherein each said array of field emission sources comprises one of a one-dimensional array, a two-dimensional array, or a three-dimensional array.

17. The field emission system of claim 1, wherein said polarities of the field emission sources comprise at least one of North-South polarities or positive-negative polarities.

18. The field emission system of claim 1, wherein at least one of said field emission sources comprises a magnetic field emission source or an electric field emission source.

19. The field emission system of claim 1, wherein at least one of said field emission sources comprises a permanent magnet, an electromagnet, an electret, a magnetized ferromagnetic material, a portion of a magnetized ferromagnetic material, a soft magnetic material, or a superconductive magnetic material.

20. The field emission system of claim 1, wherein at least one said first and second field emission structures comprises at least one of a back keeper layer, a front saturable layer, an active intermediate element, a passive intermediate element, a lever, a latch, a swivel, a heat source, a heat sink, an inductive loop, a plating nichrome wire, an embedded wire, or a kill mechanism.

21. The field emission system of claim 1, wherein at least one of said first and second field emission structures comprises a planer structure, a conical structure, a cylindrical structure, a curve surface, a stepped surface.

22. A method of controlling field emissions, comprising:
defining a spatial force function corresponding to the relative alignment of a first field emission structure and a second field emission structure within a field domain; and
establishing, in accordance with said spatial force function, a position and polarity of each field emission source of a first array of field emission sources corresponding to the first field emission structure and of each field emission source of a second array of field emission sources corresponding to the second field emission structure, said spatial force function being in accordance with a code, said code corresponding to a code modulo of said first field emission structure and a code modulo of said second field emission structure, said code defining a peak spatial force corresponding to substantial alignment of said code modulo of said first field emission structure with said code modulo of said second field emission structure, said code also defining a plurality of off peak spatial forces corresponding to a plurality of different misalignments of said code modulo of said first field emission structure and said code modulo of said second field emission structure, said plurality of off peak spatial forces having a largest off peak spatial force, said largest off peak spatial force being less than half of said peak spatial force.

23. A field emission system, comprising:
a first field emission structure comprising a plurality of first field emission sources having positions and polarities in accordance with a first correlation function;
a second field emission structure comprising a plurality of second field emission source having positions and polarities in accordance with a second correlation function, said first and second correlation functions corresponding to a spatial force function, said first correlation function complementing said second correlation function such that each field emission source of said plurality of first field emission sources has a corresponding counterpart field emission source of said plurality of second field emission sources and said first and second field emission structures will substantially correlate when each of said field emission source counterparts are substantially aligned, said spatial force function being in accordance with a code, said code corresponding to a code modulo of said first field emission structure and a code modulo of said second field emission structure, said code defining a peak spatial force corresponding to substantial alignment of said code modulo of said first field emission structure with said code modulo of said second field emission structure, said code also defining a plurality of off peak spatial forces corresponding to a plurality of different misalignments of said code modulo of said first field emission structure and said code modulo of said second field emission structure, said plurality of off peak spatial forces having a largest off peak spatial force, said largest off peak spatial force being less than half of said peak spatial force.

* * * * *